(12) United States Patent
Fuji et al.

(10) Patent No.: US 7,572,570 B2
(45) Date of Patent: Aug. 11, 2009

(54) CHEMICALLY AMPLIFIED RESIST COMPOSITION

(75) Inventors: Yusuke Fuji, Ibaraki (JP); Yoshiyuki Takata, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/052,189

(22) Filed: Mar. 20, 2008

(65) Prior Publication Data

US 2008/0274426 A1    Nov. 6, 2008

(30) Foreign Application Priority Data

Mar. 23, 2007    (JP)    ............... 2007-076423

(51) Int. Cl.
*G03F 7/004*    (2006.01)
(52) U.S. Cl. ............... 430/270.1; 430/910; 430/921; 430/922
(58) Field of Classification Search ............... 430/270.1, 430/910, 921, 922
See application file for complete search history.

(56) References Cited

U.S. PATENT DOCUMENTS

| | | | | |
|---|---|---|---|---|
| 6,824,957 | B2 * | 11/2004 | Okino et al. ............... | 430/270.1 |
| 7,029,823 | B2 * | 4/2006 | Okino et al. ............... | 430/270.1 |
| 7,423,102 | B2 * | 9/2008 | Lee et al. ............... | 526/200 |
| 2001/0016298 | A1 * | 8/2001 | Nakanishi et al. ......... | 430/270.1 |

FOREIGN PATENT DOCUMENTS

JP    2003-5374 A    1/2003

* cited by examiner

*Primary Examiner*—John S Chu
(74) *Attorney, Agent, or Firm*—Birch, Stewart, Kolasch & Birch, LLP

(57) ABSTRACT

The present invention provides a chemically amplified resist composition comprising:

(A) a resin which comprises (a) a structural unit having an acid-labile group, (b) a structural unit having at least one hydroxyl group, (c) a structural unit having at least one lactone structure, and (d) a structural unit represented by the formula (Ia) or (Ib):

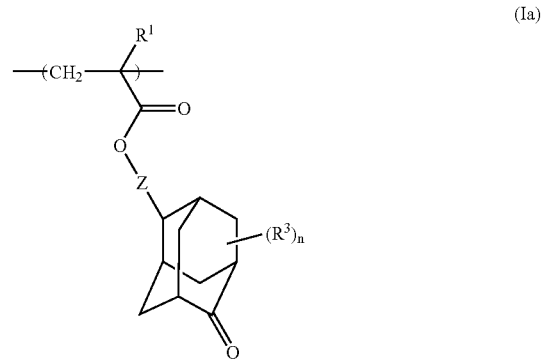

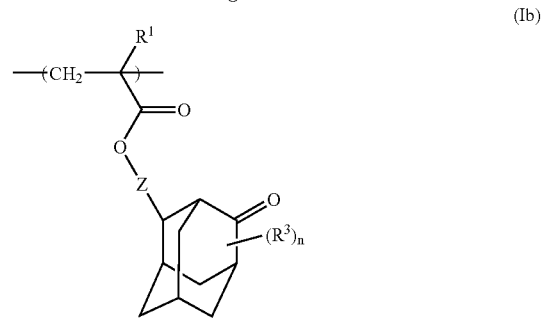

wherein $R^1$ represents a hydrogen atom or a methyl group, $R^3$ represents a methyl group, n represents an integer of 0 to 14, and Z represents a single bond or $-[CH_2]_k-COO-$, and (B) at least one acid generator.

13 Claims, No Drawings

CHEMICALLY AMPLIFIED RESIST COMPOSITION

This nonprovisional application claims priority under 35 U.S.C. § 119(a) on Patent Application No. 2007-076423 filed in JAPAN on Mar. 23, 2007, the entire contents of which are hereby incorporated by reference.

FIELD OF THE INVENTION

The present invention relates to a chemically amplified resist composition.

BACKGROUND OF THE INVENTION

A chemically amplified resist composition used for semiconductor microfabrication employing a lithography process contains an acid generator comprising a compound generating an acid by irradiation.

In semiconductor microfabrication, it is desirable to form patterns having high resolution and good pattern profile, and it is expected for a chemically amplified resist composition to give such patterns.

JP 2003-005374 A1 discloses a chemically amplified resist composition comprising a resin which comprises a structural unit having an acid-labile group and a structural unit having at least one lactone structure, and an acid generator, and as the resin, a resin comprising the following structural units:

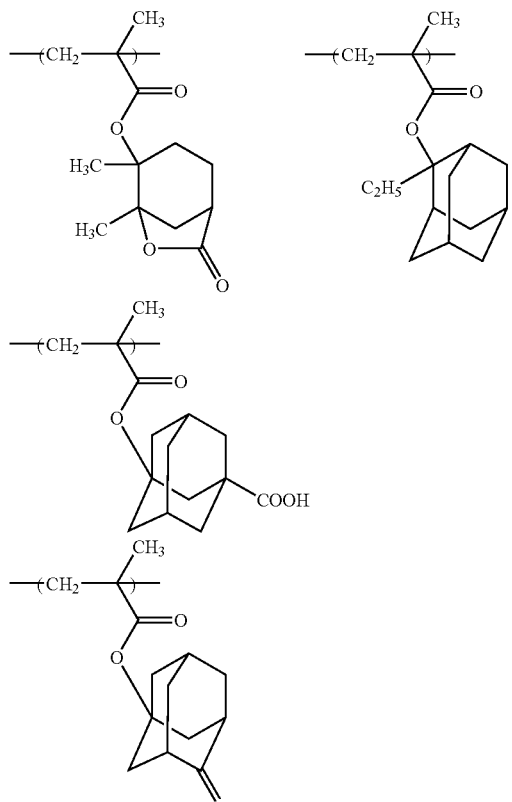

is disclosed.

SUMMARY OF THE INVENTION

The present invention is to provide a chemically amplified resist composition.

The present invention relates to the followings:

<1> A chemically amplified resist composition comprising:
(A) a resin which comprises (a) a structural unit having an acid-labile group, (b) a structural unit having at least one hydroxyl group, (c) a structural unit having at least one lactone structure, and (d) a structural unit represented by the formula (Ia) or (Ib):

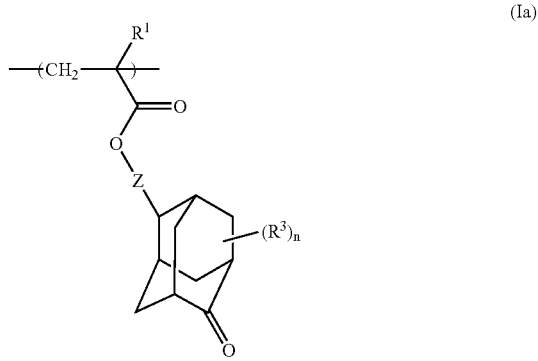

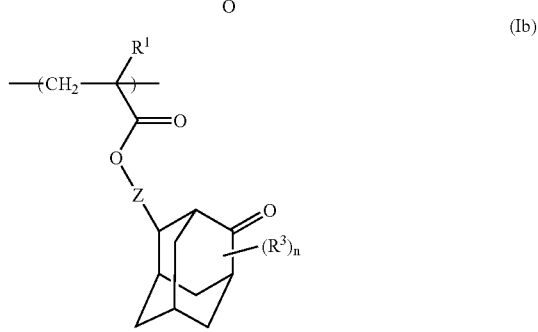

wherein $R^1$ represents a hydrogen atom or a methyl group, $R^3$ represents a methyl group, n represents an integer of 0 to 14, and Z represents a single bond or $-[CH_2]_k-COO-$, and
(B) at least one acid generator;

<2> The chemically amplified resist composition according to <1>, wherein (a) the structural unit having an acid-labile group is a structural unit represented by the formula (IIa) or (IIb):

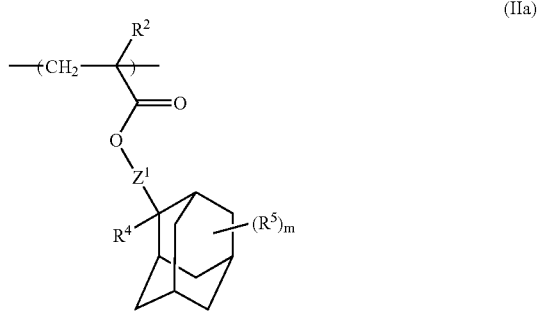

-continued

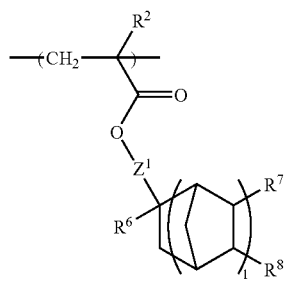
(IIb)

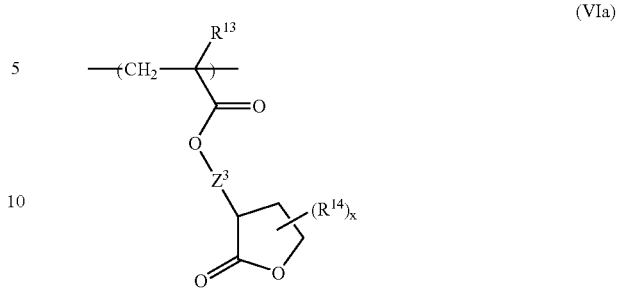
(VIa)
(VIb)
(VIc)

wherein $R^2$ represents a hydrogen atom or a methyl group, $Z^1$ represents a single bond or —$(CH_2)_r$—COO—, r represents an integer of 1 to 4, $R^4$ represents a C1-C8 linear or branched chain alkyl group or a C3-C10 cyclic alkyl group, $R^5$ represents a methyl group, m represents an integer of 0 to 14, $R^6$ represents a C1-C8 linear or branched chain alkyl group or a C3-C10 cyclic alkyl group, $R^7$ and $R^8$ each independently represent a hydrogen atom or a C1-C8 monovalent hydrocarbon group which may have at least one heteroatom, or $R^7$ and $R^8$ may be bonded to form a C1-C8 divalent hydrocarbon group which may have at least one heteroatom which forms a ring together with the adjacent carbon atoms to which $R^7$ and $R^8$ are bonded, or $R^7$ and $R^8$ may be bonded to form a carbon-carbon double bond between the carbon atom to which $R^7$ is bonded and the carbon atom to which $R^8$ is bonded, l represents an integer of 1 to 3;

<3> The chemically amplified resist composition according to <1> or <2>, wherein (b) the structural unit having at least one hydroxyl group is a structural unit represented by the formula (III):

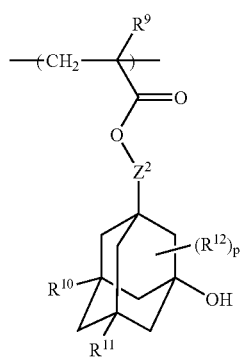
(III)

wherein $R^9$ represents a hydrogen atom or a methyl group, $R^{10}$ and $R^{11}$ each independently represent a hydrogen atom, a methyl group or a hydroxyl group, $R^{12}$ represents a methyl group, p represents an integer of 0 to 12, $Z^2$ represents a single bond or —$(CH_2)_s$—COO— and s represents an integer of 1 to 4;

<4> The chemically amplified resist composition according to <1>, <2> or <3>, wherein (c) the structural unit having at least one lactone structure is a structural unit represented by the formula (IVa), (IVb) or (IVc):

wherein $R^{13}$ represents a hydrogen atom or a methyl group, $R^{14}$ represents a methyl group, x represents an integer of 0 to 5, $R^{15}$ represents a C1-C4 hydrocarbon group, a carboxyl group or a cyano group, y represents an integer of 0 to 3, $R^{16}$ represents a C1-C4 hydrocarbon group, a carboxyl group or a cyano group, z represents an integer of 0 to 3, and when y is 2 or 3, $R^{15}$s may be the same or different, and when z is 2 or 3, $R^{16}$s may be the same or different;

<5> The chemically amplified resist composition according to any one of <1> to <4>, wherein the acid generator is an onium salt compound, an organo-halogen compound, a sulfone compound or a sulfonate compound;

<6> The chemically amplified resist composition according to any one of <1> to <4>, wherein the acid generator is an onium salt compound;

<7> The chemically amplified resist composition according to any one of <1> to <4>, wherein the acid generator is a salt selected from a salt represented by the formula (V):

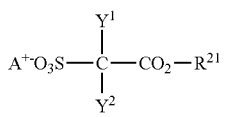

(V)

wherein Y¹ and Y² each independently represent a fluorine atom or a C1-C6 perfluoroalkyl group, R²¹ represents a C1-C6 linear or branched chain hydrocarbon group or a C3-C30 monocyclic or polycyclic hydrocarbon group which may be substituted with at least one selected from a C1-C6 alkyl group, a C1-C6 alkoxy group, a C1-C4 perfluoroalkyl group, a hydroxyl group and a cyano group, and at least one —CH$_2$— in the C3-C30 monocyclic or bicyclic hydrocarbon group may be substituted with —CO—, —O— or —CH(OH)—, and A⁺ represents an organic counter ion;

<8> The chemically amplified resist composition according to any one of <1> to <4>, wherein the acid generator is a salt represented by the formula (VI):

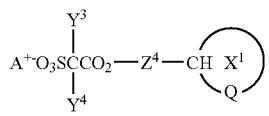

(VI)

wherein Y³ and Y⁴ each independently represent a fluorine atom or a C1-C6 perfluoroalkyl group, Z⁴ represents a single bond or a C1-C4 alkylene group, Q represents —CO— or —CH(OH)— and ring X¹ represents a C3-C30 monocyclic or polycyclic hydrocarbon group in which two hydrogen atoms are substituted with =O at Q position when Q is —CO— or in which a hydrogen atom is substituted with a hydroxyl group at Q position when Q is —CH(OH)—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group, and A⁺ represents an organic counter ion;

<9> The chemically amplified resist composition according to any one of <1> to <4>, wherein the acid generator is a salt represented by the formula (VIII):

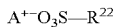

(VIII)

wherein R²² represents a C1-C8 linear or branched chain perfluoroalkyl group and A⁺ represents an organic counter ion;

<10> The chemically amplified resist composition according to <7>, <8> or <9>, wherein A⁺ represents at least one cation selected from the group consisting of the formula (IXa):

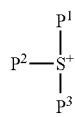

(IXa)

wherein P¹, P² and P³ each independently represent a C1-C30 linear or branched chain alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group, a cation represented by the formula (IXb):

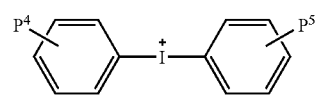

(IXb)

wherein P⁴ and P⁵ each independently represent a hydrogen atom, a hydroxyl group, a C1-C12 alkyl group or a C1-C12 alkoxy group, a cation represented by the formula (IXc):

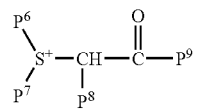

(IXc)

wherein P⁶ and P⁷ each independently represent a C1-C12 alkyl group or a C3-C12 cycloalkyl group, or P⁶ and P⁷ are bonded to form a C3-C12 divalent acyclic hydrocarbon group which forms a ring together with the adjacent S⁺, and at least one —CH$_2$— in the divalent acyclic hydrocarbon group may be substituted with —CO—, —O— or —S—, P⁸ represents a hydrogen atom, P⁹ represents a C1-C12 alkyl group, a C3-C12 cycloalkyl group or an aromatic group which may be substituted, or P⁸ and P⁹ are bonded to form a divalent acyclic hydrocarbon group which forms a 2-oxocycloalkyl group together with the adjacent —CHCO—, and at least one —CH$_2$— in the divalent acyclic hydrocarbon group may be replaced with —CO—, —O— or —S—; and a cation represented by the formula (IXd):

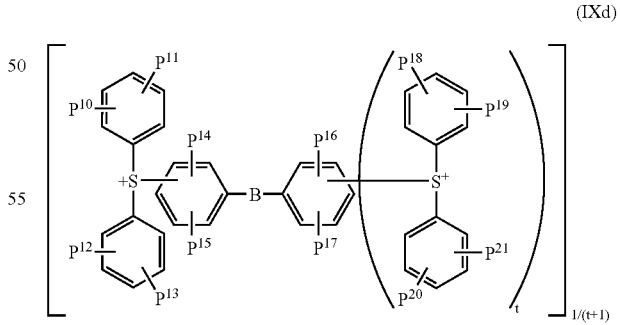

(IXd)

wherein P¹⁰, P¹¹, P¹², P¹³, P¹⁴, P¹⁵, P¹⁶, P¹⁷, P¹⁸, P¹⁹, P²⁰ and P²¹ each independently represent a hydrogen atom, a hydroxyl group, a C1-C12 alkyl group or a C1-C12 alkoxy group, B represents a sulfur or oxygen atom and t represents 0 or 1;

<11> The chemically amplified resist composition according to <7>, <8> or <9>, wherein A+ represents a cation represented by the formula (IXe):

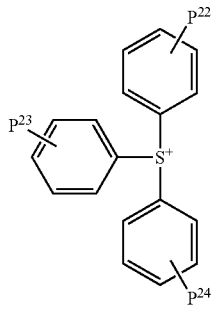

(IXe)

wherein $P^{22}$, $P^{23}$ and $P^{24}$ each independently represent a hydrogen atom or a C1-C4 alkyl group;

<12> The chemically amplified resist composition according to any one of <1> to <11>, wherein the chemically amplified resist composition includes 80 to 99.9% by weight of the resin component and 0.1 to 20% by weight of the acid generator;

<13> The chemically amplified resist composition according to any one of <1> to <12>, wherein the chemically amplified resist composition further comprises a basic compound.

DESCRIPTION OF PREFERRED EMBODIMENTS

The present chemically amplified resist composition comprises (A) a resin which comprises (a) a structural unit having an acid-labile group, (b) a structural unit having at least one hydroxyl group, (c) a structural unit having at least one lactone structure, and (d) a structural unit represented by the formula (Ia) or (Ib):

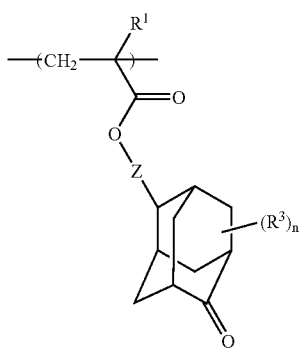

(Ia)

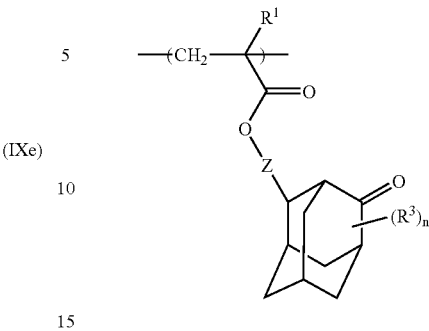

(Ib)

wherein $R^1$ represents a hydrogen atom or a methyl group, $R^3$ represents a methyl group, n represents an integer of 0 to 14, and Z represents a single bond or —$[CH_2]_k$—COO—, and (B) at least one acid generator.

First, (a) the structural unit having an acid-labile group (hereinafter, simply referred to as the structural unit (a)) will be illustrated.

In the present specification, "—COOR" may be described as "a structure having ester of carboxylic acid", and may also be abbreviated as "ester group". Specifically, "—COOC$(CH_3)_3$" may be described as "a structure having tert-butyl ester of carboxylic acid", or be abbreviated as "tert-butyl ester group".

In this specification, "an acid-labile group" means a group capable to eliminate by the action of an acid.

Examples of the acid-labile group include a structure having ester of carboxylic acid such as alkyl ester group in which a carbon atom adjacent to the oxygen atom is quaternary carbon atom, alicyclic ester group in which a carbon atom adjacent to the oxygen atom is quaternary carbon atom, and a lactone ester group in which a carbon atom adjacent to the oxygen atom is quaternary carbon atom. The "quaternary carbon atom" means a "carbon atom joined to four substituents other than hydrogen atom". As the acid-labile group, a group having a quaternary carbon atom joined to three carbon atoms and an —OR', wherein R' represents an alkyl group, is exemplified.

Examples of the acid-labile group include an alkyl ester group in which a carbon atom adjacent to the oxygen atom is quaternary carbon atom such as a tert-butyl ester group; an acetal type ester group such as a methoxymethyl ester, ethoxymethyl ester, 1-ethoxyethyl ester, 1-isobutoxyethylester, 1-isopropoxyethylester, 1-ethoxypropoxyester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; an alicyclic ester group in which a carbon atom adjacent to the oxygen atom is quaternary carbon atom, such as an isobornyl ester, 1-alkylcycloalkyl ester, 2-alkyl-2-adamantyl ester and 1-(1-adamantyl)-1-alkylalkyl ester group. At least one hydrogen atom in the adamantyl group may be substituted with a hydroxyl group.

Examples of the structural unit (a) include a structure unit derived from an ester of acrylic acid, a structural unit derived from an ester of methacrylic acid, a structural unit derived from an ester of norbornenecarboxylic acid, a structural unit derived from an ester of tricyclodecenecarboxylic acid and a structural unit derived from an ester of tetracyclodecenecarboxylic acid. The structure units derived from the ester of acrylic acid and from the ester of methacrylic acid are preferable.

As the structural unit (a), the structural unit represented by the formula (IIa) or (IIb):

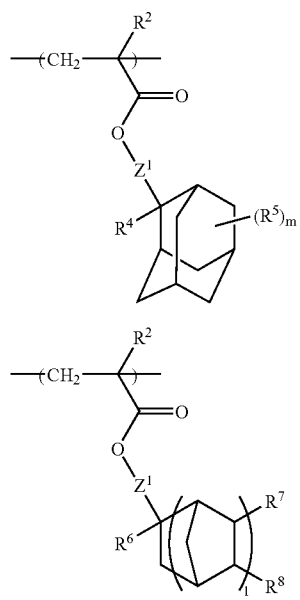

(IIa)

(IIb)

is preferable.

In the formulae (IIa) and (IIb), $R^2$ represents a hydrogen atom or a methyl group, $Z^1$ represents a single bond or —$(CH_2)_r$—COO— and r represents an integer of 1 to 4. $Z^1$ preferably represents the single bond or —$CH_2$—COO—, and more preferably represents the single bond.

In the formula (IIa), $R^4$ represents a C1-C8 linear or branched chain alkyl group or a C3-C10 cyclic alkyl group, and it is preferred that $R^4$ represents the C1-C8 linear or branched chain alkyl group.

Examples of the C1-C8 linear or branched chain alkyl group include a methyl, ethyl, n-propyl, isopropyl, n-butyl, isobutyl, sec-butyl, n-pentyl, n-hexyl, n-heptyl and n-octyl group, and a C1-C4 alkyl group such as a methyl, ethyl, n-propyl, isopropyl, n-butyl, isobutyl and sec-butyl group is preferable, and the methyl, ethyl, n-propyl and isopropyl group are more preferable.

Examples of the C3-C10 cyclic alkyl group include a cyclopentyl, cyclohexyl, cyclooctyl, 2-methylcyclopentyl, 3-methylcyclohexyl, 4-methylcyclohexyl, 2,3-dimethylcyclohexyl, 4,4-dimethylcyclohexyl, 2-norbornyl and 5-methyl-2-norbornyl group.

$R^5$ represents a methyl group and m represents an integer of 0 to 14. It is preferred that m represents 0 or 1.

In the formula (IIb), $R^6$ represents a C1-C8 linear or branched chain alkyl group or a C3-C10 cyclic alkyl group. Examples of the C1-C8 linear or branched chain alkyl group and the C3-C10 cyclic alkyl group include the same groups as mentioned above. It is preferred that $R^6$ represents the C1-C8 linear or branched chain alkyl group, and preferable examples thereof include a C1-C4 alkyl group such as a methyl, ethyl, n-propyl, isopropyl, n-butyl, isobutyl and sec-butyl group, and more preferable examples thereof include the methyl, ethyl, n-propyl and isopropyl group.

$R^7$ and $R^8$ each independently represent a hydrogen atom or a C1-C8 monovalent hydrocarbon group which may have at least one heteroatom.

Examples of the C1-C8 monovalent hydrocarbon group include a methyl, ethyl, n-propyl, isopropyl, n-butyl, isobutyl, sec-butyl, n-pentyl, n-hexyl, n-heptyl and n-octyl group.

$R^7$ and $R^8$ may be bonded to form a C1-C8 divalent hydrocarbon group which may have at least one heteroatom which forms a ring together with the adjacent carbon atoms to which $R^7$ and $R^8$ are bonded, and specific examples of the C1-C8 divalent hydrocarbon group include an ethylene and trimethylene group.

$R^7$ and $R^8$ may be also bonded to form a carbon-carbon double bond between the carbon atom to which $R^7$ is bonded and the carbon atom to which $R^8$ is bonded, and l represents an integer of 1 to 3.

The structural unit represented by the formula (IIa) is derived from the monomer represented by the formula (IIa-1):

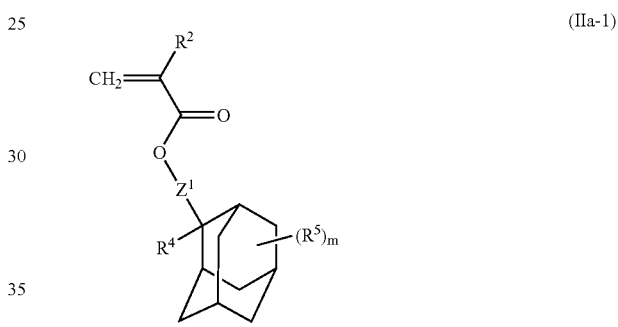

(IIa-1)

wherein $R^2$, $R^4$, $R^5$, $Z^1$ and m are the same as defined above.

Specific examples of the monomer represented by the formula (IIa-1) include the followings.

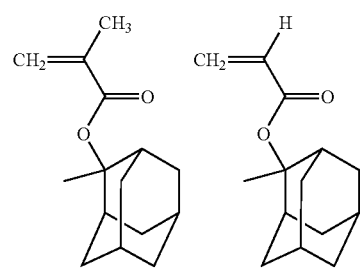

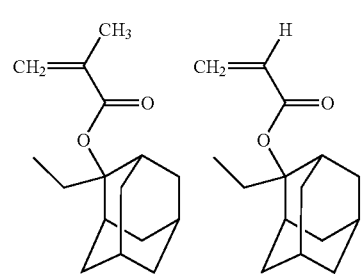

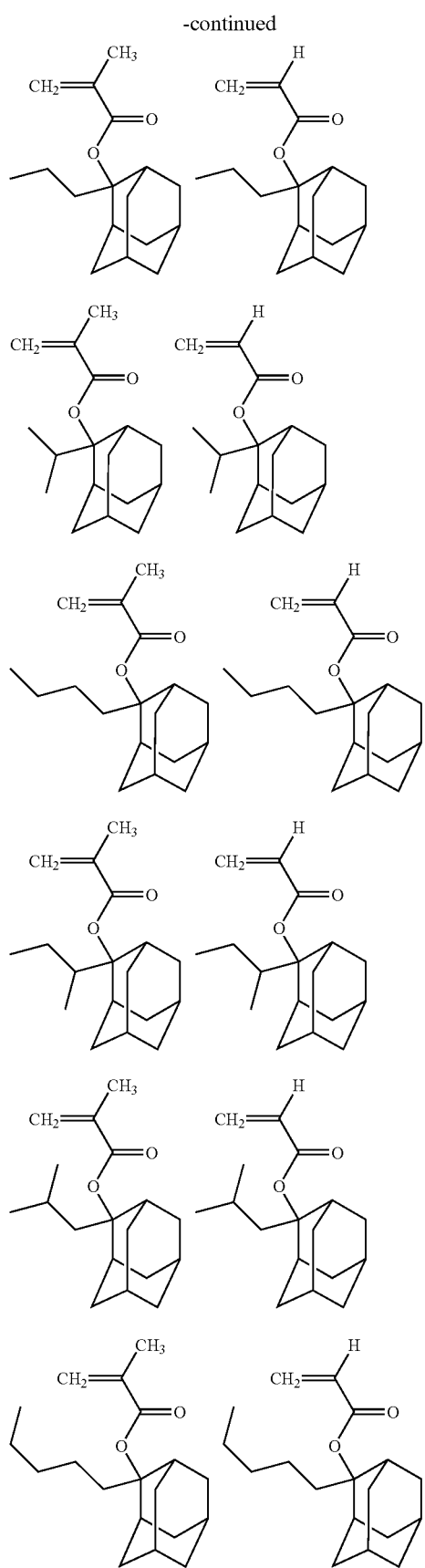
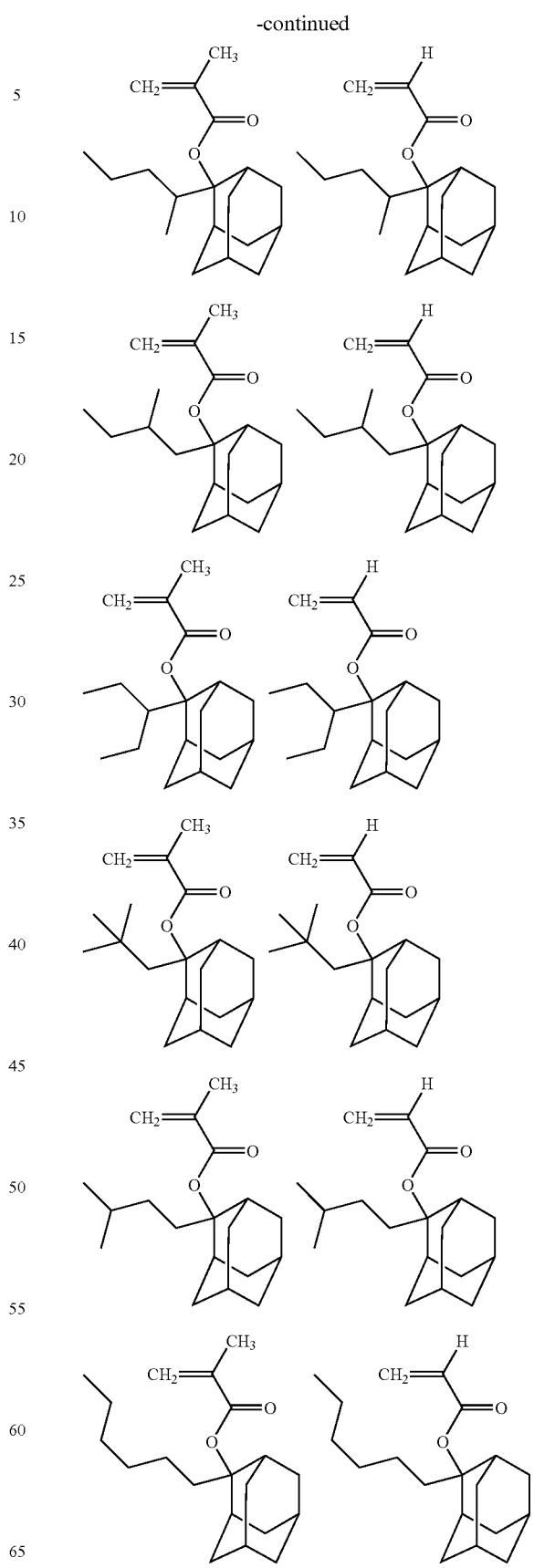

-continued
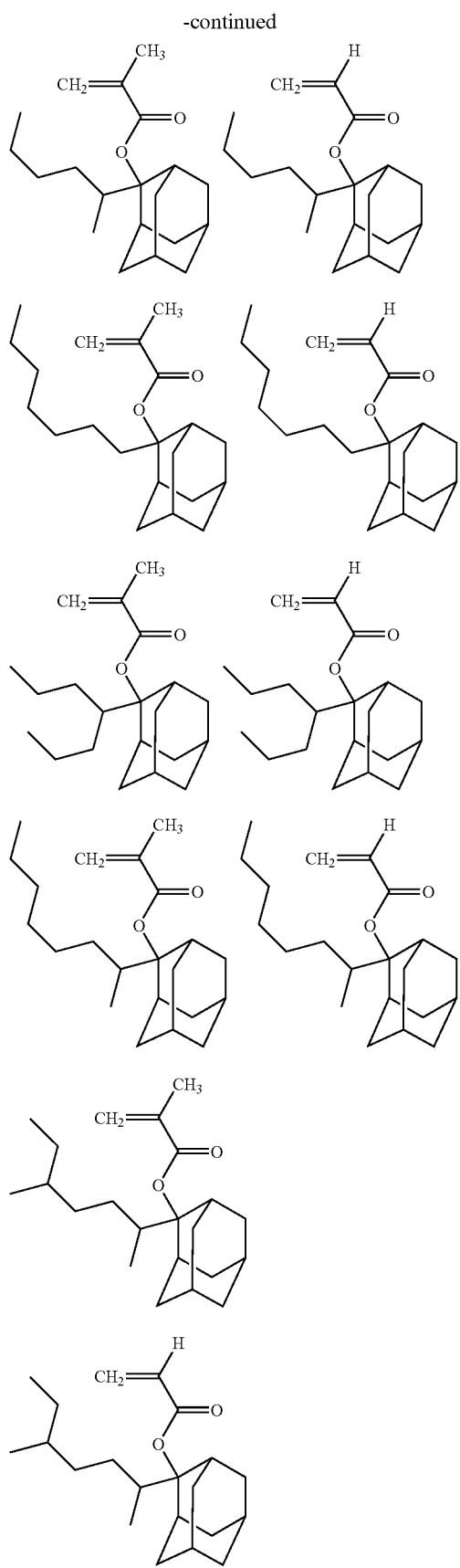
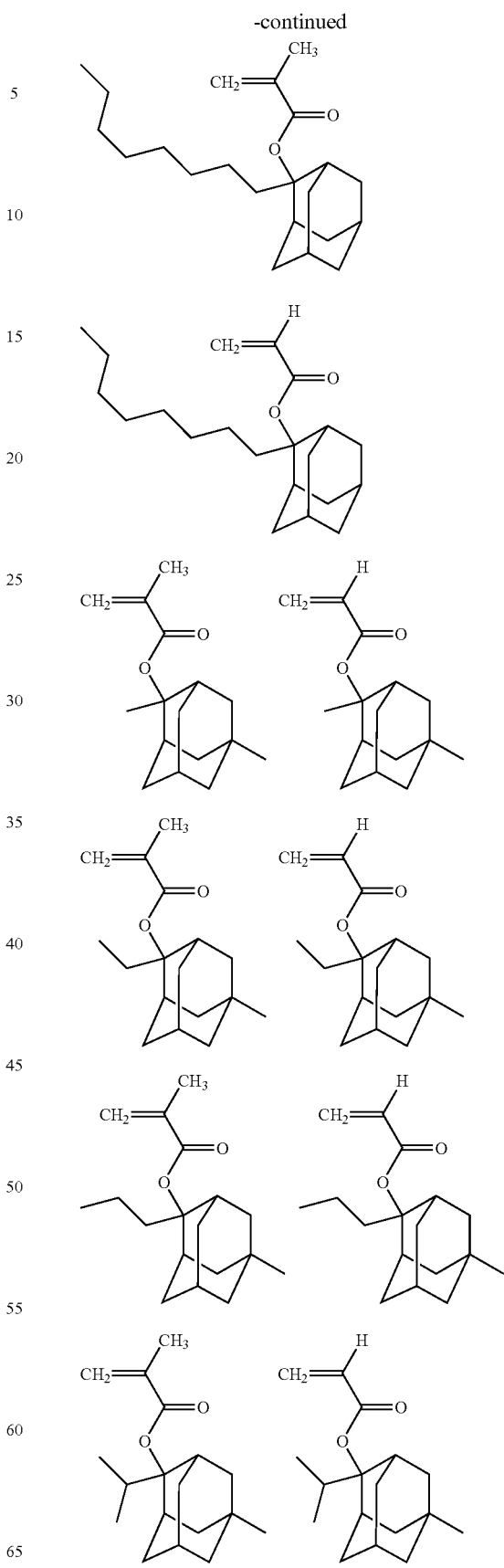

-continued
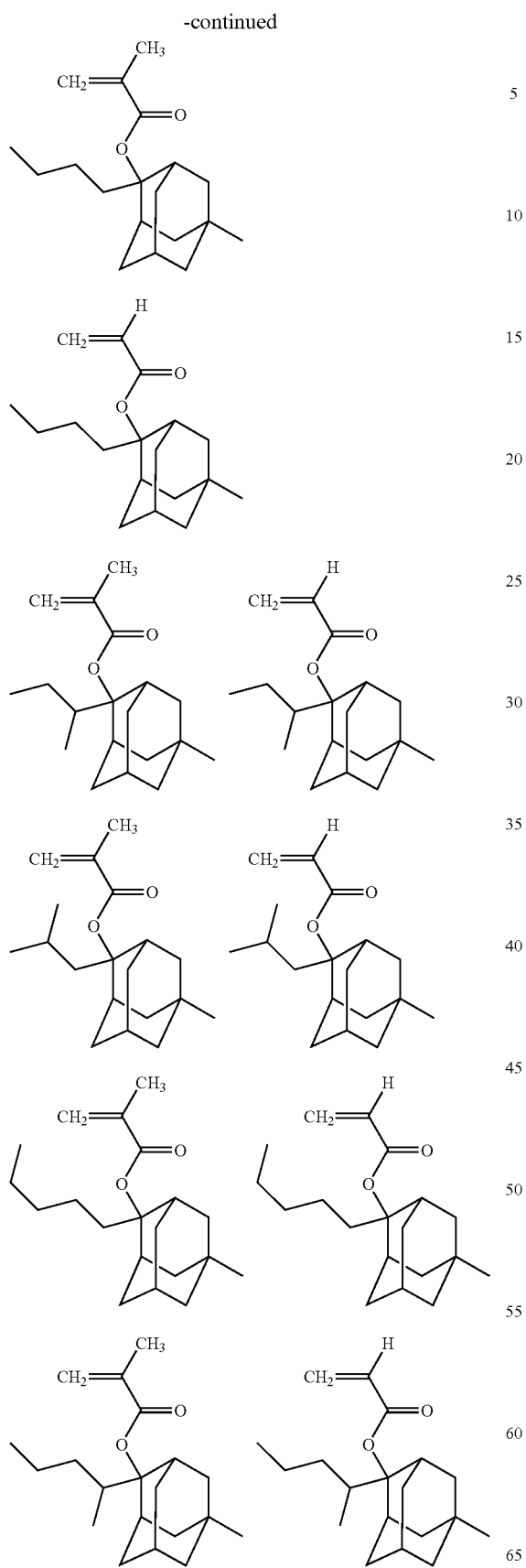
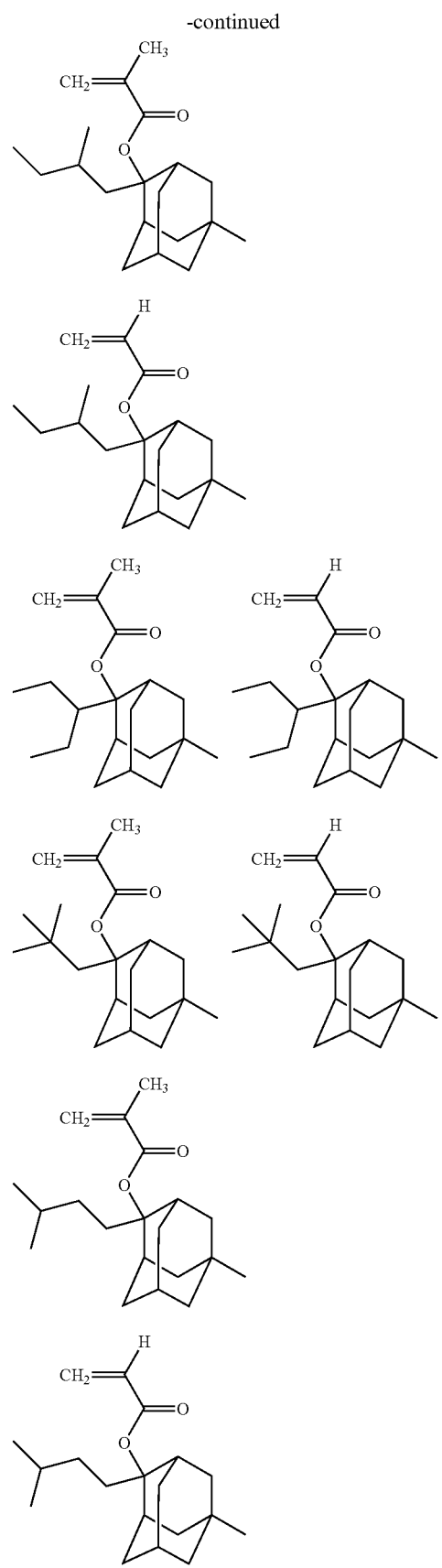

-continued
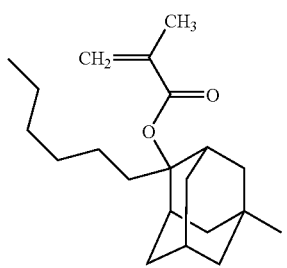
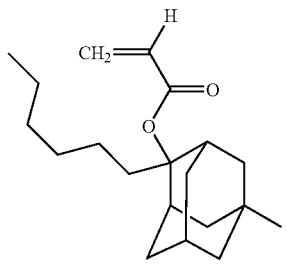
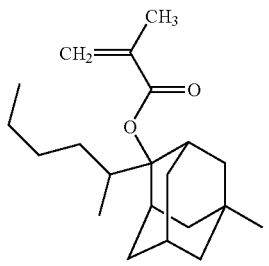
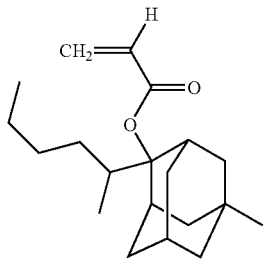
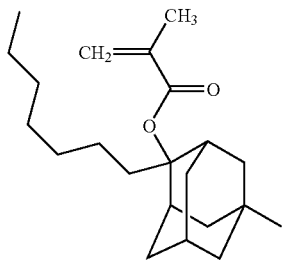
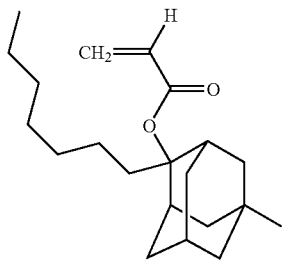
-continued
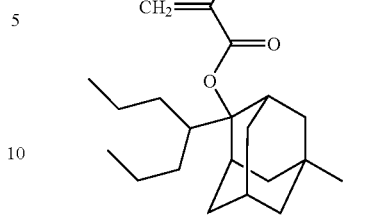
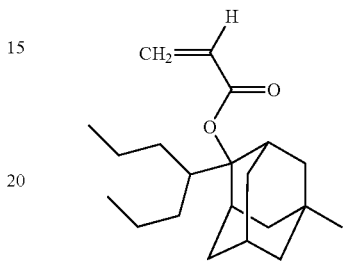
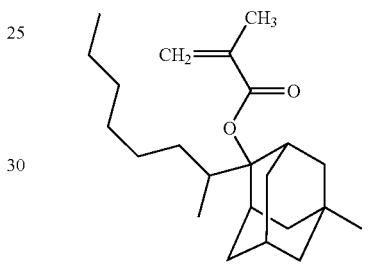
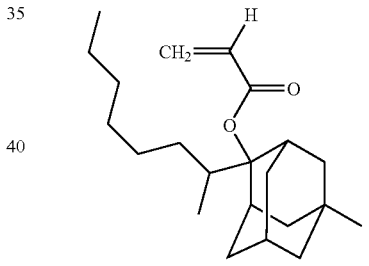
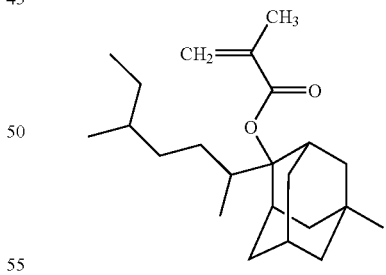
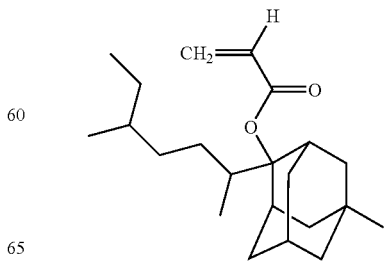

-continued
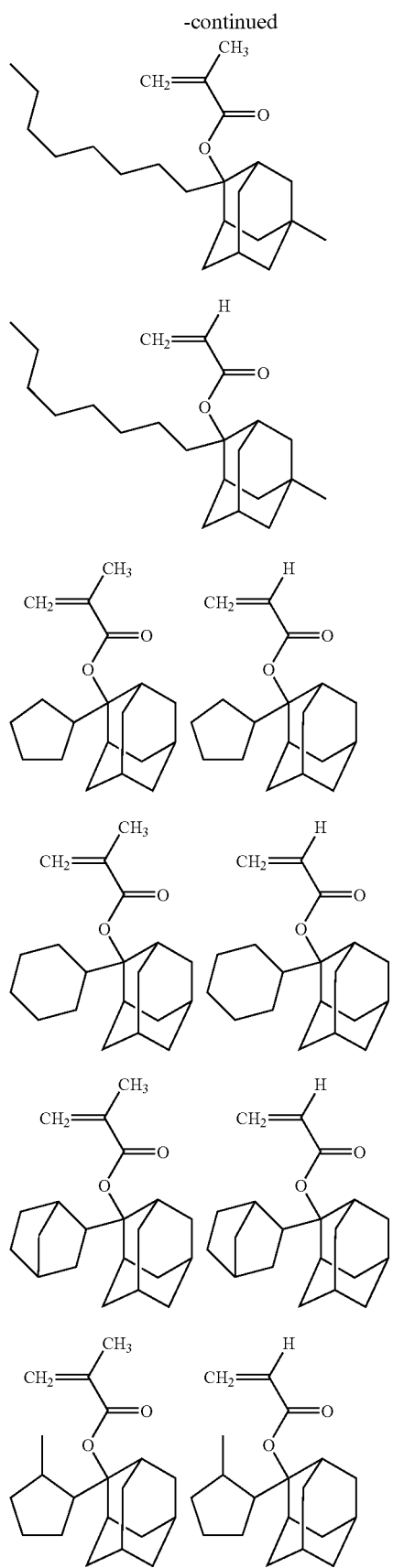
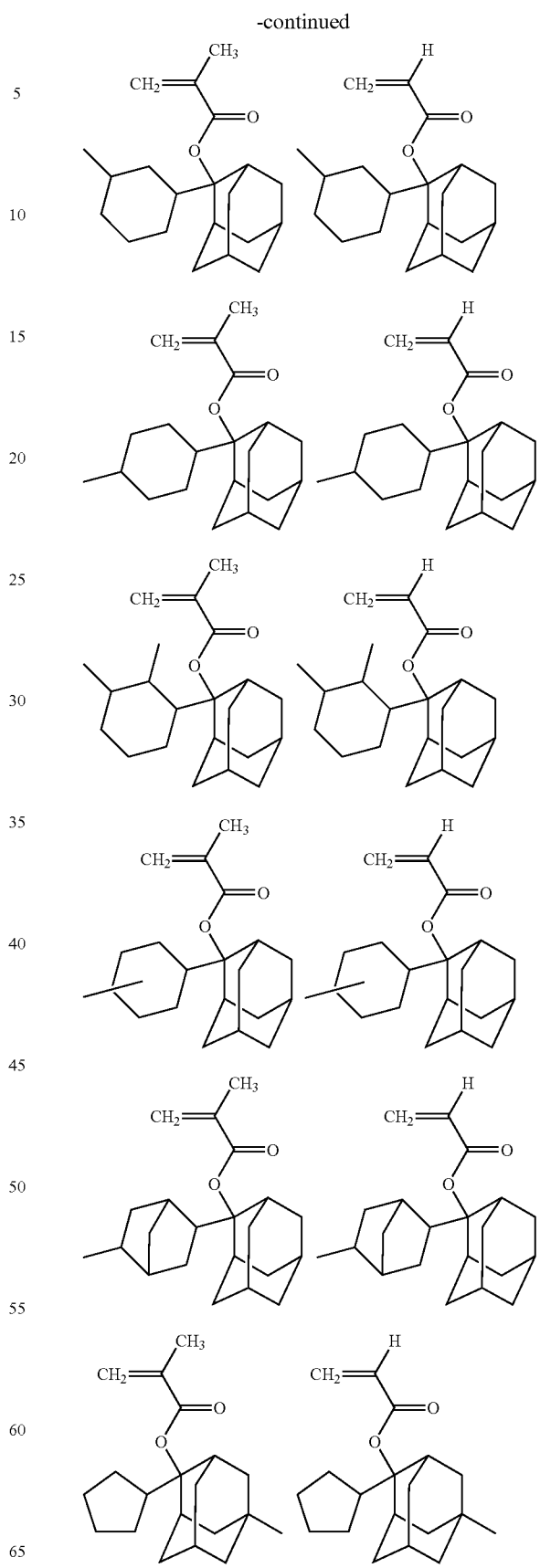

-continued
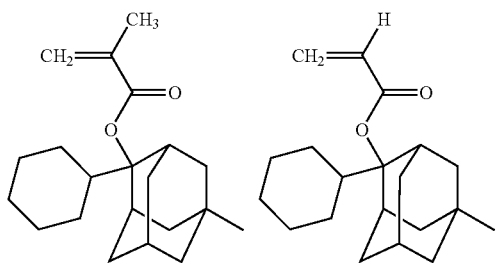
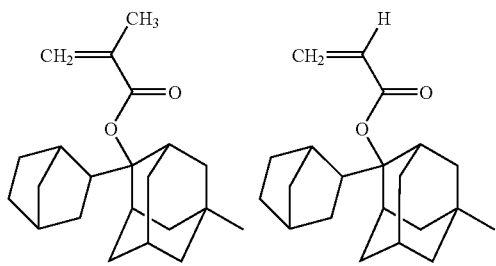
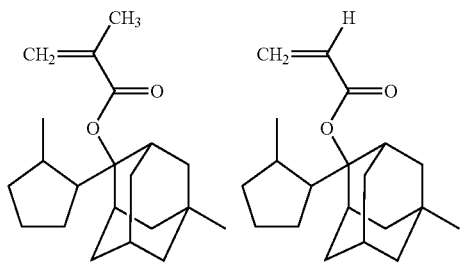
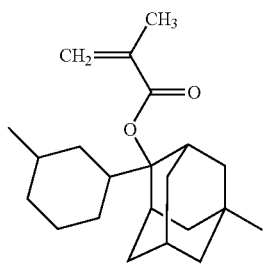
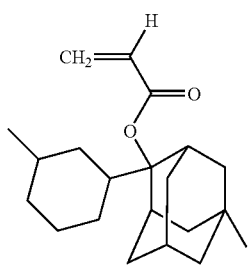
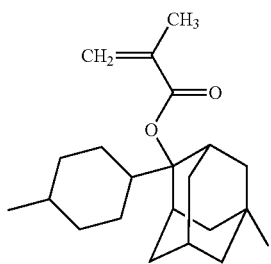
-continued
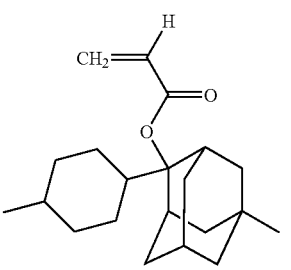
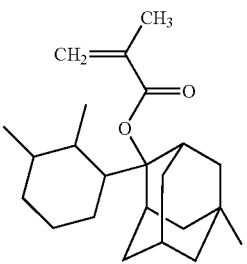
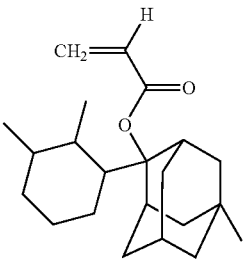
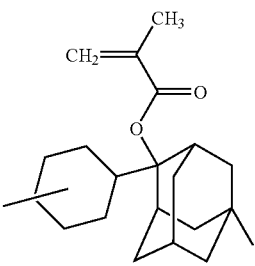
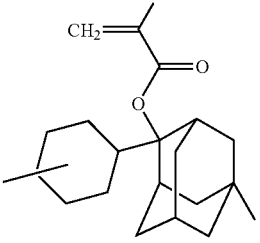
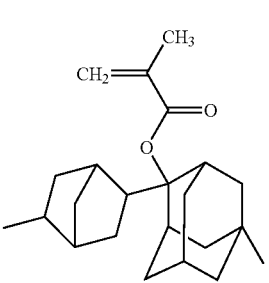

-continued
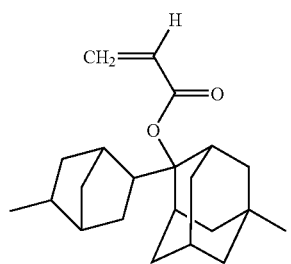
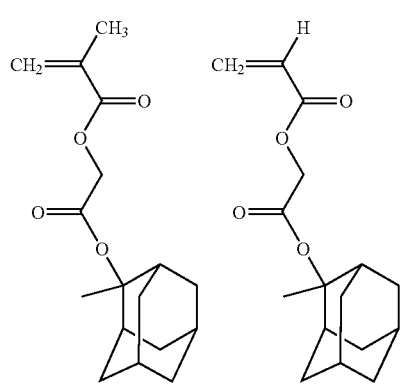
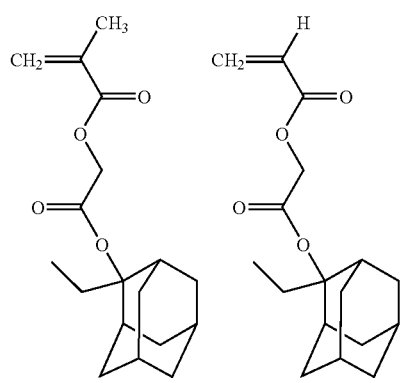
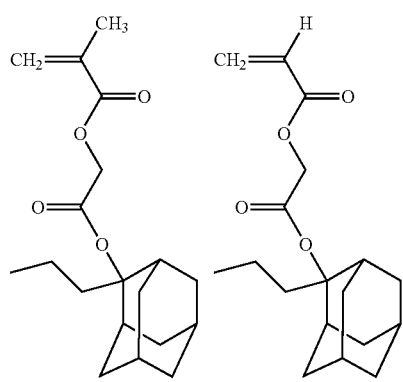
-continued
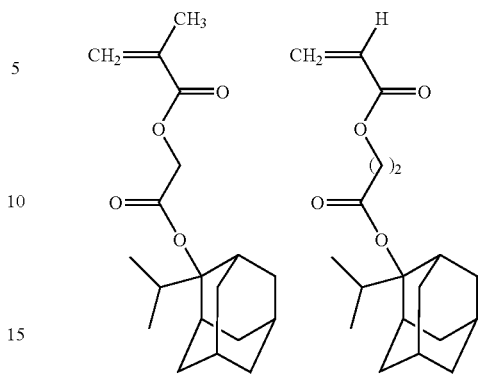
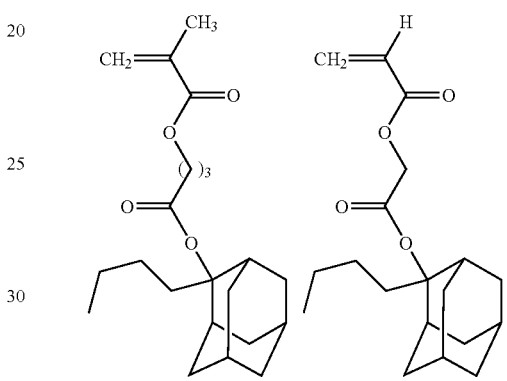
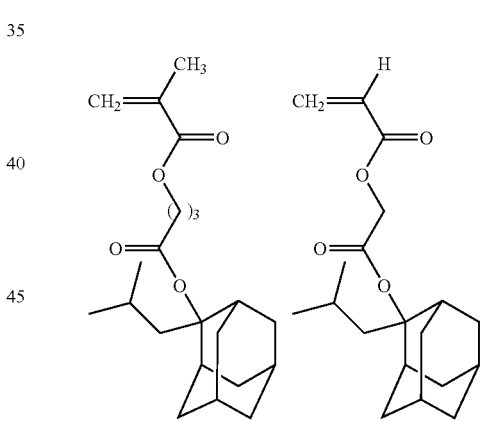
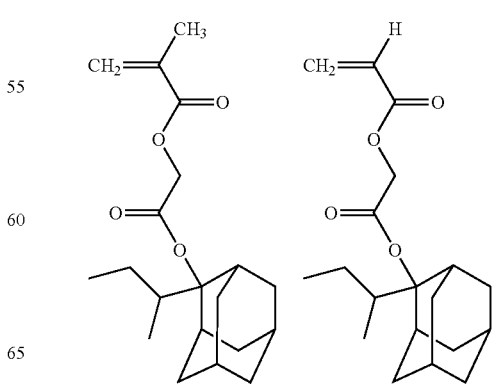

-continued
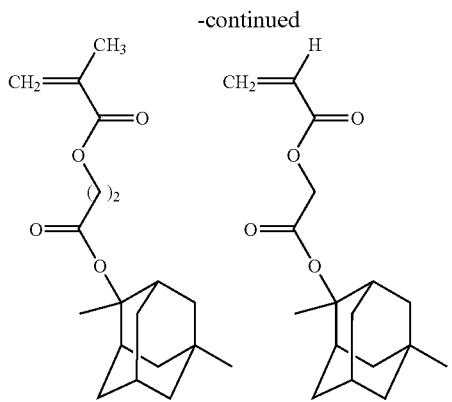
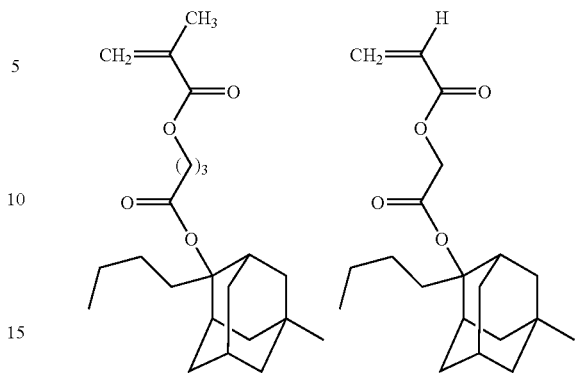
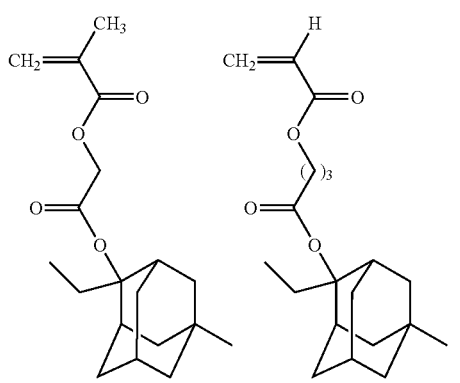
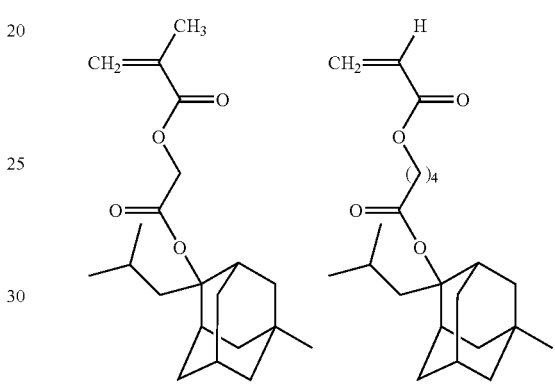
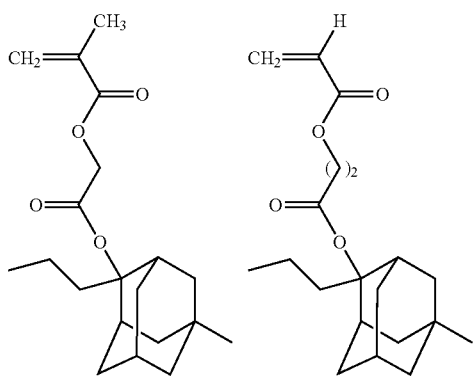
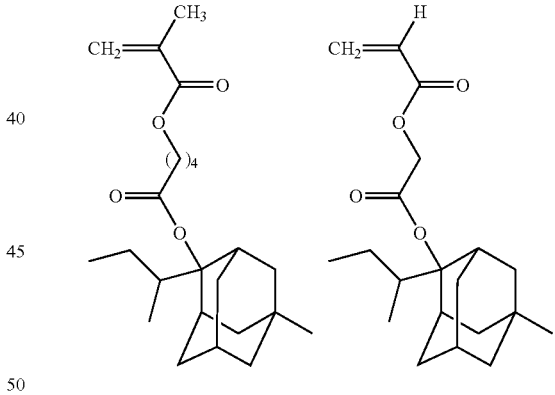
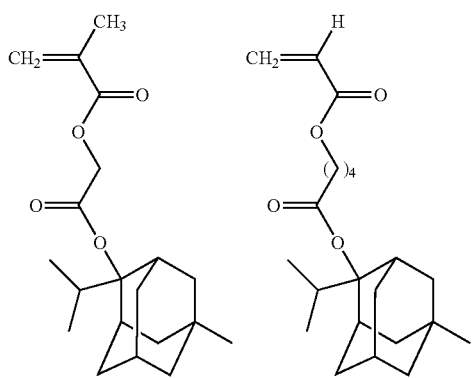
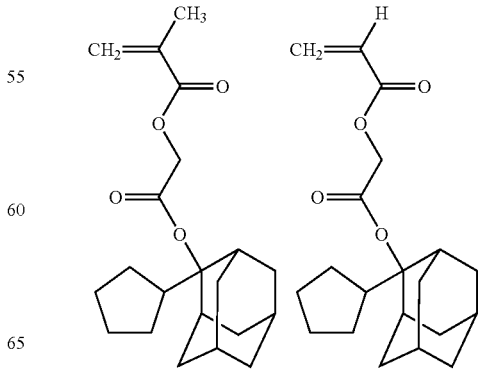

-continued
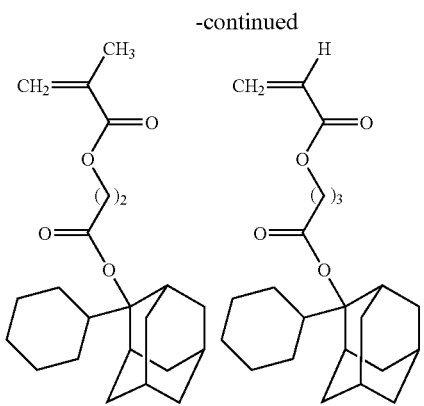
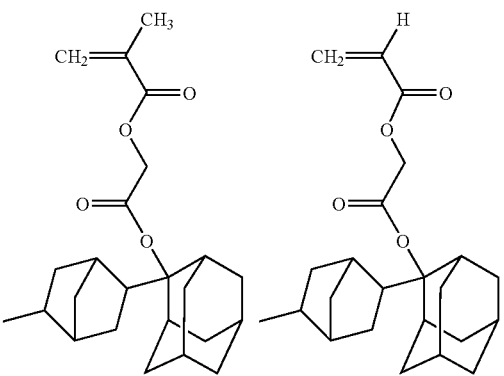
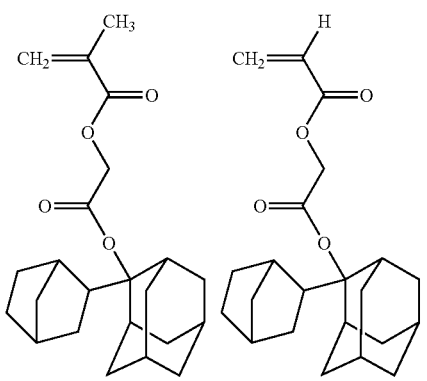
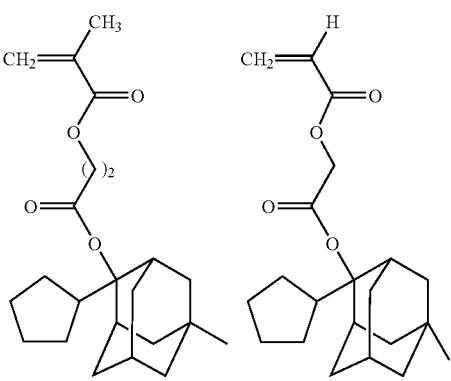
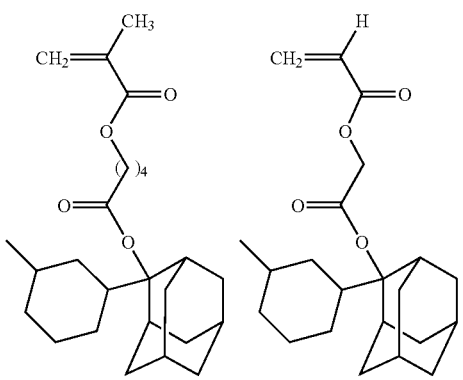
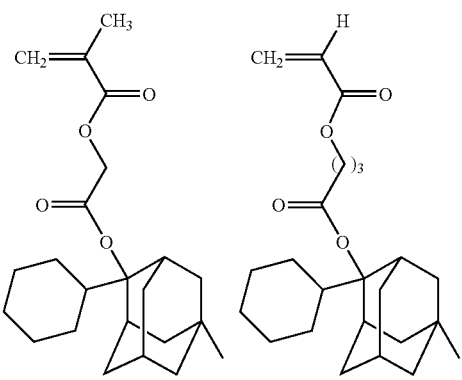
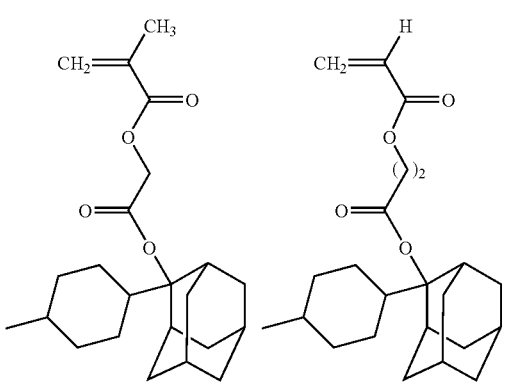

-continued
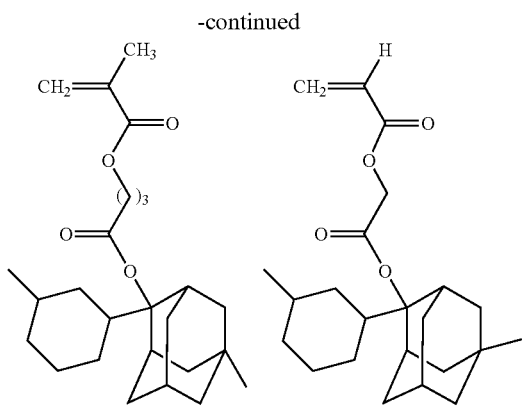
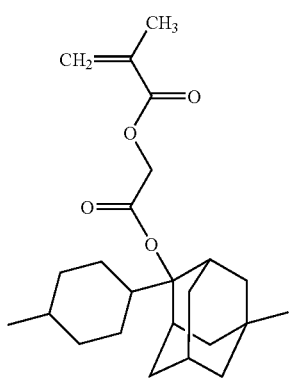
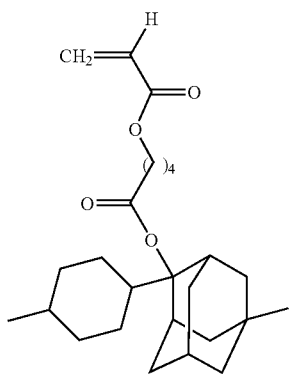
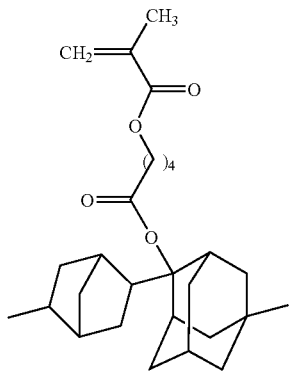
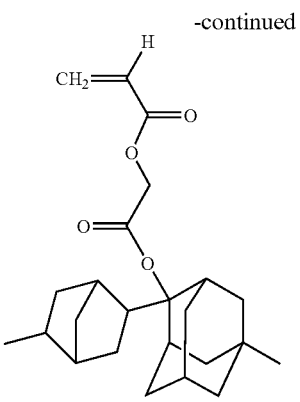
The structural unit represented by the formula (IIb) is derived from the monomer represented by the formula (IVb-1):
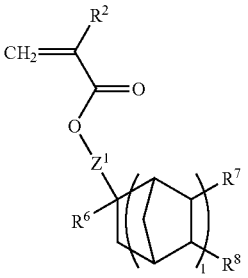
(IIb-1)
wherein $R^2$, $R^6$, $R^7$, $R^8$, $Z^1$ and l are the same as defined above.
Specific examples of the monomer represented by the formula (IIb-1) include the followings.
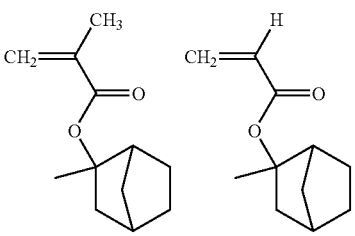
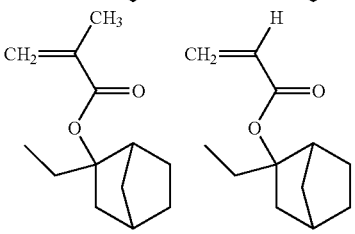
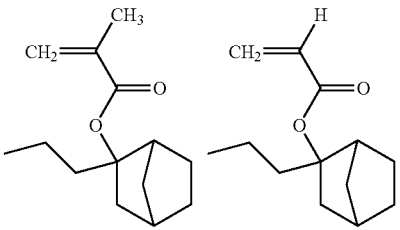

-continued
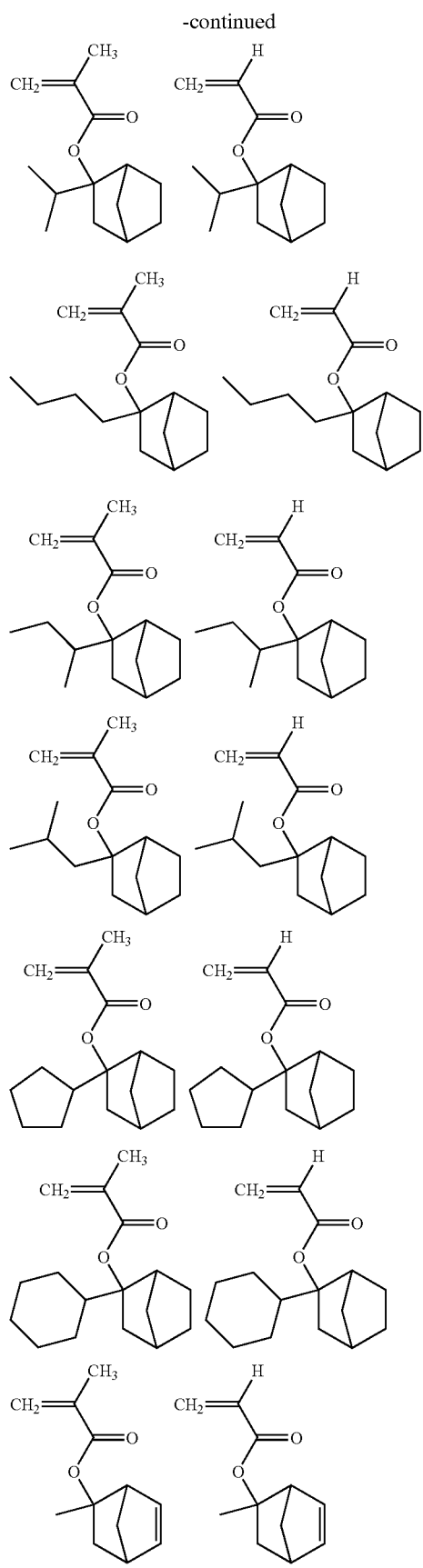
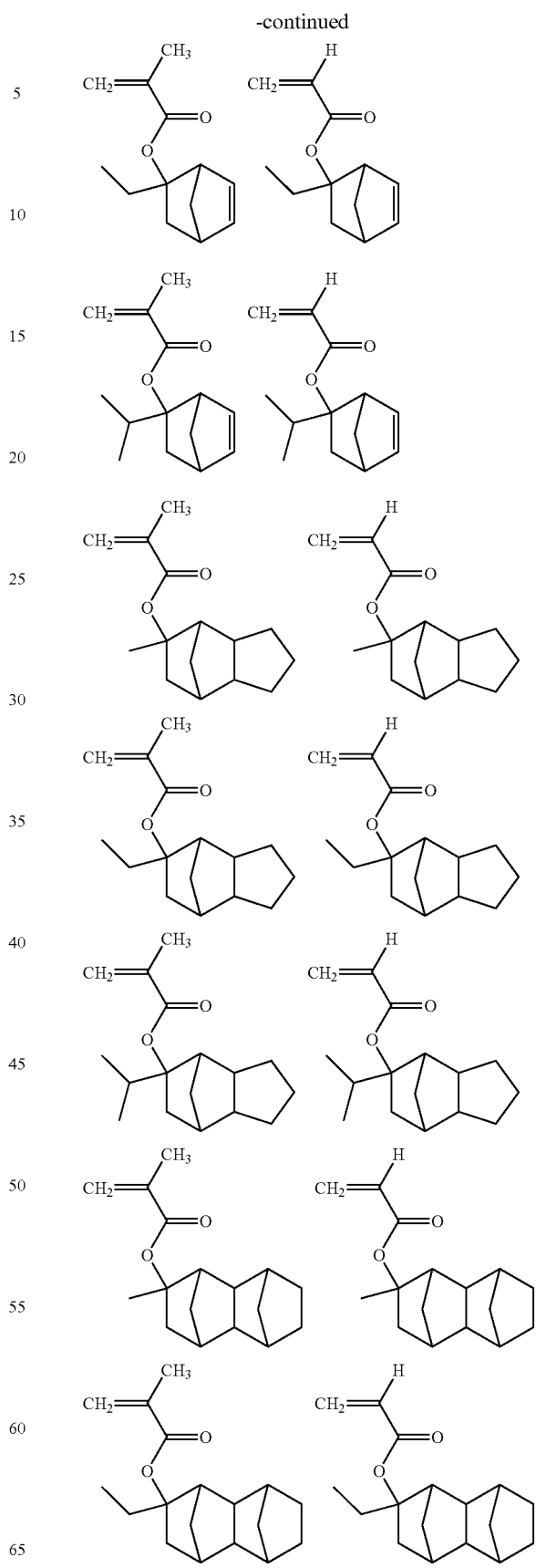

-continued
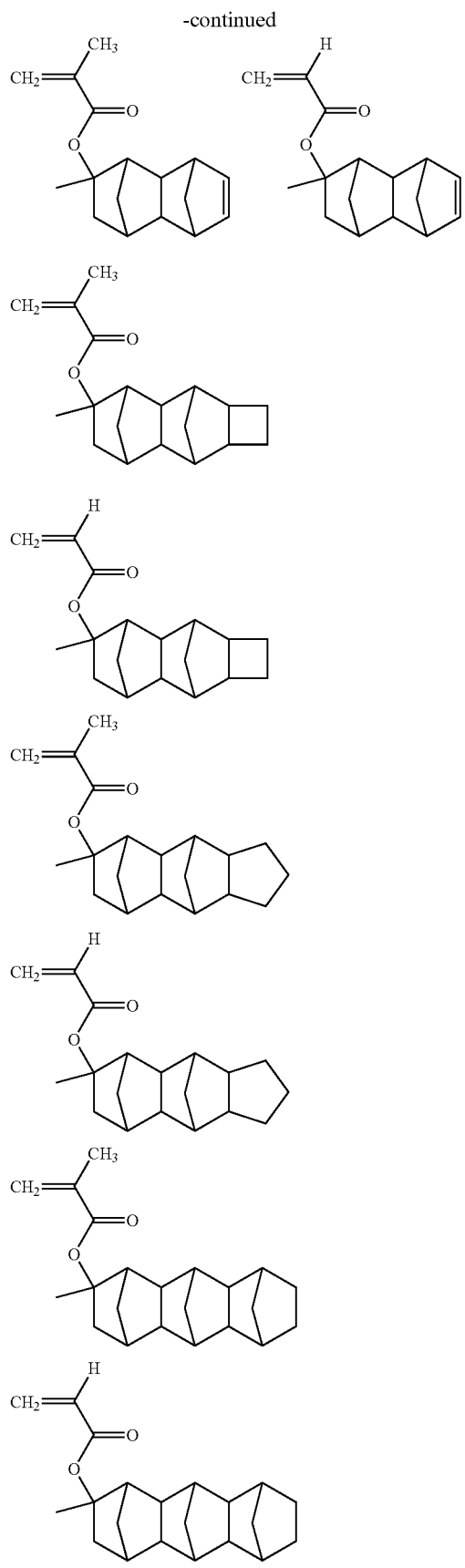
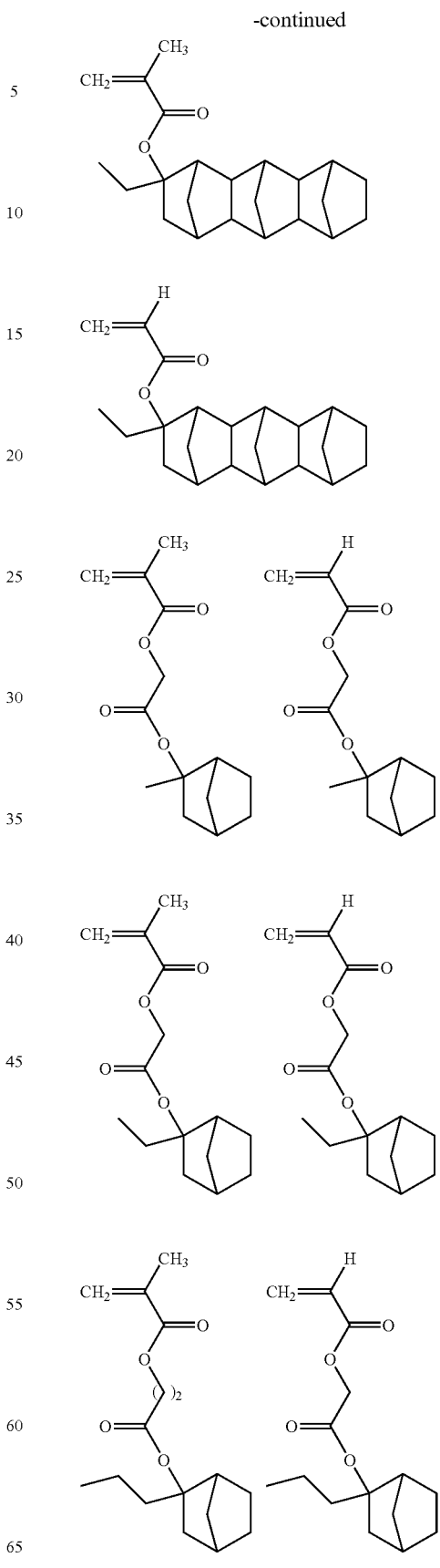

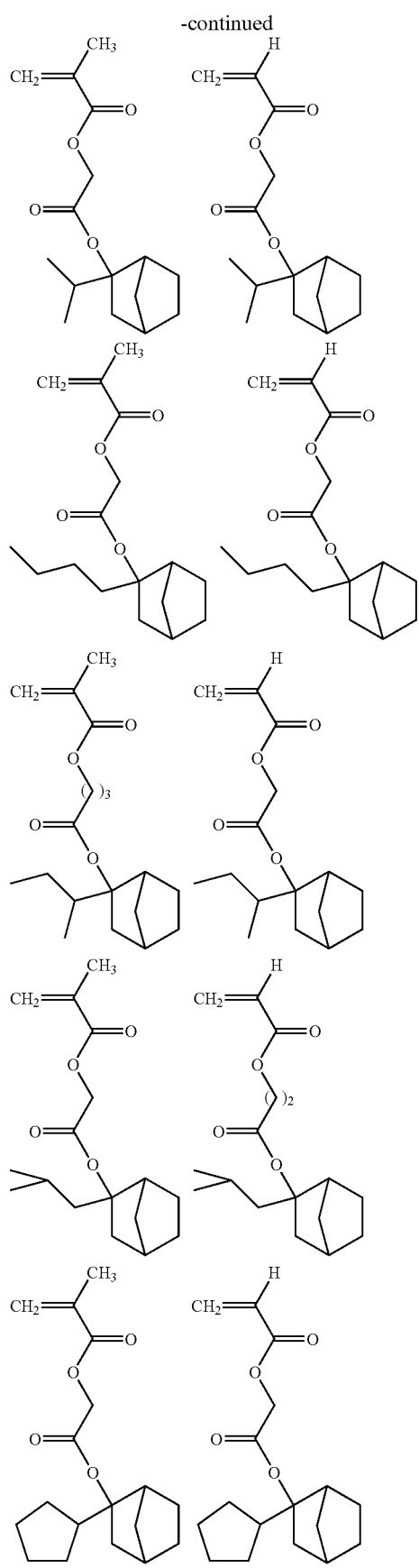
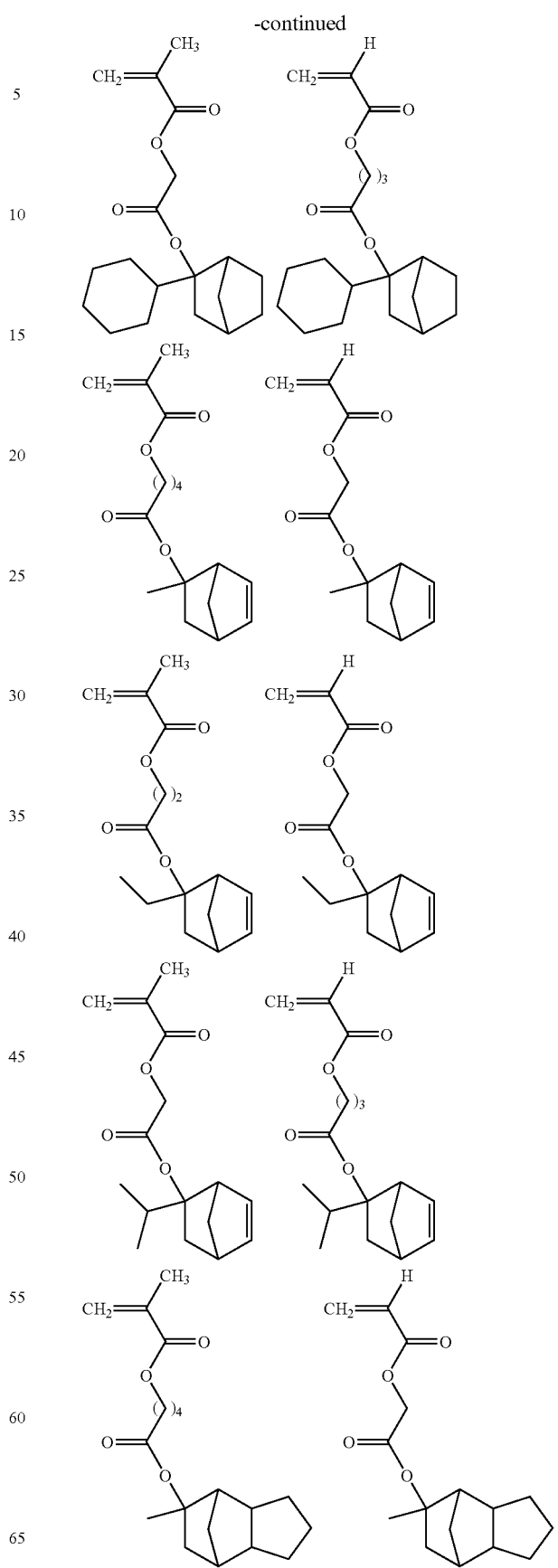

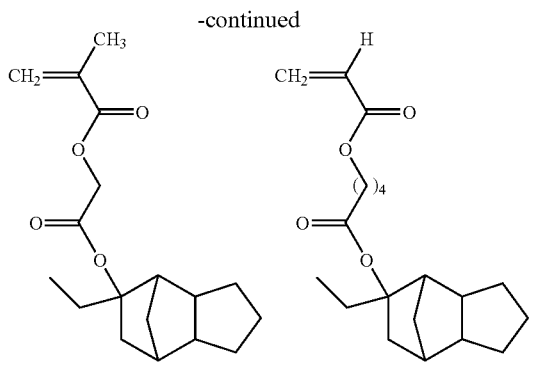

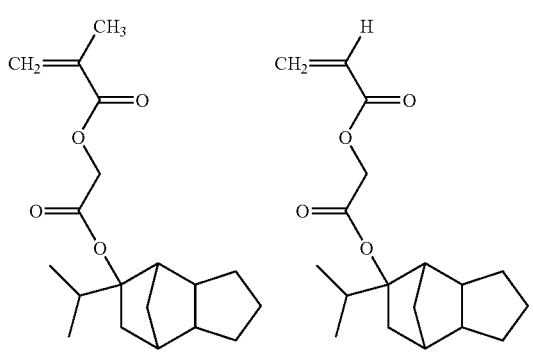

Among them, the structural unit represented by the formula (IIa) is preferable. When the structural unit represented by the formula (IIa) is particularly the structural unit derived from 2-ethyl-2-adamantyl acrylate, 2-ethyl-2-adamantyl methacrylate, 2-isopropyl-2-adamantyl acrylate or 2-isopropyl-2-adamantyl methacrylate, composition having excellent sensitivity and heat resistance tends to be obtained.

The monomer represented by the formula (IIa-1) can usually be produced by a reaction of the corresponding hydroxyl-containing adamantane compound with an acrylic halide or a methacrylic halide. The monomer represented by the formula (IIb-1) can usually be produced by a reaction of the corresponding hydroxyl-containing norbornene compound with an acrylic halide or a methacrylic halide.

Next, (b) a structural unit having at least one hydroxyl group (hereinafter, simply referred to as the structural unit (b)) will be illustrated.

Herein, —OH of a carboxyl group (—COOH) is not the hydroxyl group in the structural unit (b).

Examples of the structural unit (b) include a structural unit having an alkyl group substituted with at least one hydroxyl group such as hydroxylmethyl group and 1,1-dimethyl-2-hydroxyethyl group, and a structural unit having alicyclic group substituted with at least one hydroxyl group such as 2-hydroxycyclopentyl group, 4-hydroxycyclohexyl group, 3-hydroxy-1-adamantyl group.

Examples of the structural unit (b) include a structure unit derived from an ester of acrylic acid wherein the ester group has at least one hydroxyl group, a structural unit derived from an ester of methacrylic acid wherein the ester group has at least one hydroxyl group, a structural unit derived from an ester of norbornenecarboxylic acid wherein the ester group has at least one hydroxyl group, a structural unit derived from an ester of tricyclodecenecarboxylic acid wherein the ester group has at least one hydroxyl group and a structural unit derived from an ester of tetracyclodecenecarboxylic acid wherein the ester group has at least one hydroxyl group. The structure units derived from the ester of acrylic acid wherein the ester group has at least one hydroxyl group and from the ester of methacrylic acid wherein the ester group has at least one hydroxyl group are preferable.

As the structural unit (b), the structural unit represented by the formula (III):

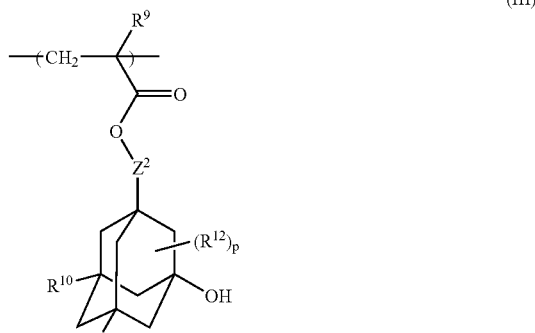

wherein $R^9$ represents a hydrogen atom or a methyl group, $R^{10}$ and $R^{11}$ each independently represent a hydrogen atom, a methyl group or a hydroxyl group, $R^{12}$ represents a methyl group, p represents an integer of 0 to 12, $Z^2$ represents a single bond or —$(CH_2)_s$—COO— and s represents an integer of 1 to 4, is preferable. It is preferred that $R^{10}$ and $R^{11}$ each independently represent a hydrogen atom or a hydroxyl group. $Z^2$ is preferably the single bond or —$CH_2$—COO—, and p is preferably 0 or 1 and p is more preferably 0.

The structural unit represented by the formula (III) is derived from the monomer represented by the formula (III-1):

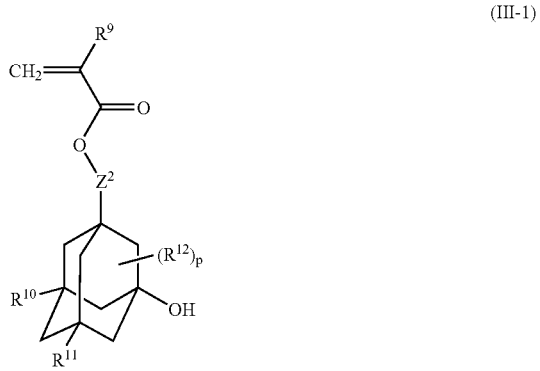

wherein $R^9$, $R^{10}$, $R^{11}$, $R^{12}$, $Z^2$ and p are the same as defined above.

Specific examples of the monomer represented by the formula (III-1) include the followings.

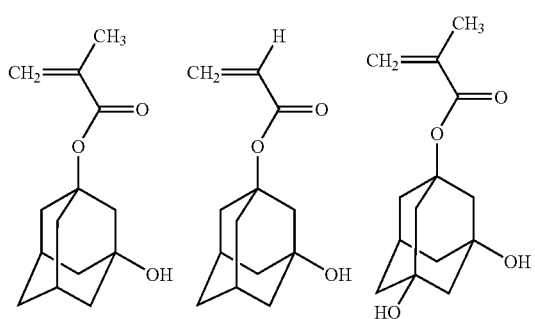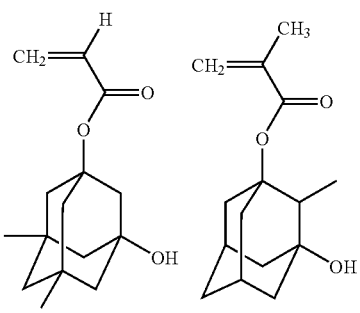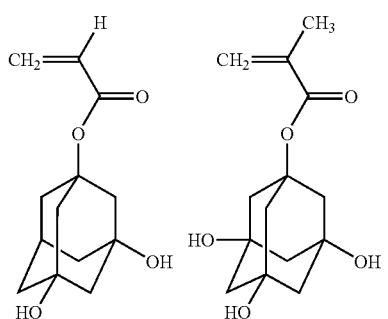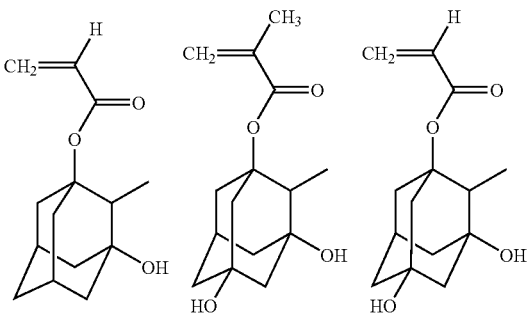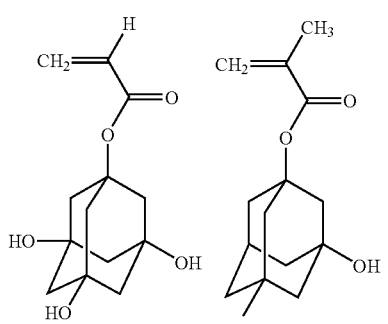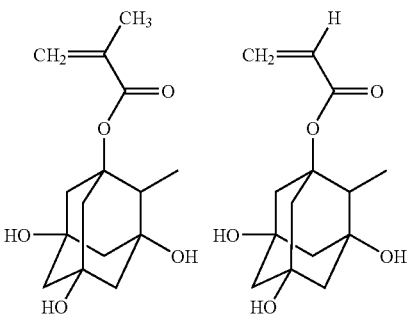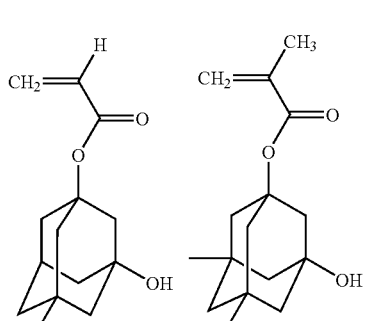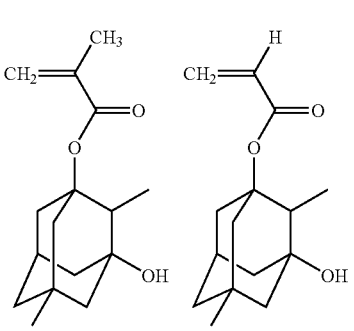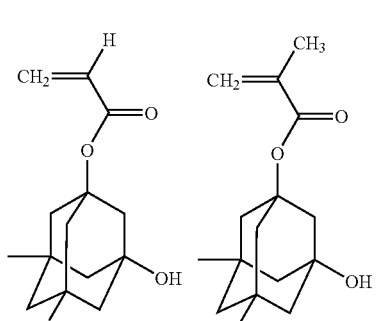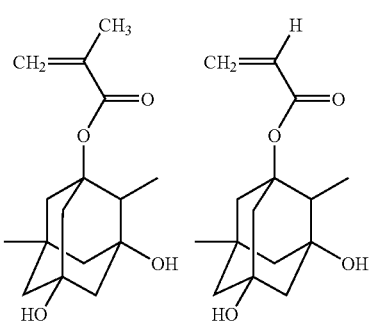

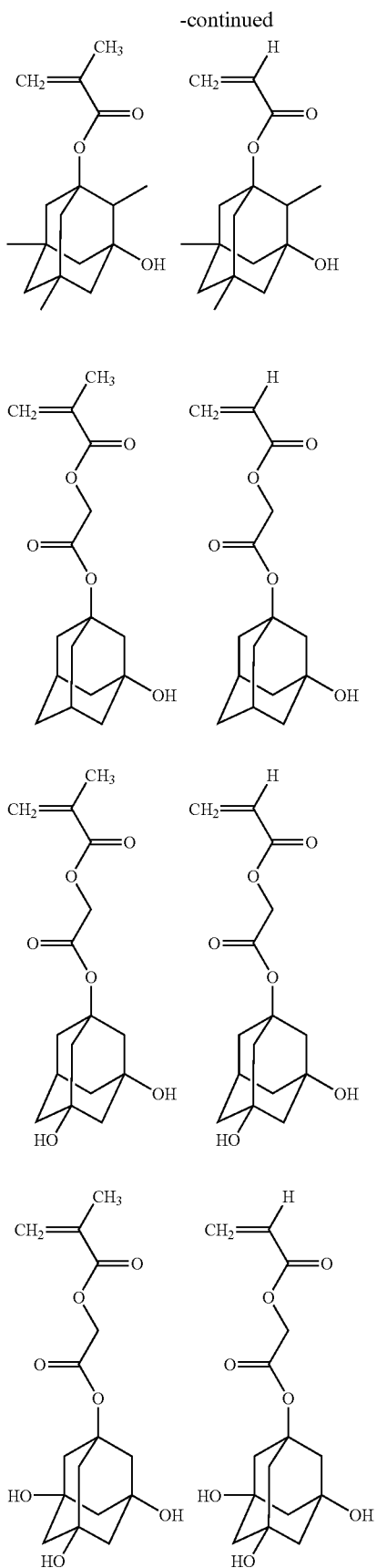
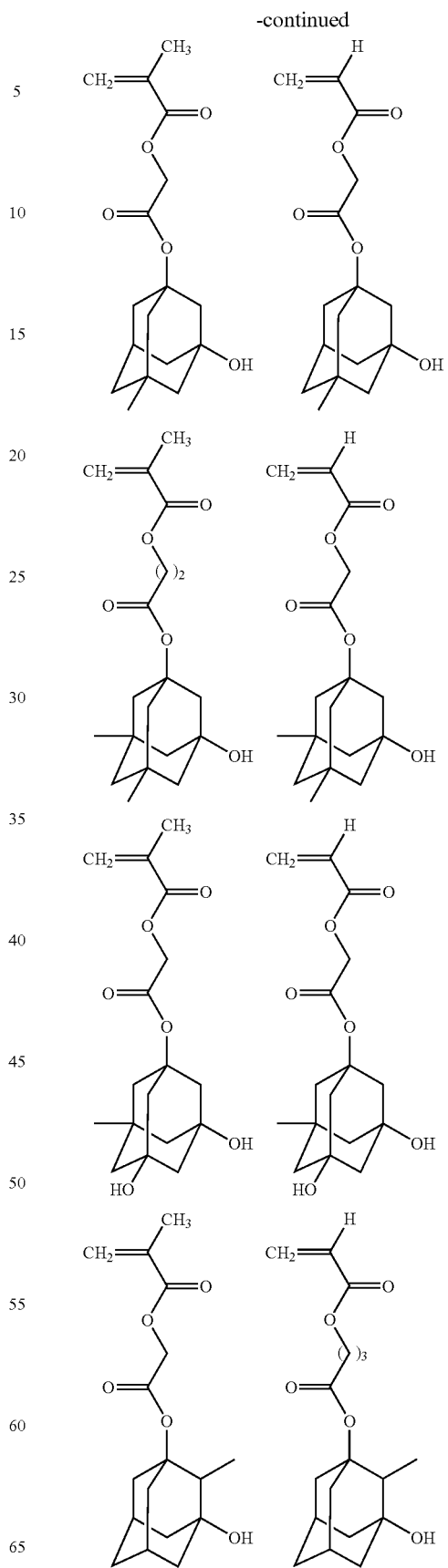

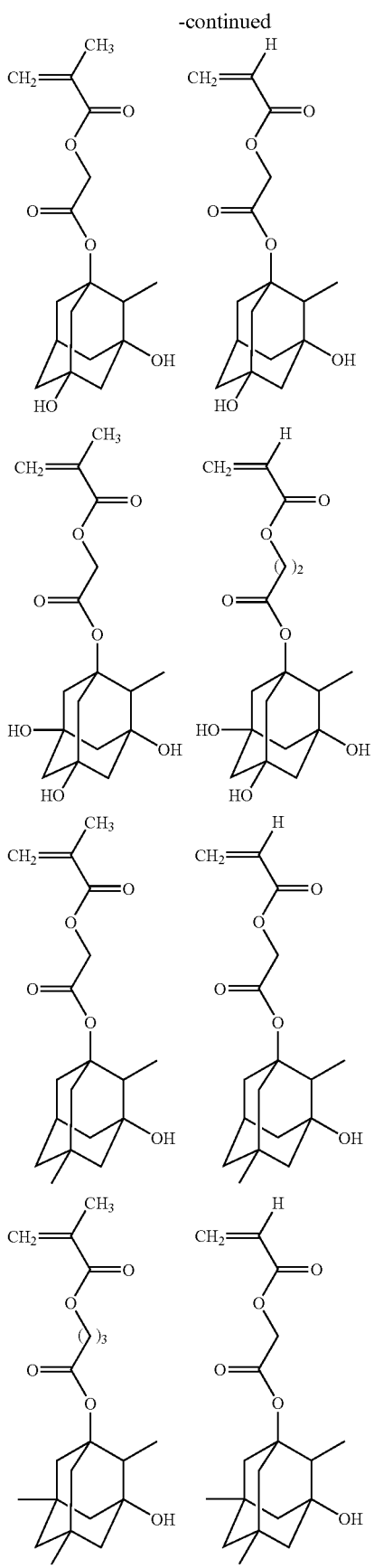
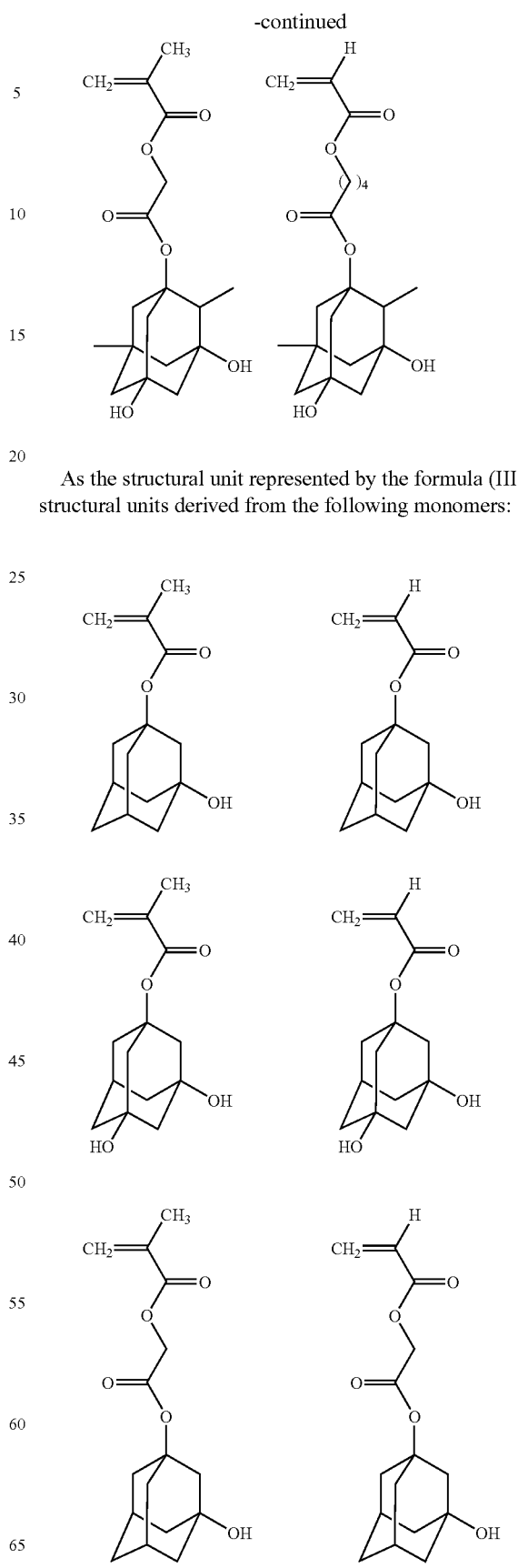
As the structural unit represented by the formula (III), the structural units derived from the following monomers:

-continued

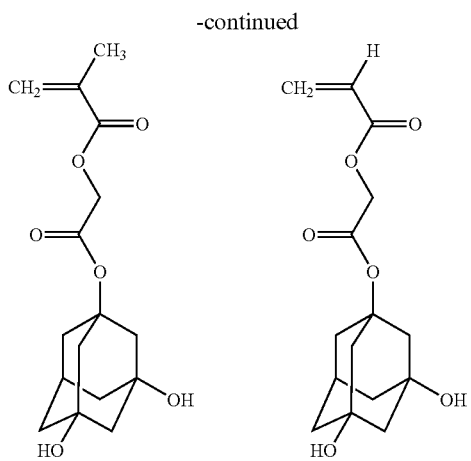

are preferable in viewpoint of the resolution.

The monomer represented by the formula (III-1) can usually be produced by a reaction of the corresponding hydroxyl-containing adamantane compound with an acrylic halide or a methacrylic halide.

Next, (c) a structural unit having at least one lactone structure (hereinafter, simply referred to as the structural unit (c)) will be illustrated.

Examples of the lactone structure include β-butyrolactone and γ-butyrolactone.

Specific examples the structural unit (c) include a structural units represented by the formulae (IVa), (IVb) and (IVc):

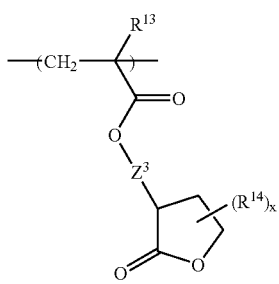
(VIa)

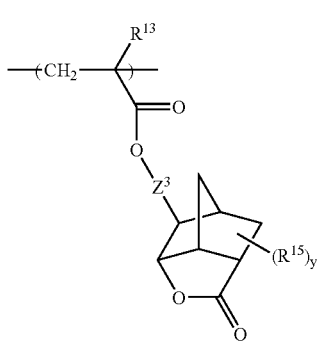
(VIb)

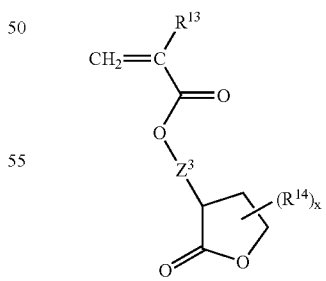
(VIc)

wherein $R^{13}$ represents a hydrogen atom or a methyl group, $R^{14}$ represents a methyl group, x represents an integer of 0 to 5, $Z^3$ represents a single bond or —$(CH_2)_u$—COO—, u represents an integer of 1 to 4, $R^{15}$ represents a C1-C4 hydrocarbon group, a carboxyl group or a cyano group, y represents an integer of 0 to 3, $R^{16}$ represents a C1-C4 hydrocarbon group, a carboxyl group or a cyano group, z represents an integer of 0 to 3, and when y is 2 or 3, $R^{15}$s may be the same or different, and when z is 2 or 3, $R^{16}$s may be the same or different.

Preferably, x represents 0. $Z^3$ preferably represents the single bond or —$CH_2$—COO—.

Examples of the C1-C4 hydrocarbon group include a methyl, ethyl, n-propyl, isopropyl, n-butyl, isobutyl and tert-butyl group.

$R^{15}$ preferably represents the methyl group, the carboxyl group or the cyano group, and $R^{16}$ preferably represents the methyl group, the carboxyl group or the cyano group. Preferably, y represents 0 or 1, and z preferably represents 0, 1 or 2.

The structural unit represented by the formula (IVa) is derived from the monomer represented by the formula (IVa-1):

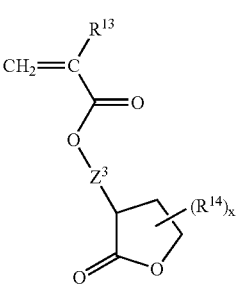
(VIa-1)

wherein $R^{13}$, $R^{14}$, $Z^3$ and x are the same as defined above.

Specific examples of the monomer represented by the formula (VIa-1) include the followings.

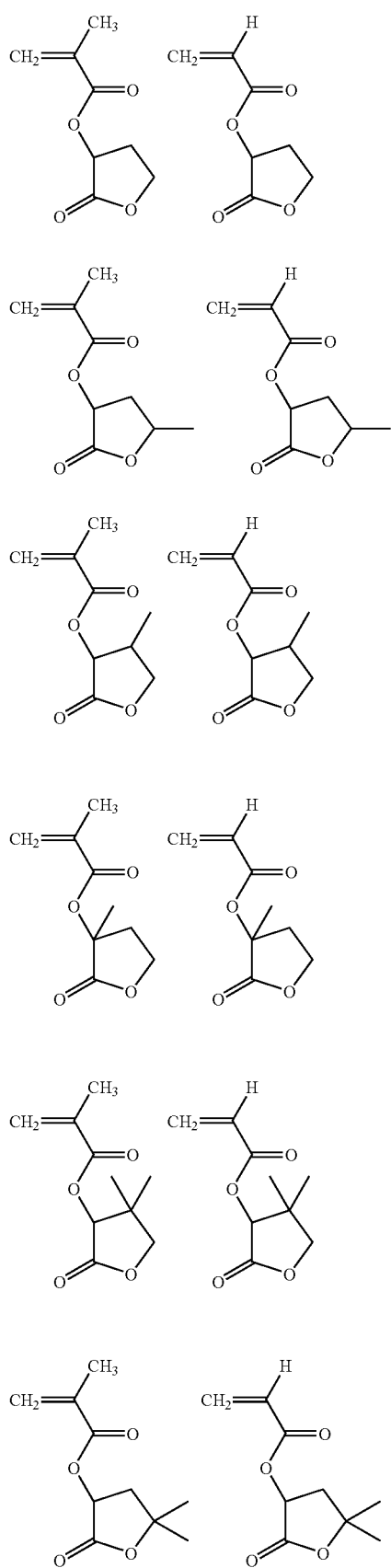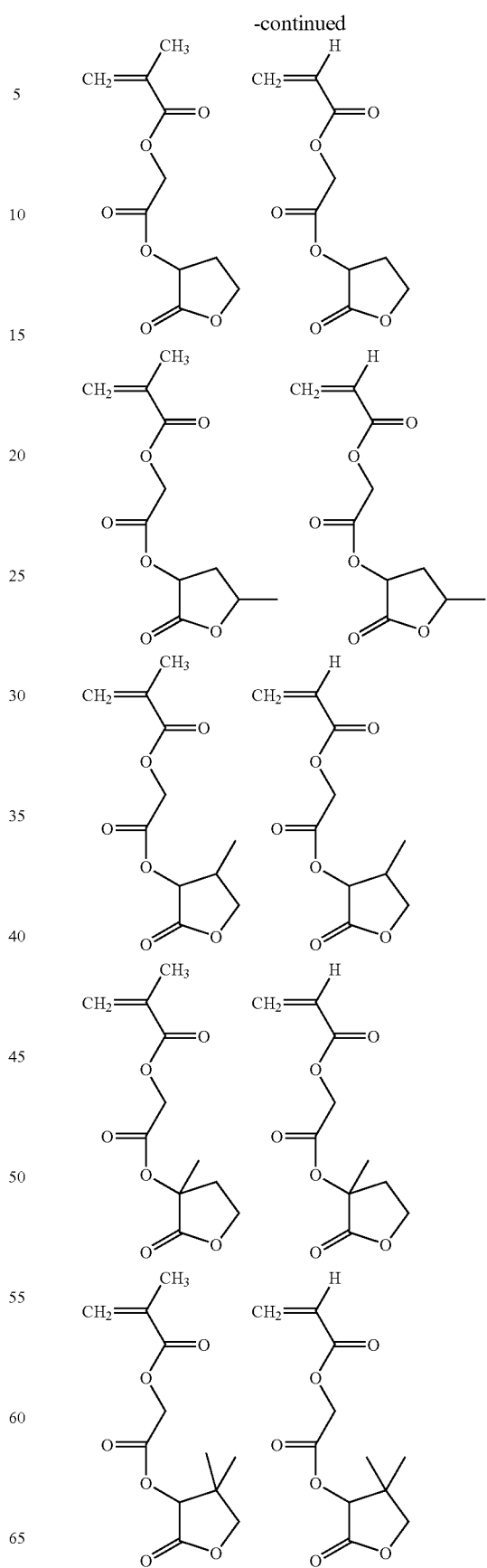

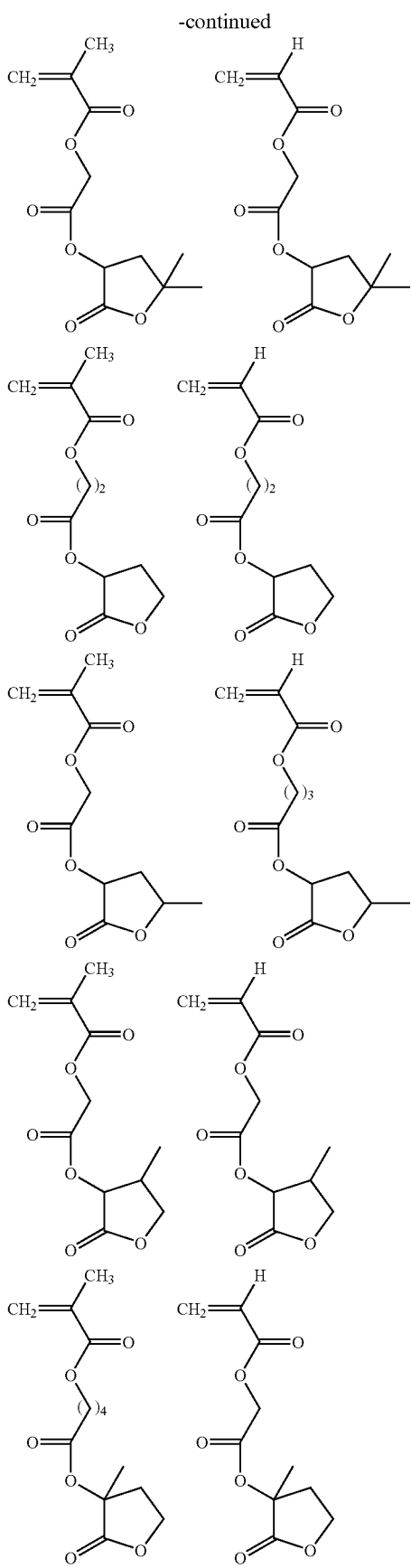
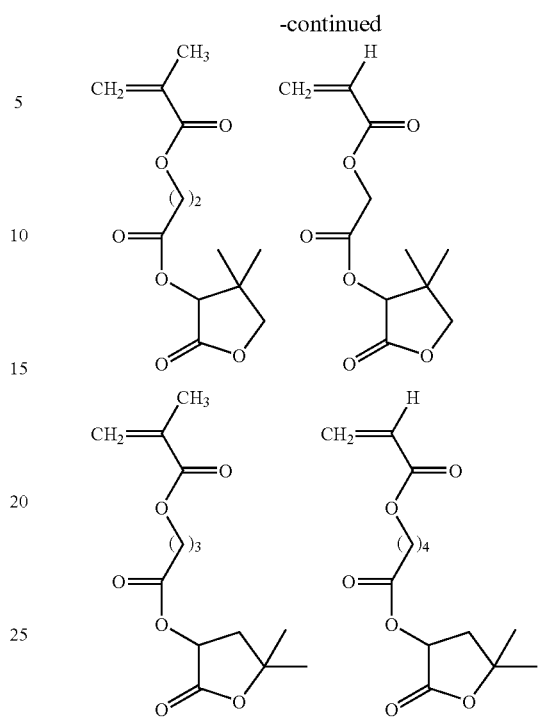
The structural unit represented by the formula (IVb) is derived from the monomer represented by the formula (IVb-1):
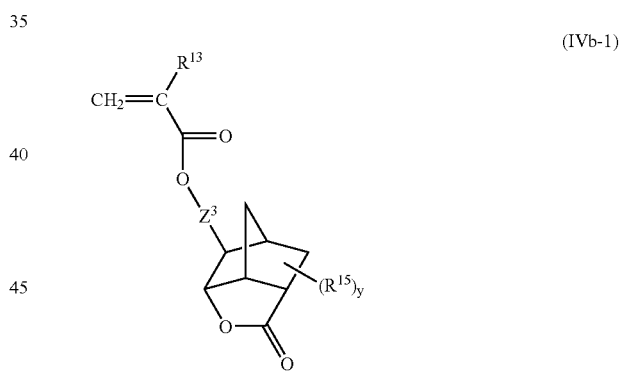
wherein $R^{13}$, $R^{15}$, $Z^3$ and y are the same as defined above.
Specific examples of the monomer represented by the formula (IVb-1) include the followings.
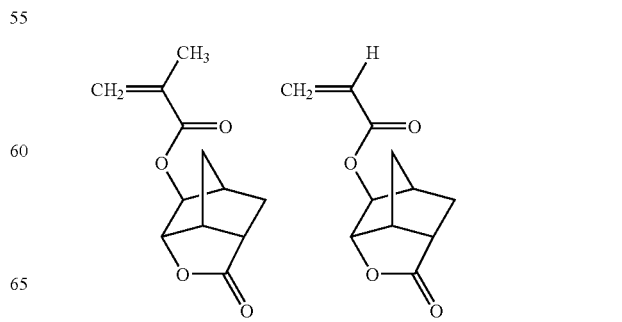

-continued
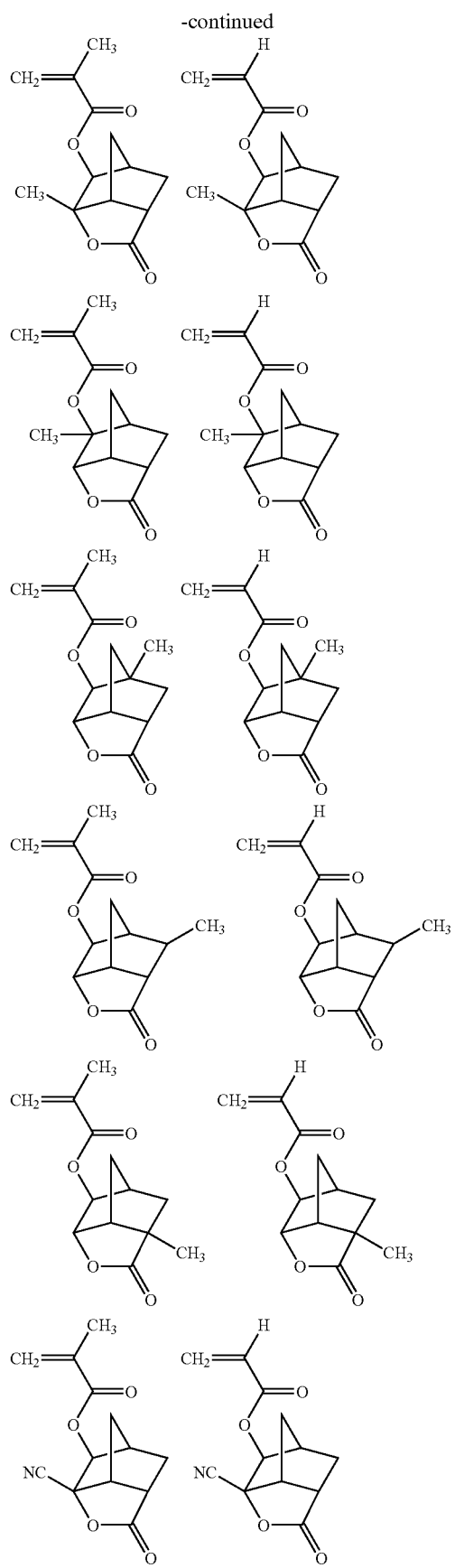
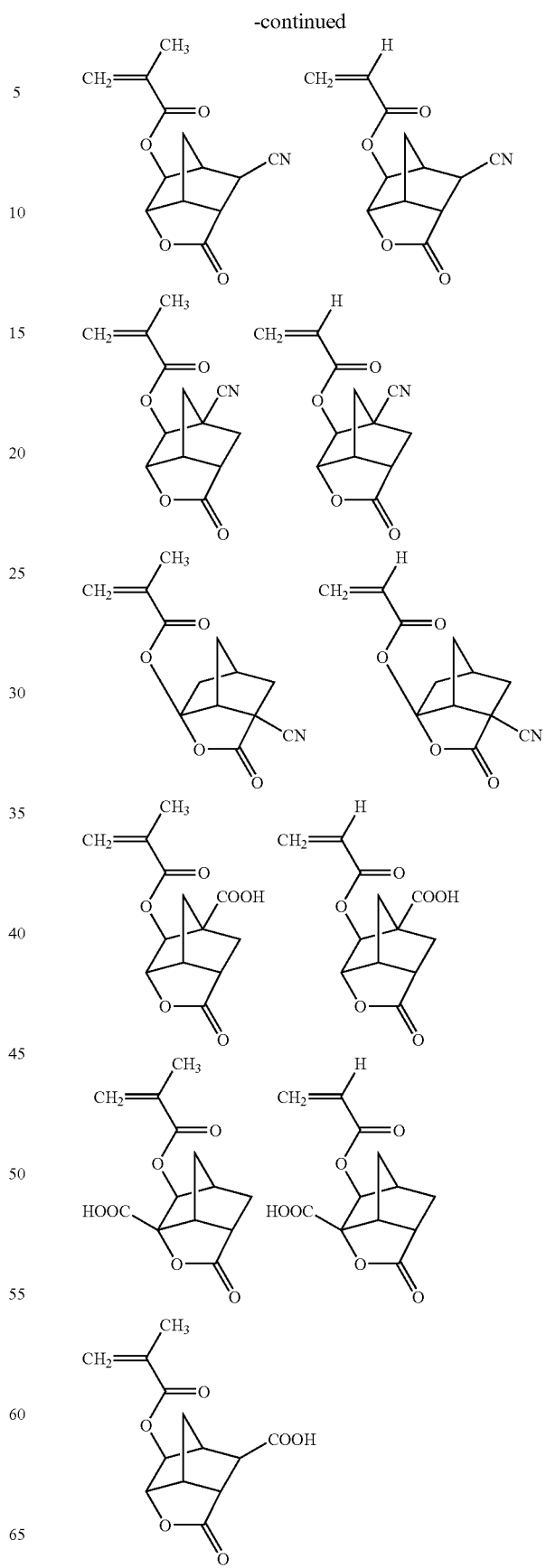

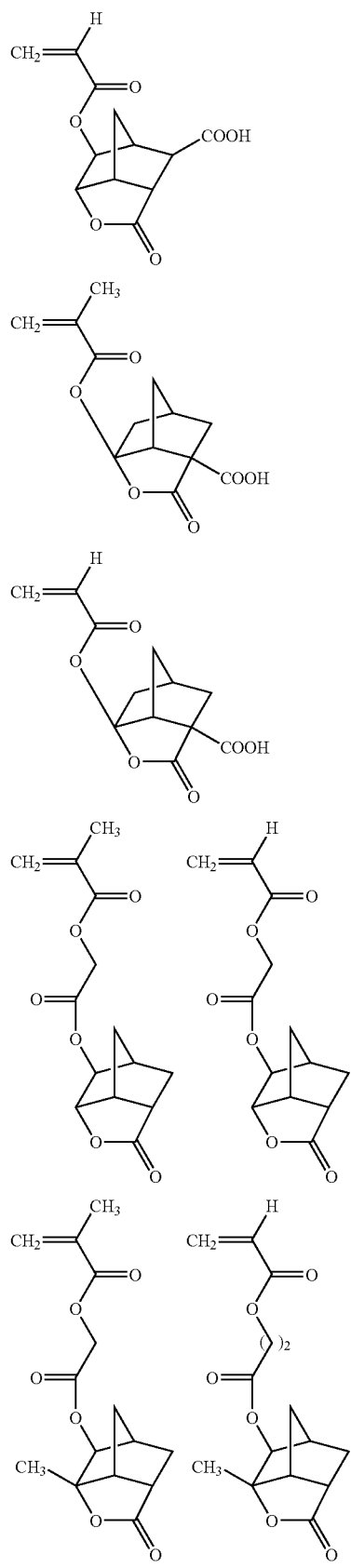
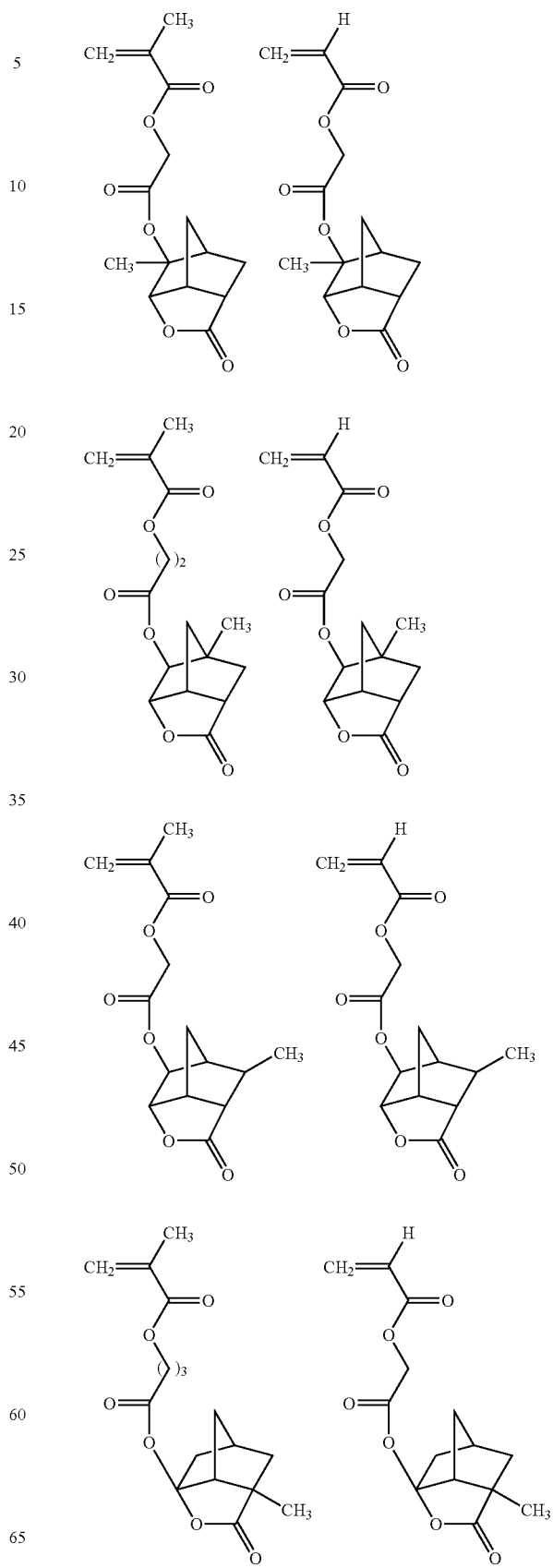

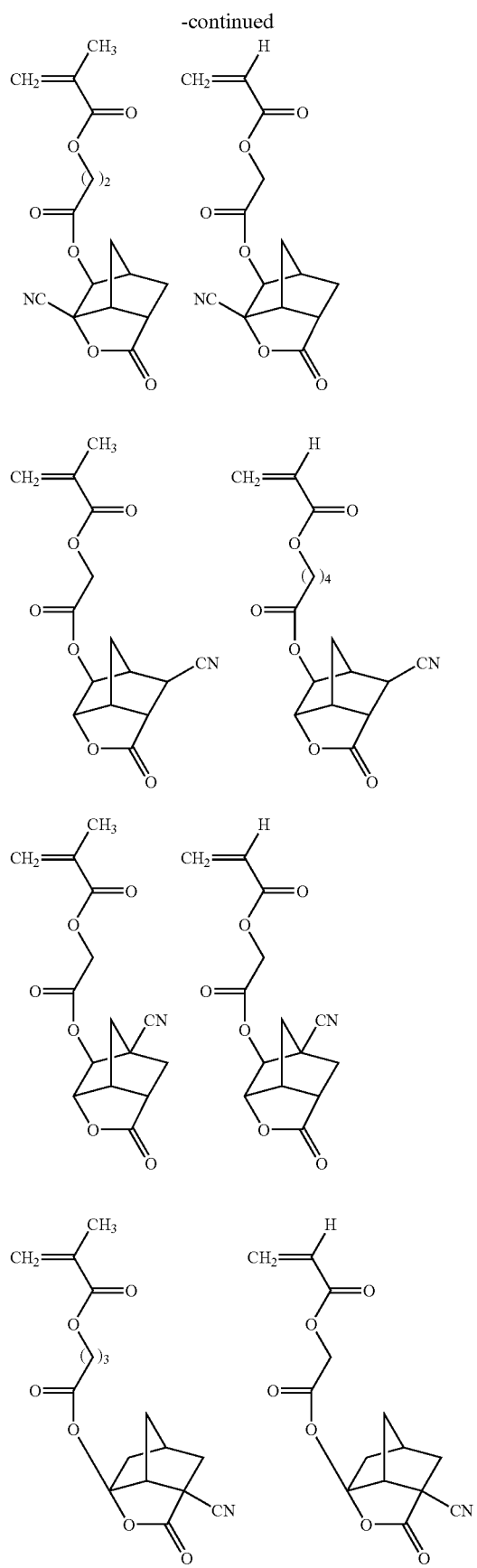
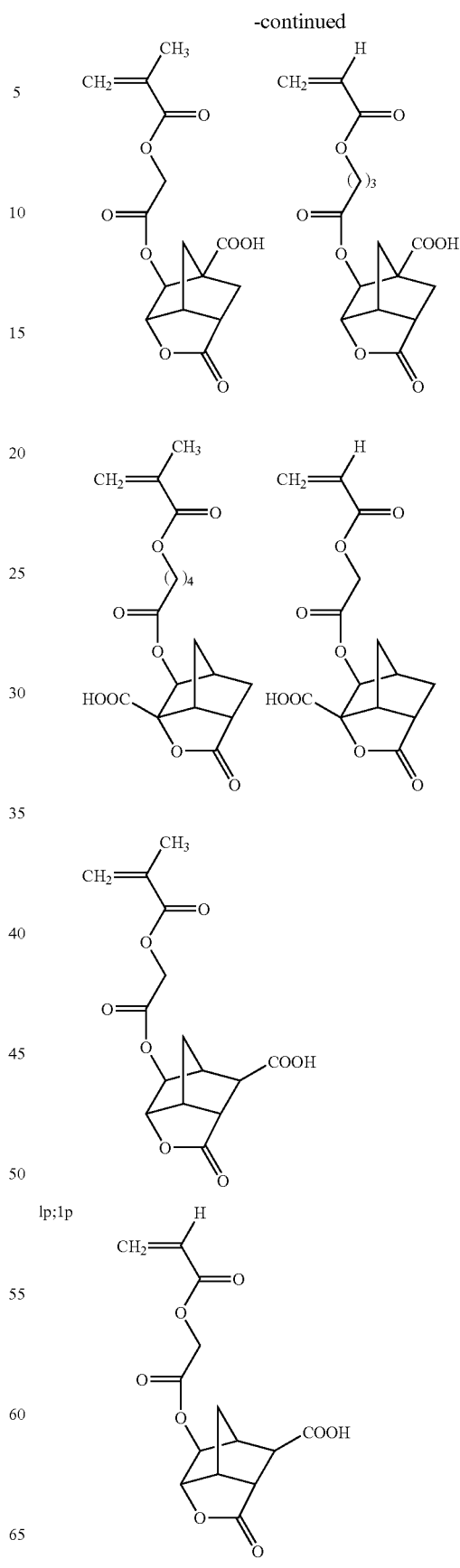

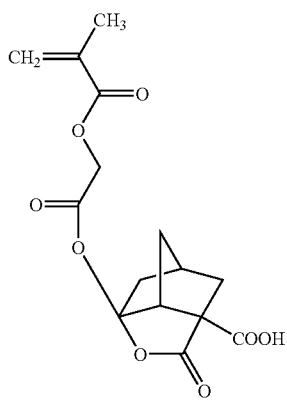
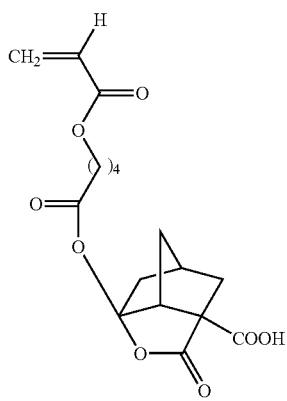
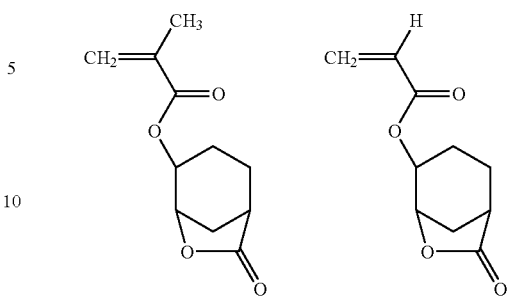
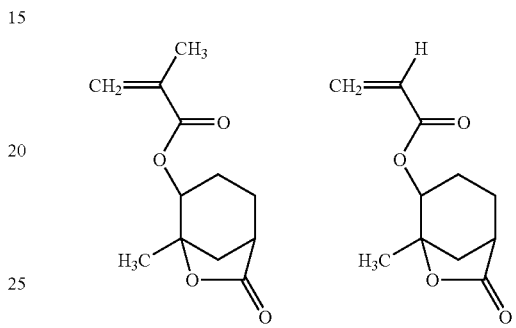
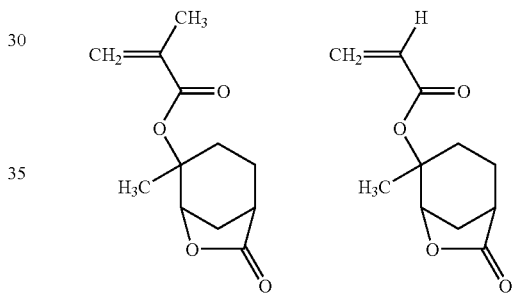
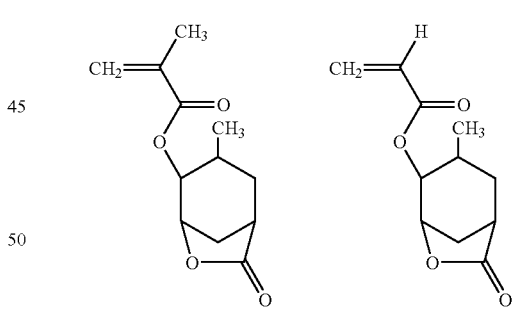
The structural unit represented by the formula (IVc) is derived from the monomer represented by the formula (IVc-1):
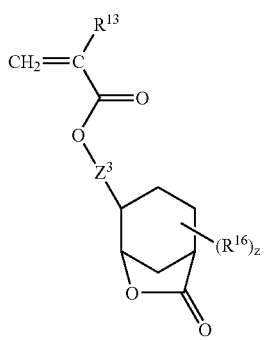
(IVc-1)
wherein $R^{13}$, $R^{16}$, $Z^3$ and z are the same as defined above.
Specific examples of the monomer represented by the formula (IVc-1) include the followings.
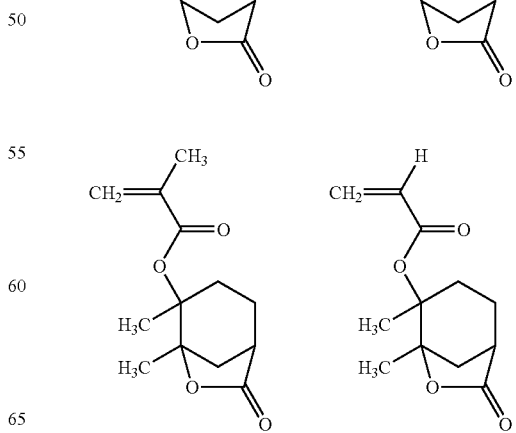

-continued
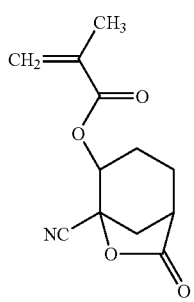 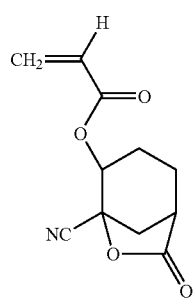 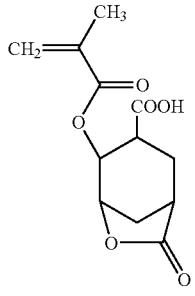 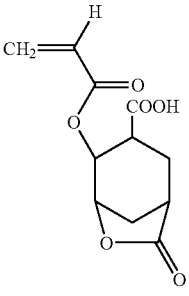
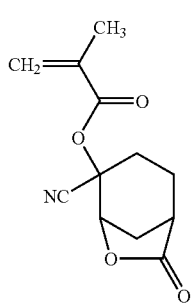 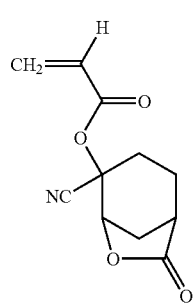 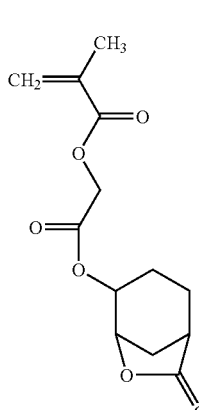 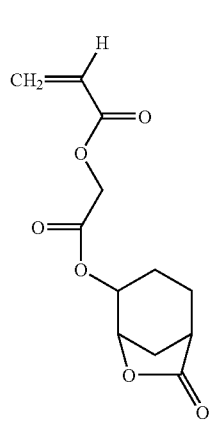
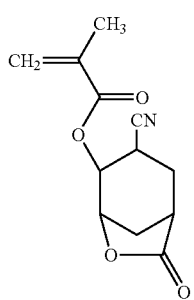 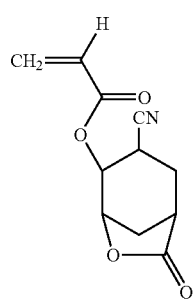 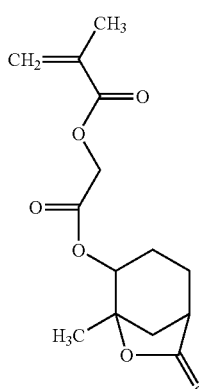 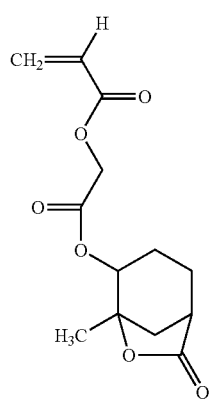
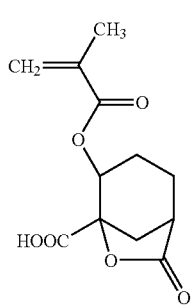 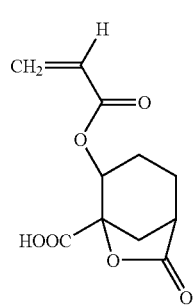 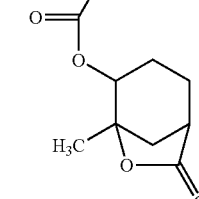 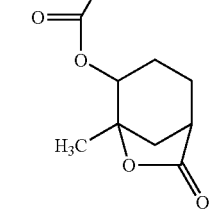
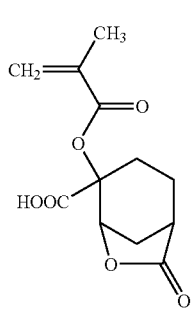 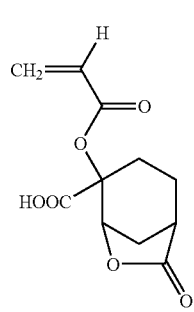 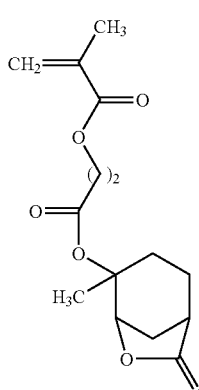 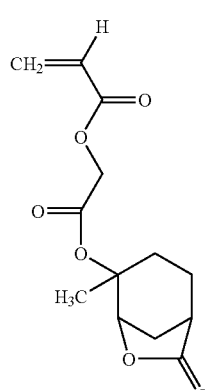

-continued
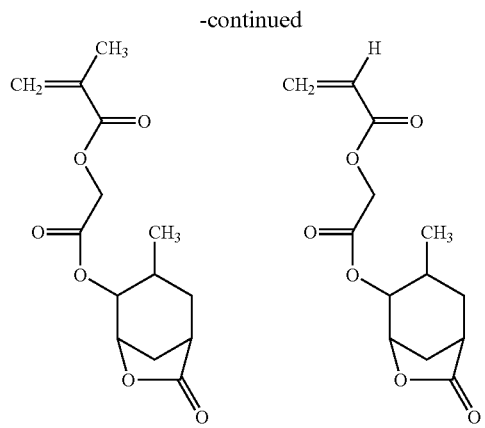
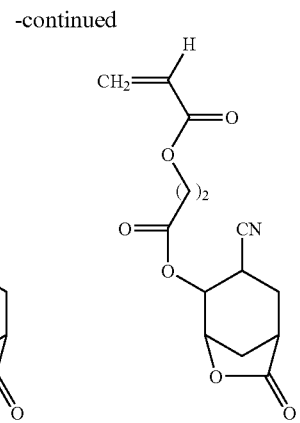
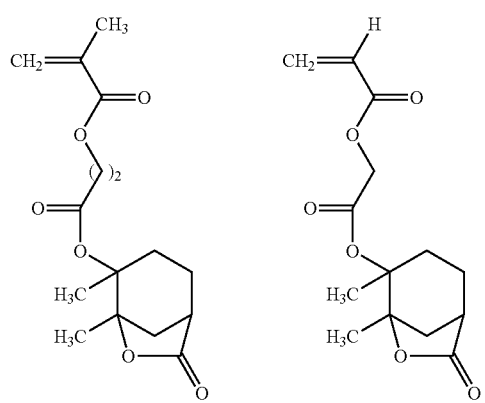
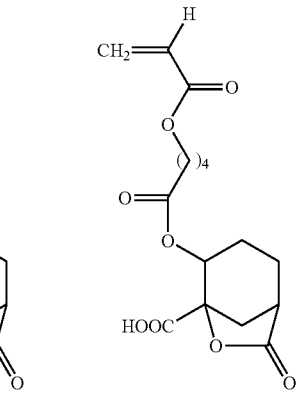
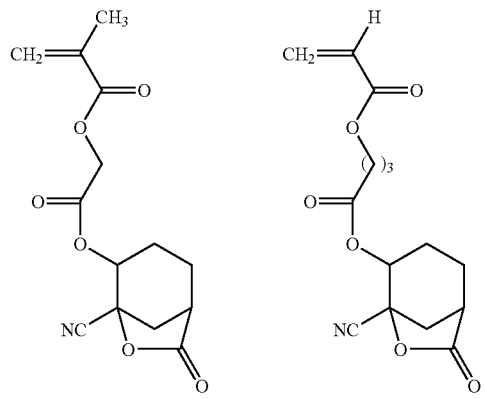
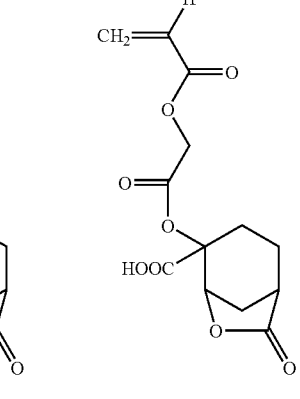
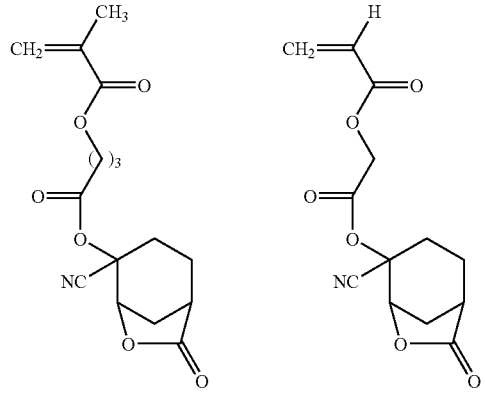
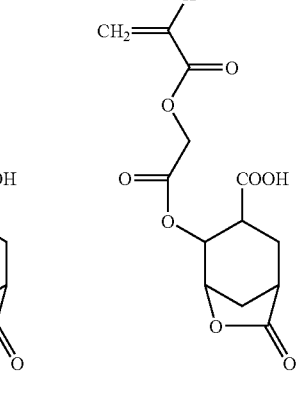

As the structural unit (c), the structural units derived from the following monomers:

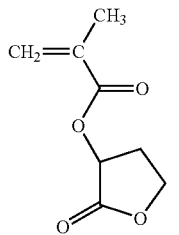 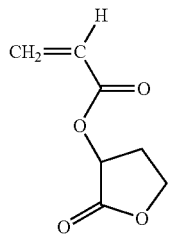

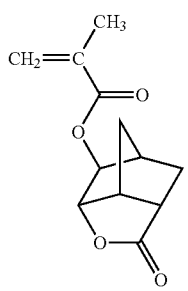 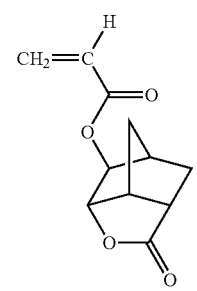

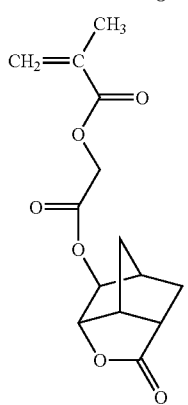 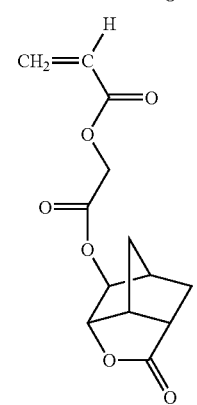

are preferable in viewpoint of the adhesiveness of resist composition to a substrate.

The monomer represented by the formulae (VIa-1), (VIb-1) and (VIc-1) can usually be produced by a reaction of the corresponding hydroxyl-containing lactone compound with an acrylic halide or methacrylic halide.

Next, a structural unit represented by the formula (Ia) or (Ib):

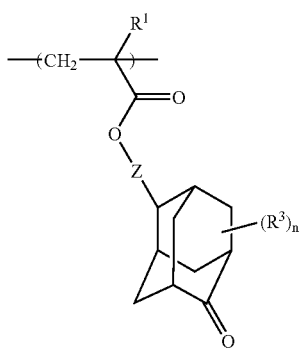

(Ia)

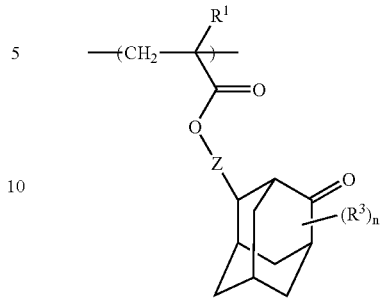

(Ib)

(hereinafter, simply referred to as the structural unit (d)) will be illustrated.

In the formulae (Ia) and (Ib), $R^1$ represents a hydrogen atom or a methyl group, $R^3$ represents a methyl group, n represents an integer of 0 to 14, and Z represents a single bond or $—[CH_2]_k—COO—$. Preferably, n represents an integer of 0 to 3, more preferably represents 0 or 1, and especially preferably represents 0. Z preferably represents the single bond or $—CH_2—COO—$.

The structural unit represented by the formula (Ia) is derived from the monomer represented by the formula (Ia-1):

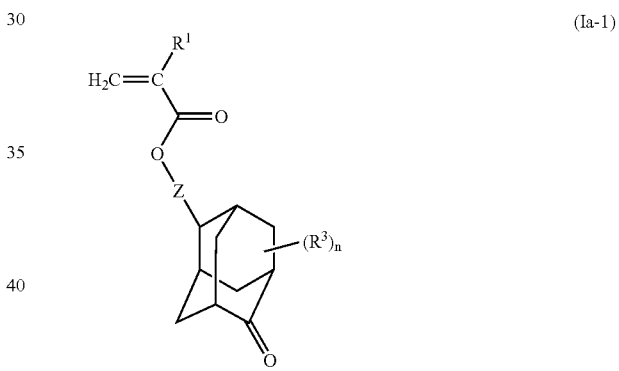

(Ia-1)

wherein $R^1$, $R^3$, z and n are the same as defined above, and the structural unit represented by the formula (Ib) is derived from the monomer represented by the formula (Ib-1):

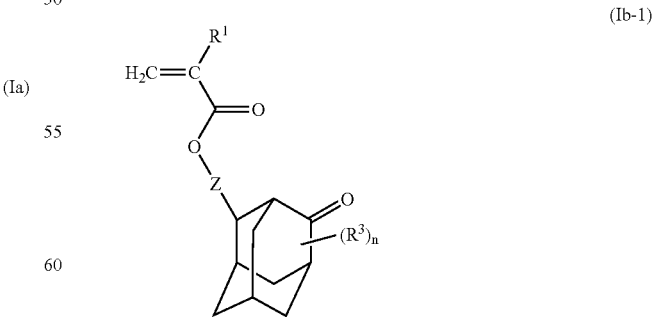

(Ib-1)

wherein $R^1$, $R^3$, Z and n are the same as defined above.

Specific examples of the monomers represented by the formulae (Ia-1) and (Ib-1) include the followings.

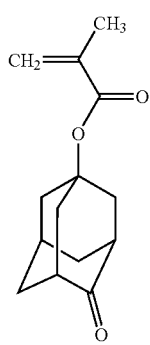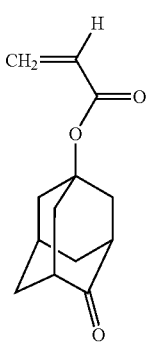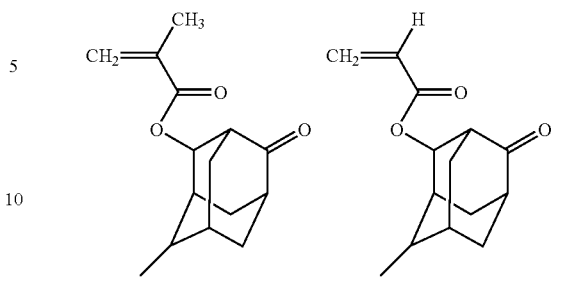
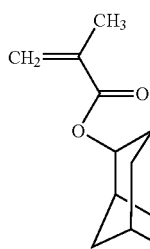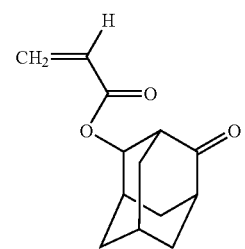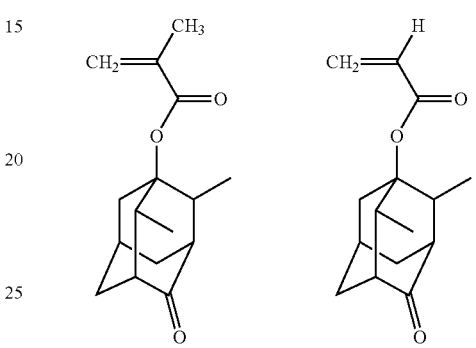
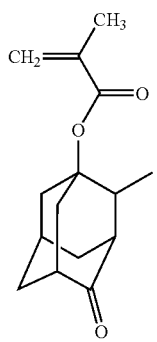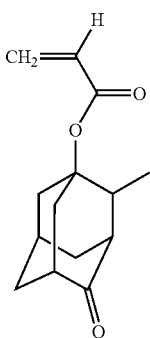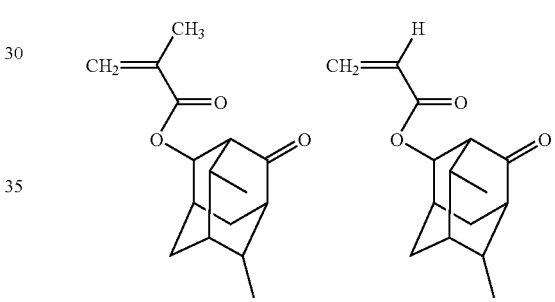
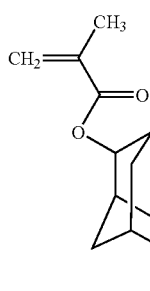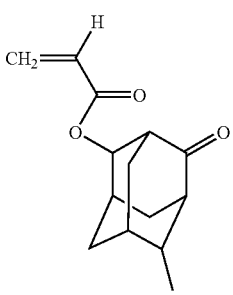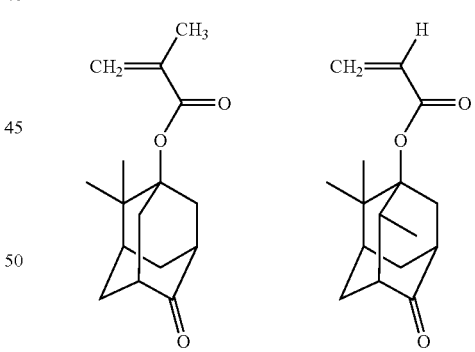
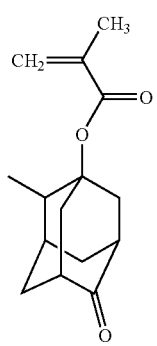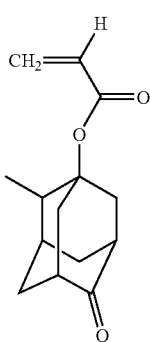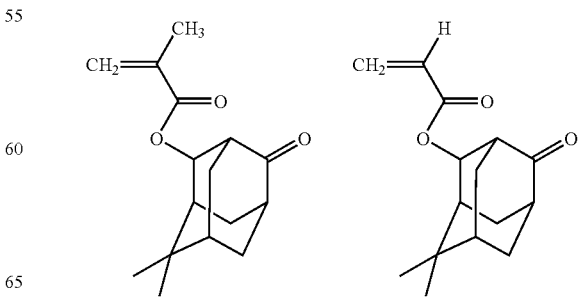

-continued
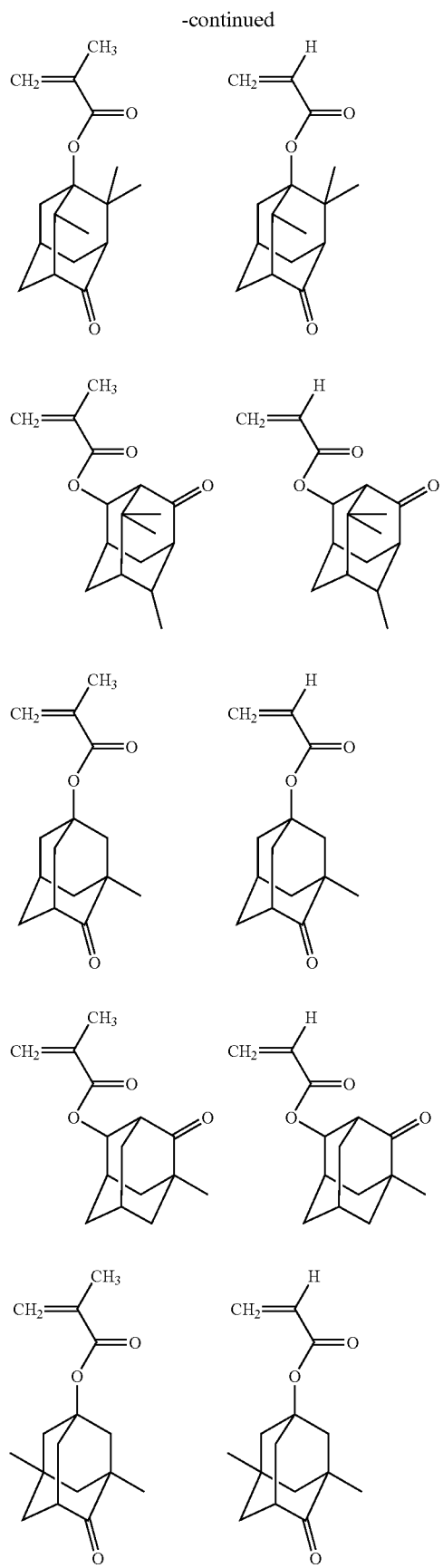
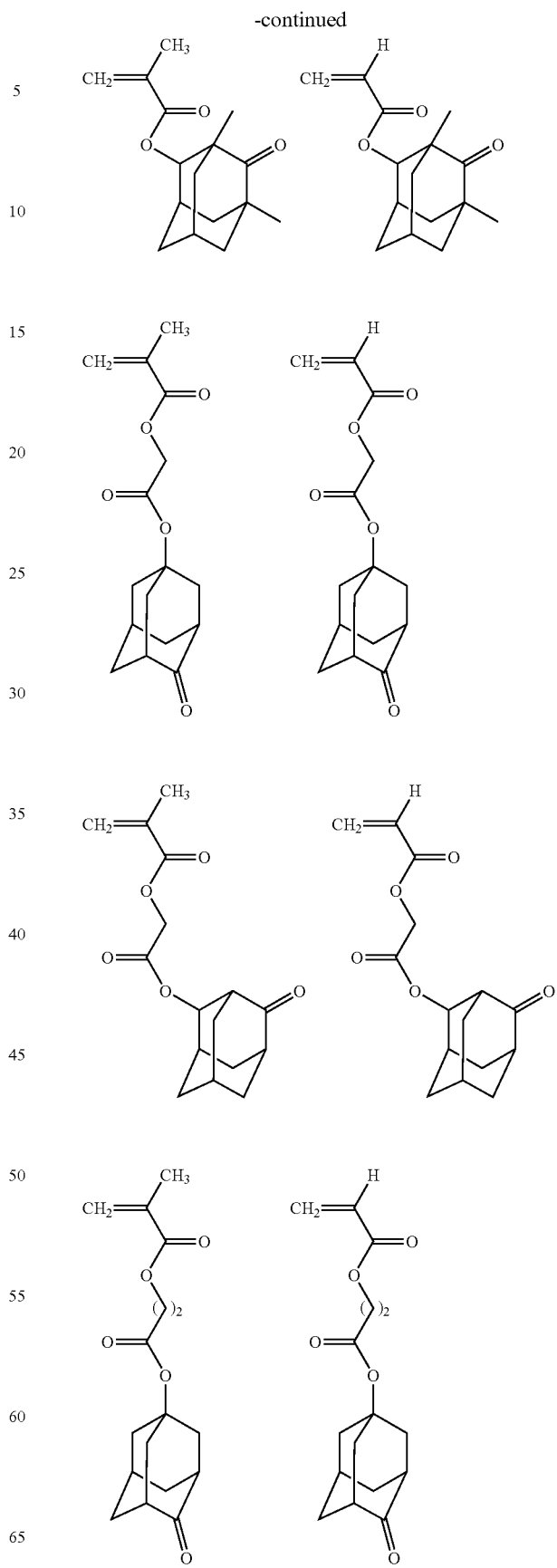

-continued
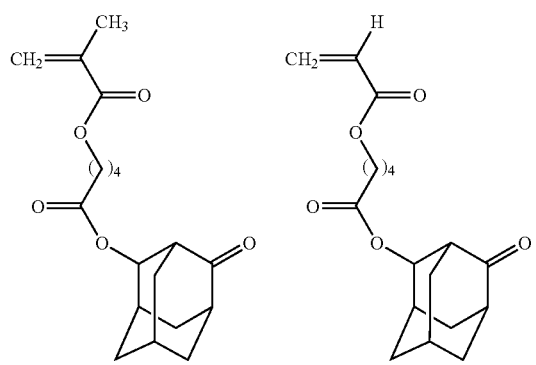
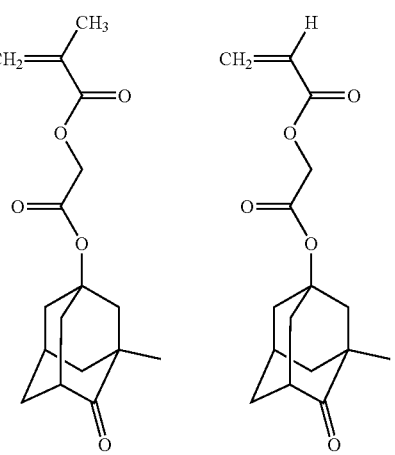
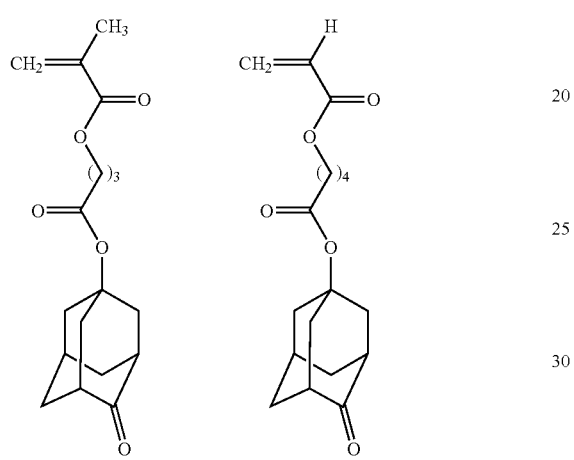
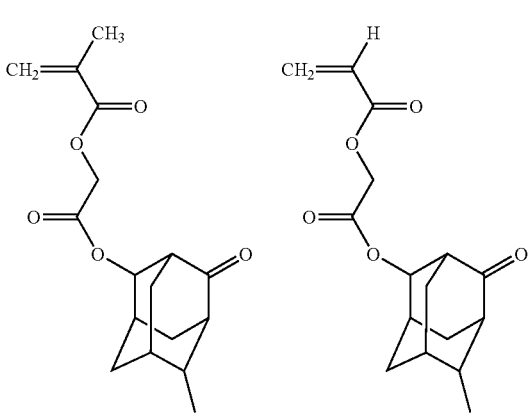
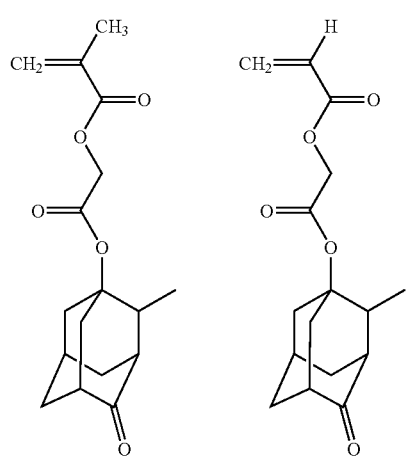
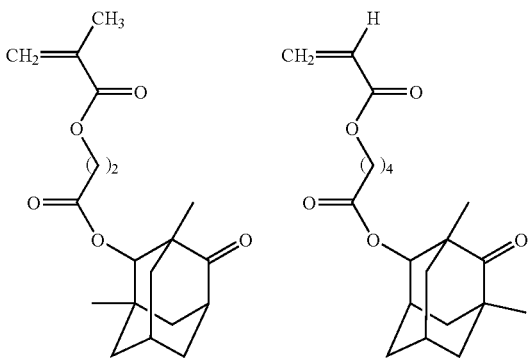
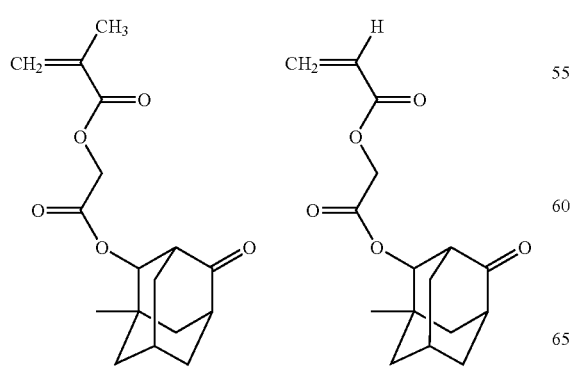
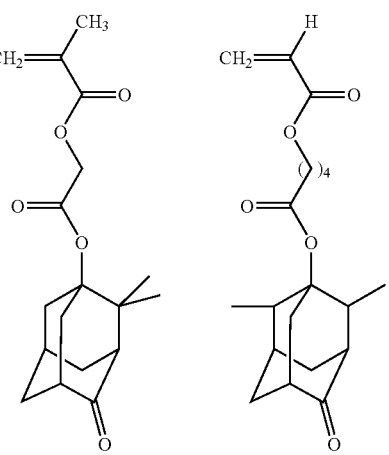

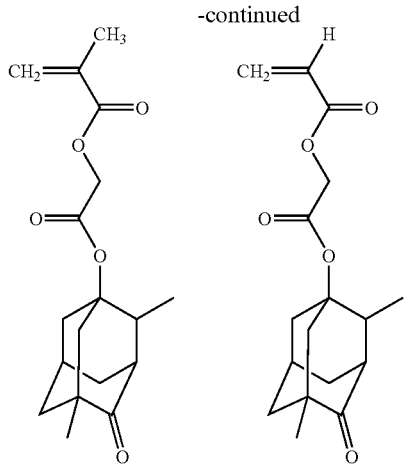

As the structural unit (d), the structural units derived from the following monomers:

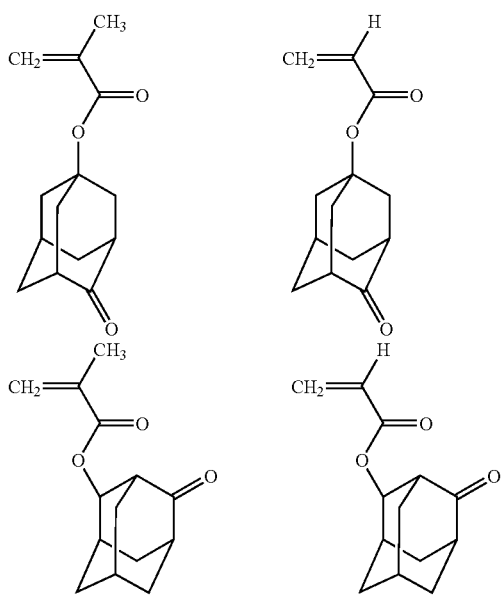

are preferable in viewpoint of the dry etching resistance of the resist film given from the resist composition.

The monomer represented by the formulae (Ia-1) and (Ib-1) can usually be produced by a reaction of the corresponding hydroxyl-containing adamantanone compound with an acrylic halide or a methacrylic halide.

The content of the structural unit (a) in the resin is usually 10 to 80 mol % and preferably 15 to 60 mol %, based on sum molar of the structural units (a), (b), (c) and (d) though the ratio varies depending on the kind of radiation for patterning exposure, the kind of an acid-labile group, and the like. The content of the structural unit (b) in the resin is usually 2 to 50 mol % and preferably 4 to 35 mol %, based on sum molar of the structural units (a), (b), (c) and (d). The content of the structural unit (c) in the resin is usually 5 to 60 mol % and preferably 10 to 45 mol %, based on sum molar of the structural units (a), (b), (c) and (d). The content of the structural unit (d) in the resin is usually 5 to 60 mol % and preferably 10 to 45 mol %, based on sum molar of the structural units (a), (b), (c) and (d). Herein, the sum of the contents of the structural units (a), (b), (c) and (d) is 100 mol % based on sum molar of the structural units (a), (b), (c) and (d).

The resin of the present invention itself is insoluble or poorly soluble in an alkali aqueous solution but becomes soluble in an alkali aqueous solution by the action of an acid. The resin may have other structural unit or units in addition to the structural units (a), (b), (c) and (d).

As the other structural unit, a structural unit derived from an alicyclic compound having an olefinic double bond such as a structural unit represented by the formula (1):

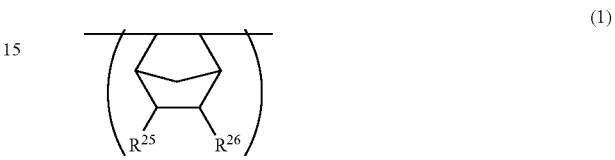

wherein $R^{25}$ and $R^{26}$ each independently represents a hydrogen atom, a C1-C3 alkyl group, a C1-C3 hydroxyalkyl group, a carboxyl group, a cyano group, a hydroxyl group or a —COOU group in which U represents an alcohol residue, or $R^{25}$ and $R^{26}$ can be bonded together to form a carboxylic anhydride residue represented by —C(=O)OC(=O)—;

a structural unit derived from an aliphatic unsaturated dicarboxylic anhydride such as a structural unit represented by the formula (2):

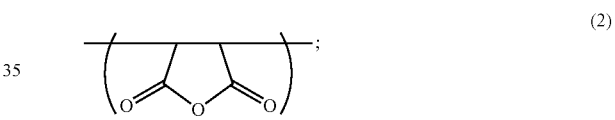

and a structural unit represented by the formula (3):

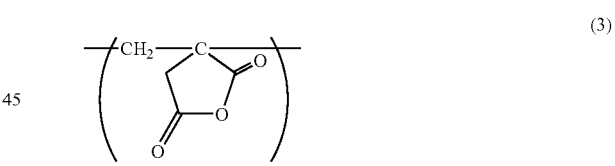

are exemplified.

The resin containing a structural unit derived from 2-norbornene shows strong structure because the alicyclic group is directly present on its main chain and shows a property that dry etching resistance is more excellent. The structural unit derived from 2-norbornene can be introduced into the main chain by radical polymerization using, for example, an aliphatic unsaturated dicarboxylic anhydride such as maleic anhydride and itaconic anhydride together in addition to corresponding 2-norbornene. The structural unit derived from 2-norbornene is formed by opening of its double bond, and can be represented by the above-mentioned formula (1). The structural unit derived from maleic anhydride and from itaconic anhydride which are the structural unit derived from aliphatic unsaturated dicarboxylic anhydrides are formed by opening of their double bonds, and can be represented by the above-mentioned formula (2) and the formula (3), respectively.

In $R^{25}$ and $R^{26}$, examples of the C1-C3 alkyl group include a methyl, ethyl, and n-propyl group, and examples of the C1-C3 hydroxyalkyl group include a hydroxymethyl and 2-hydroxyethyl group.

In $R^{25}$ and $R^{26}$, the —COOU group is an ester formed from the carboxyl group, and as the alcohol residue corresponding to U, for example, an optionally substituted C1-C8 alkyl group, 2-oxooxolan-3-yl group, 2-oxooxolan-4-yl and the like are listed, and as the substituent on the C1-C8 alkyl group, a hydroxyl group, an alicyclic hydrocarbon residue and the like are listed.

Specific examples of the monomer used to give the structural unit represented by the above-mentioned formula (1) may include 2-norbornene, 2-hydroxy-5-norbornene, 5-norbornene-2-carboxylic acid, methyl 5-norbornene-2-carboxylate, 2-hydroxyethyl 5-norbornene-2-carboxylate, 5-norbornene-2-methanol and 5-norbornene-2,3-dicarboxylic anhydride.

When U in the —COOU group is the acid-labile group, the structural unit represented by the formula (1) is a structural unit having the acid-labile group even if it has the norbornane structure. Examples of monomers giving structural unit having the acid-labile group include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, 1-(1-adamantyl)-1-methylethyl 5-norbornene-2-carboxylate, and the like.

The ratio of the other structural unit or units is usually 0 to 50% by mole based on all structural units of the resin.

The resin can be produced by conducting the polymerization reaction of the corresponding monomer or monomers. The resin can be also produced by conducting the oligomerization reaction of the corresponding monomer or monomers followed by polymerizing the oligomer obtained.

The polymerization reaction is usually carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammonium peroxodisulfate and hydrogen peroxide. Among them, the azo compound is preferable and 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile) and dimethyl-2,2'-azobis(2-methylpropionate) are more preferable, and 2,2'-azobisisobutyronitrile and 2,2'-azobis(2,4-dimethylvaleronitrile) are especially preferable.

These radical initiators may be used alone or in a form of a mixture of two or more kinds thereof. When the mixture of two or more kinds thereof is used, the mixed ratio is not particularly limited.

The amount of the radical initiator is preferably 1 to 20% by mole based on all monomer or oligomer molar amount.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained.

Examples thereof include a hydrocarbon solvent such as toluene; an ether solvent such as 1,4-dioxane and tetrahydrofuran; a ketone solvent such as methyl isobutyl ketone; an alcohol solvent such as isopropyl alcohol; a cyclic ester solvent such as γ-butyrolactone; a glycol ether ester solvent such as propylene glycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers or oligomers.

When an alicyclic compound having an olefinic double bond and an aliphatic unsaturated dicarboxylic anhydride are used as monomers, it is preferable to use them in excess amount in view of a tendency that these are not easily polymerized.

After competition of the polymerization reaction, the resin produced can be isolated, for example, by adding a solvent in which the present resin is insoluble or poorly soluble to the reaction mixture obtained and filtering the precipitated resin. If necessary, the isolated resin may be purified, for example, by washing with a suitable solvent.

The weight-average molecular weight of the resin is preferably 1,000 to 500,000 and more preferably 4,000 to 50,000.

The resin may contain one structural unit (a) and may contain two or more kinds of structural units (a). The resin may contain one structural unit (b) and may contain two or more kinds of structural units (b). The resin may contain one structural unit (c) and may contain two or more kinds of structural units (c). The resin may contain one structural unit (d) and may contain two or more kinds of structural units (d).

The present chemically amplified resist composition comprises at least one acid generator.

The acid generator is a substance which is decomposed to generate an acid by applying a radiation such as a light, an electron beam or the like on the substance itself or on a resist composition containing the substance. The acid generated from the acid generator acts on the resin resulting in cleavage of the acid-labile group existing in the resin.

Examples of the acid generator include an onium salt compound, an organo-halogen compound, a sulfone compound, a sulfonate compound, and the like. The onium salt compound is preferable.

As the acid generator, acid generators described in JP 2003-5374 A1 are exemplified.

As the acid generator, a salt represented by the formula (V):

(V)

(hereinafter, simply referred to as Salt (V)) is also exemplified.

In Salt (V), $Y^1$ and $Y^2$ each independently represent a fluorine atom or a C1-C6 perfluoroalkyl group. Examples of the C1-C6 perfluoroalkyl group include a trifluoromethyl, pentafluoroethyl, heptafluoropropyl, nonafluorobutyl undecafluoropentyl and tridecafluorohexyl group, and the trifluoromethyl group is preferable.

It is preferable that $Y^1$ and $Y^2$ each independently represent the fluorine atom or the trifluoromethyl group, and it is more preferable that $Y^1$ and $Y^2$ represent the fluorine atoms.

$R^{21}$ represents a C1-C6 linear or branched chain hydrocarbon group or a C3-C30 monocyclic or polycyclic hydrocarbon group which may be substituted with at least one selected from a C1-C6 alkyl group, a C1-C6 alkoxy group, a C1-C4 perfluoroalkyl group, a hydroxyl group and a cyano group, and at least one —$CH_2$— in the C3-C30 monocyclic or bicyclic hydrocarbon group may be substituted with —CO—, —O— or —CH(OH)—.

The C3-C30 monocyclic or polycyclic hydrocarbon group may have an alicyclic structure or structures and may have an aromatic group or groups. The C3-C30 monocyclic or polycyclic hydrocarbon group may have a carbon-carbon double bond or bonds.

Examples of the C1-C6 linear or branched chain hydrocarbon group include a methyl, ethyl, n-propyl, isopropyl, n-butyl, isobutyl, sec-butyl, tert-butyl, n-pentyl and n-hexyl group.

Examples of the C3-C30 monocyclic or polycyclic hydrocarbon group include a hydrocarbon group having a cyclobutane ring, a hydrocarbon group having a cyclopentane ring, a hydrocarbon group having a cyclohexane ring, a hydrocarbon group having a cyclooctane ring, a hydrocarbon group having an adamantane ring, a hydrocarbon group having a benzene ring and a hydrocarbon group having a norbornane ring.

Examples of the C1-C6 alkyl group include a methyl, ethyl, n-propyl, isopropyl, n-butyl, isobutyl, sec-butyl, tert-butyl, n-pentyl and n-hexyl group. Examples of the C1-C6 alkoxy group include a methoxy, ethoxy, n-propoxy, isopropoxy, n-butoxy, isobutoxy, sec-butoxy, tert-butoxy, n-pentyloxy and n-hexyloxy group. Examples of the C1-C4 perfluoroalkyl group include a trifluoromethyl, pentafluoroethyl, heptafluoropropyl and nonafluorobutyl group.

Specific examples of the anion part of Salt (V) include the followings.

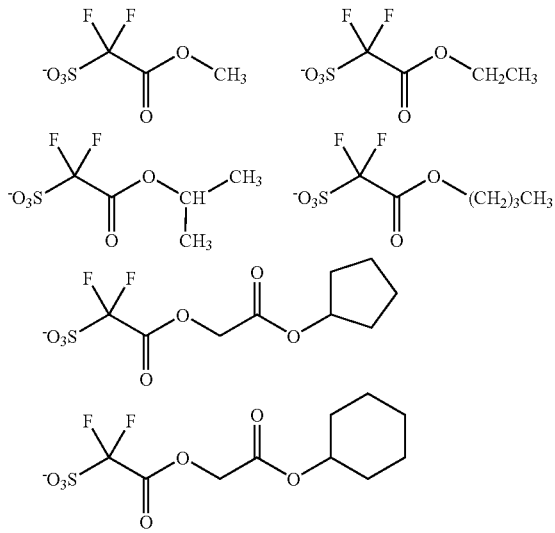

-continued

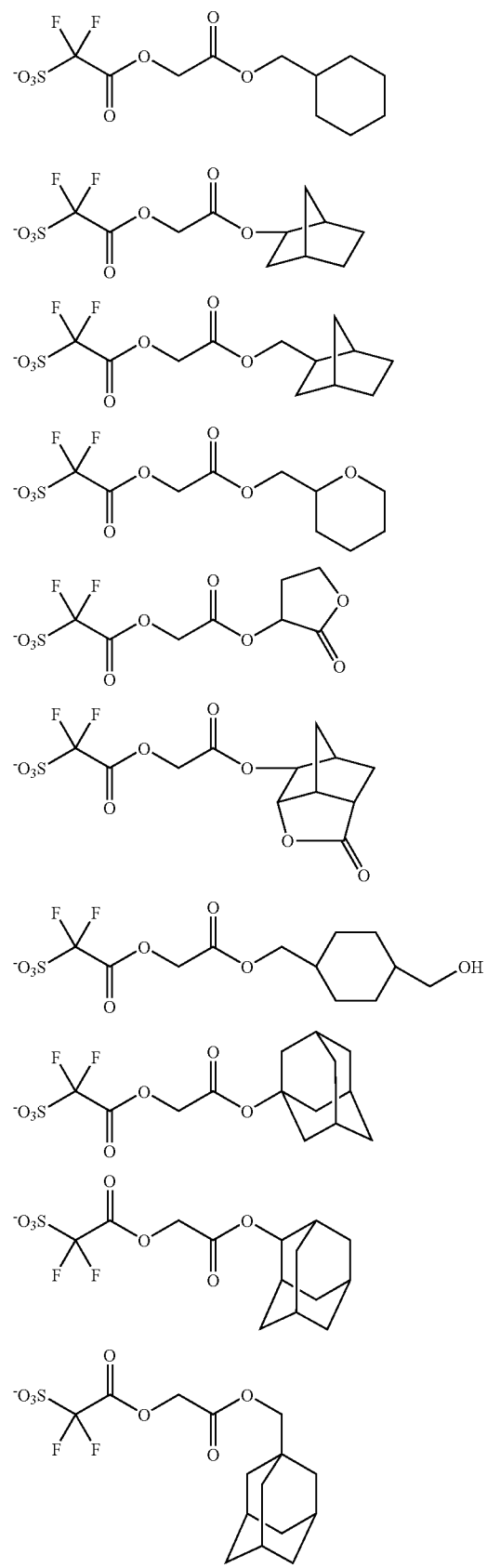

-continued
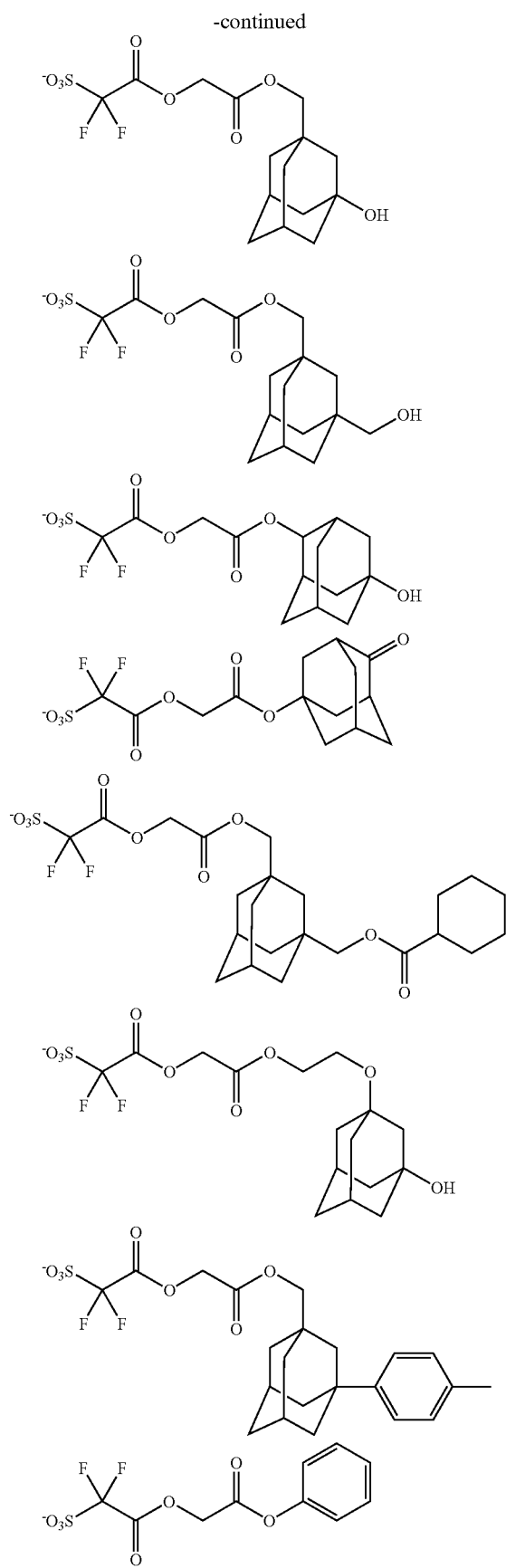
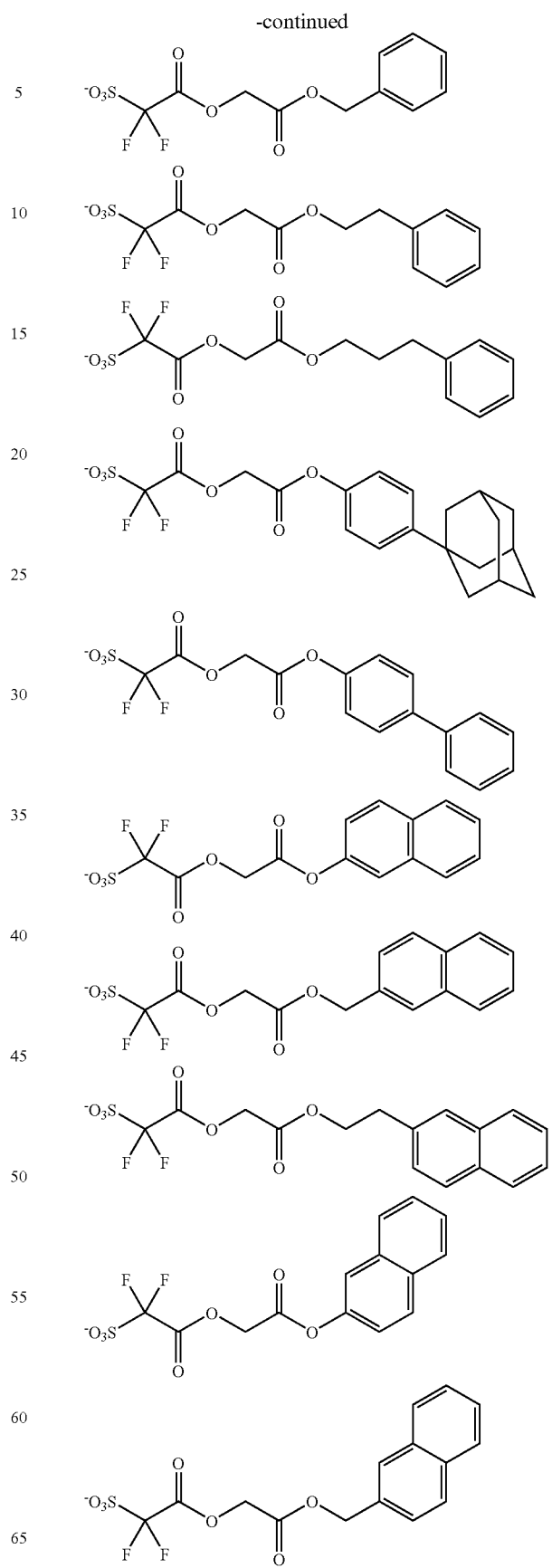

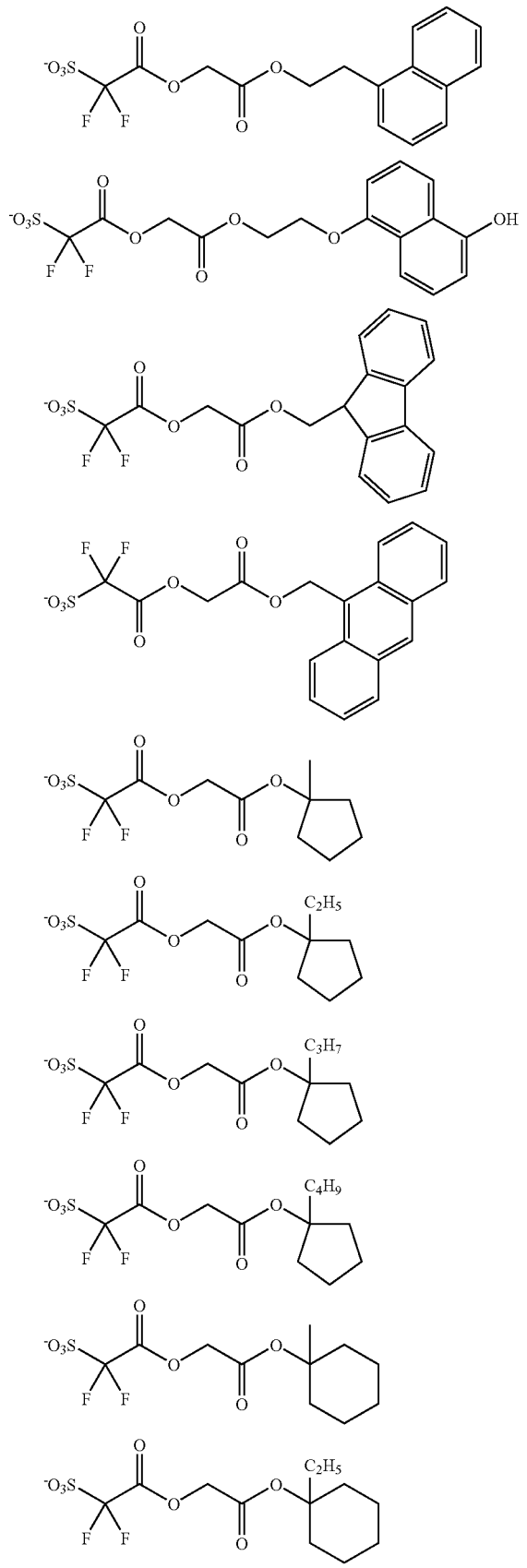
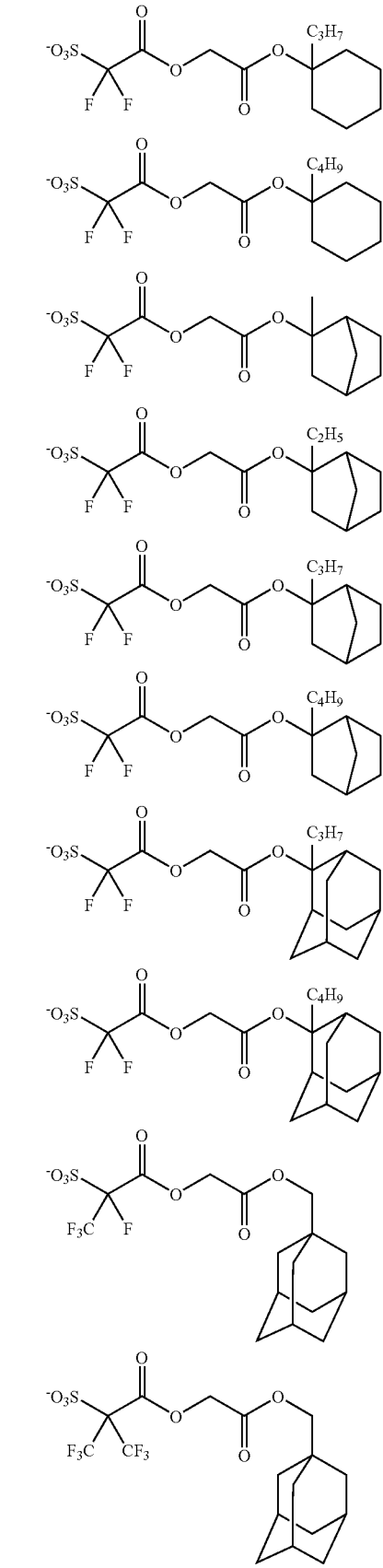

-continued
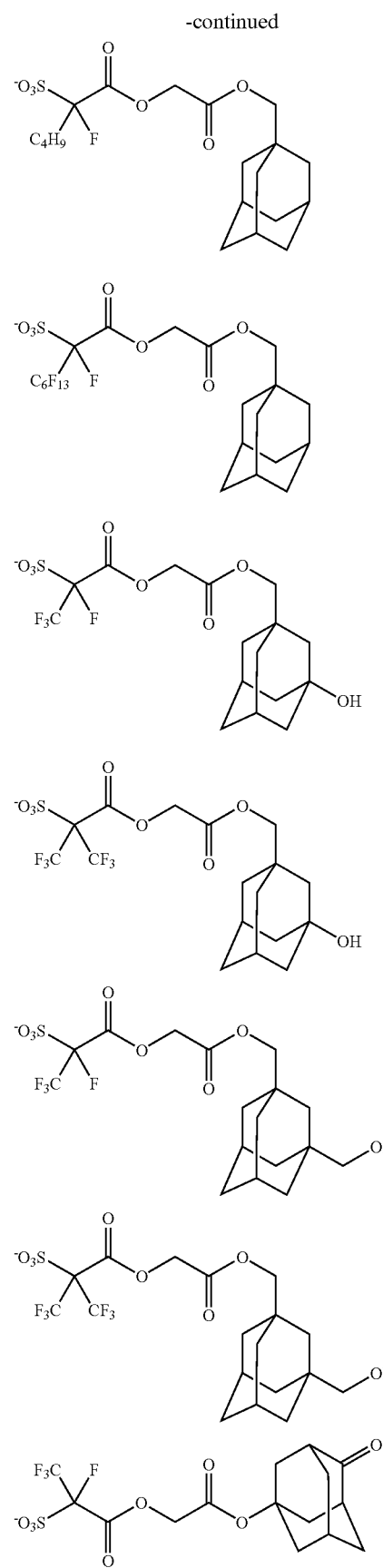
-continued
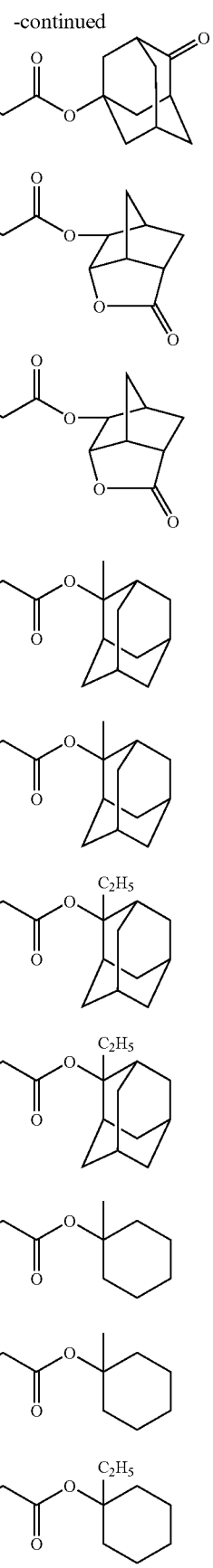

-continued
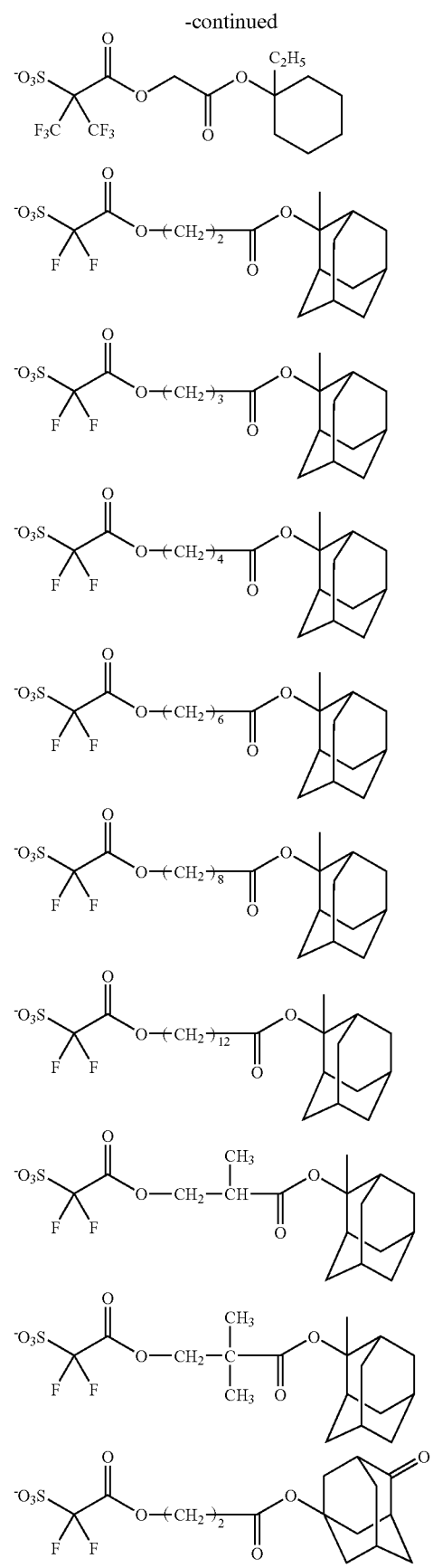
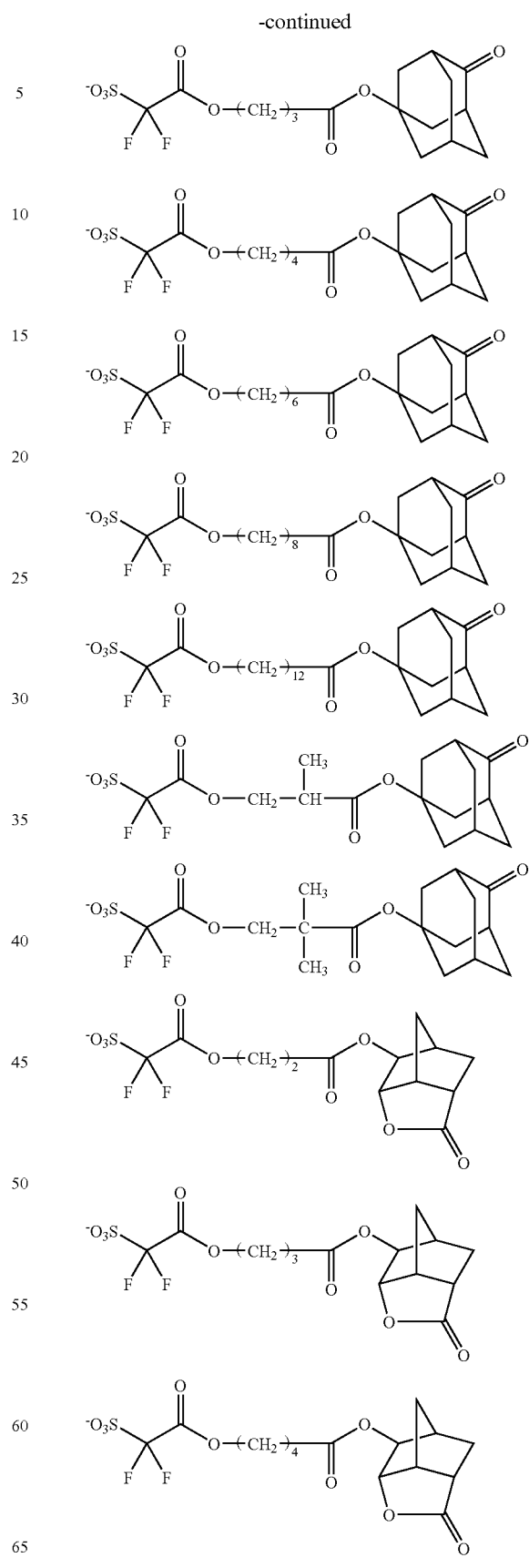

-continued
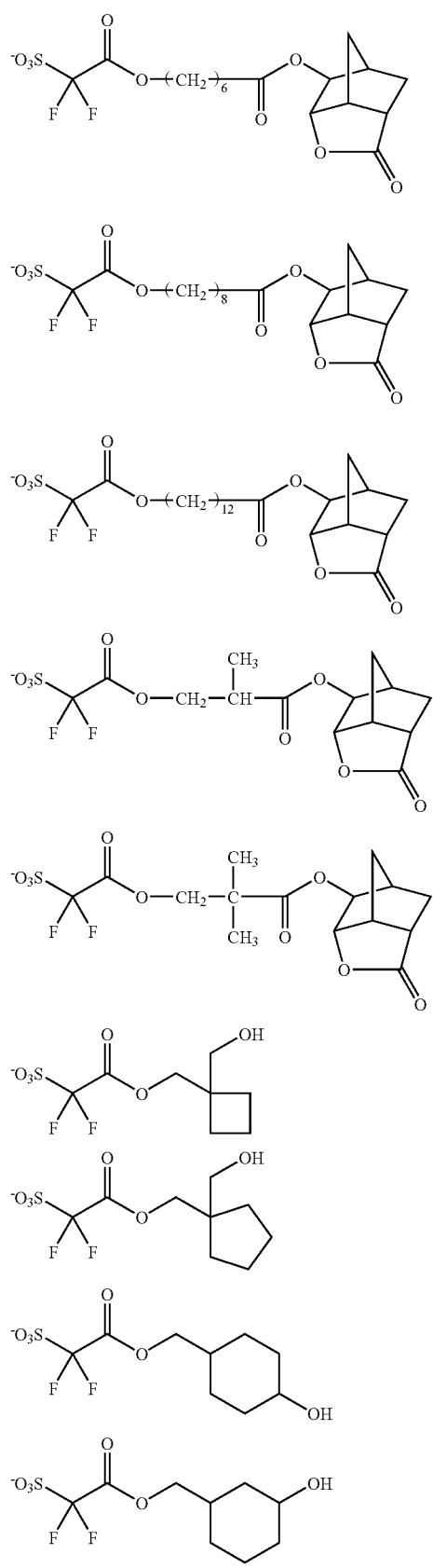
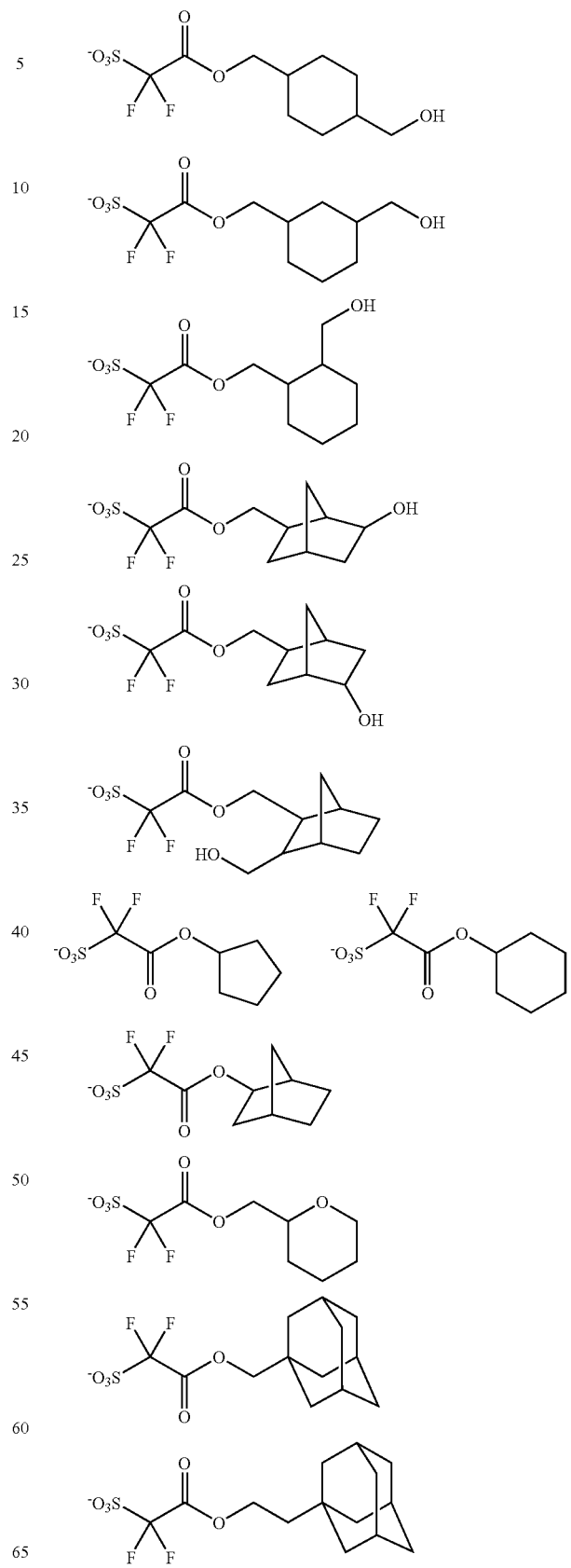

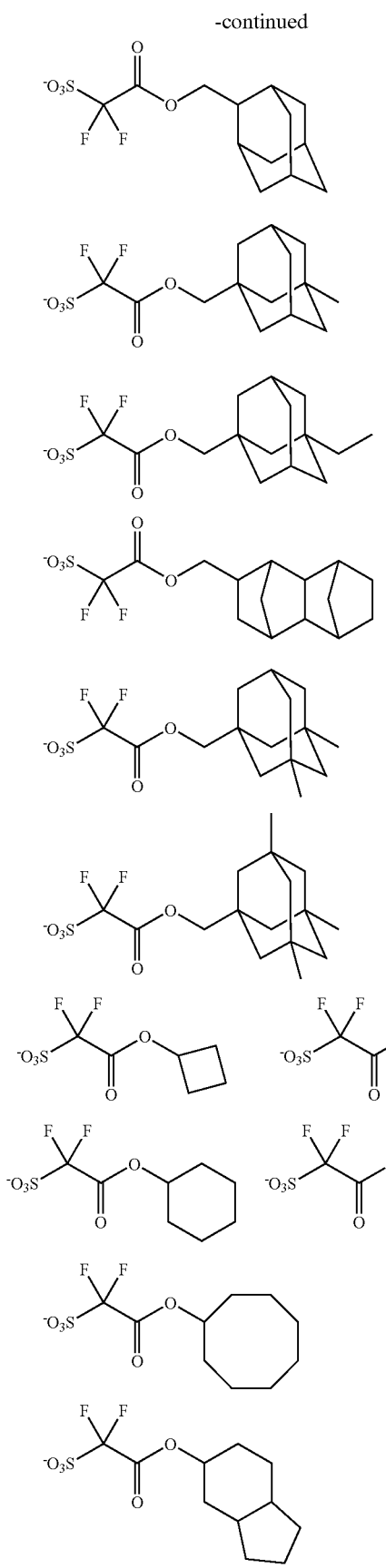
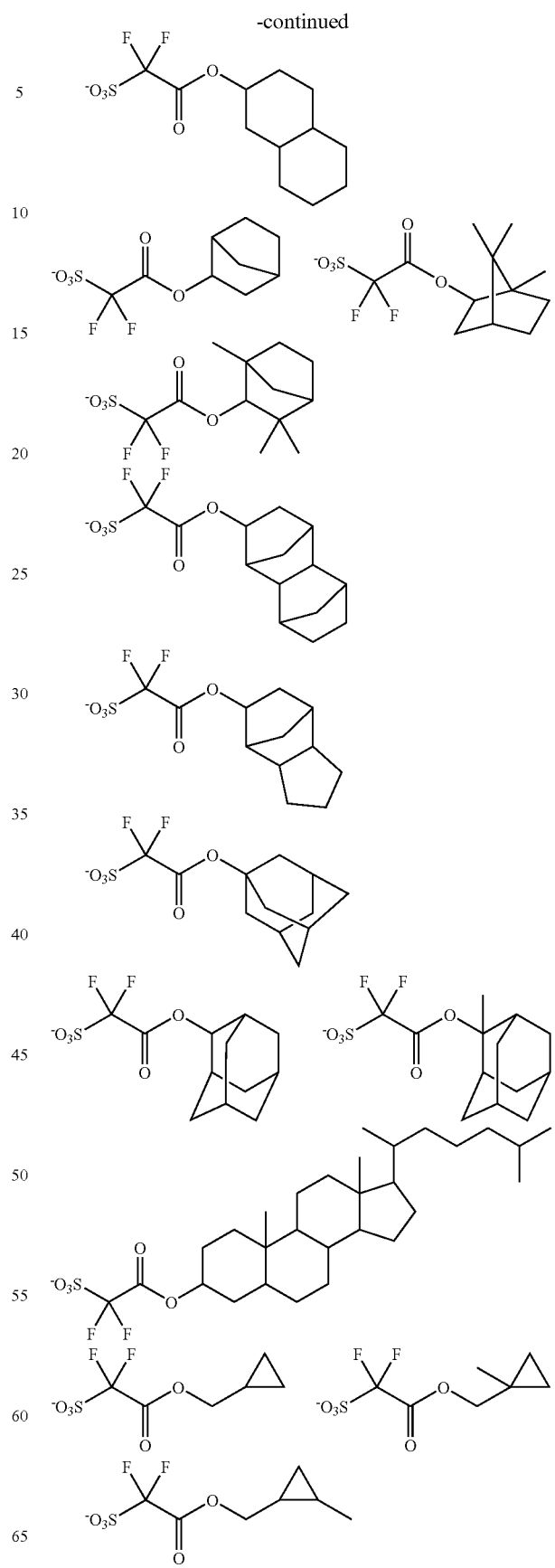

-continued
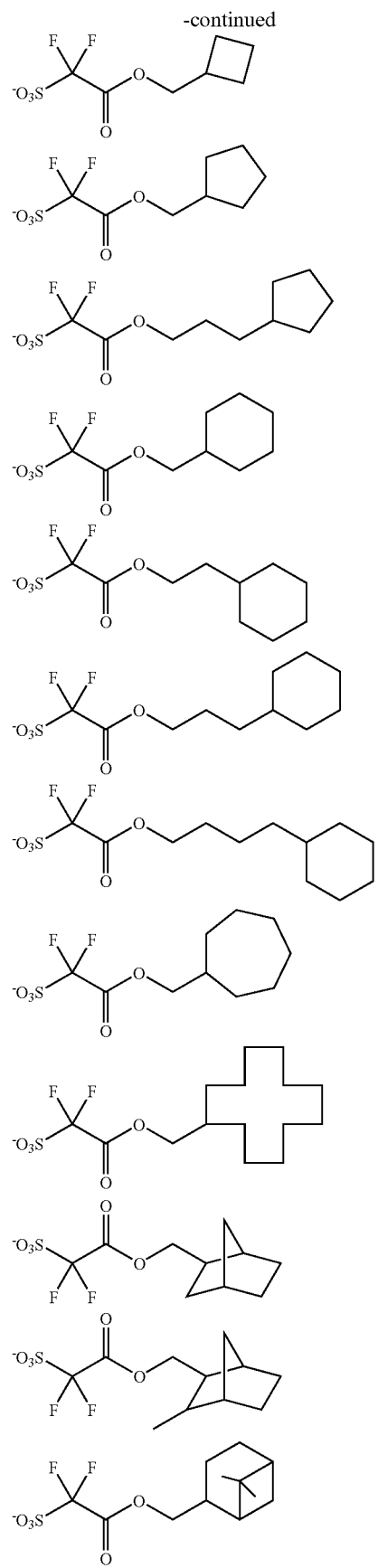
-continued
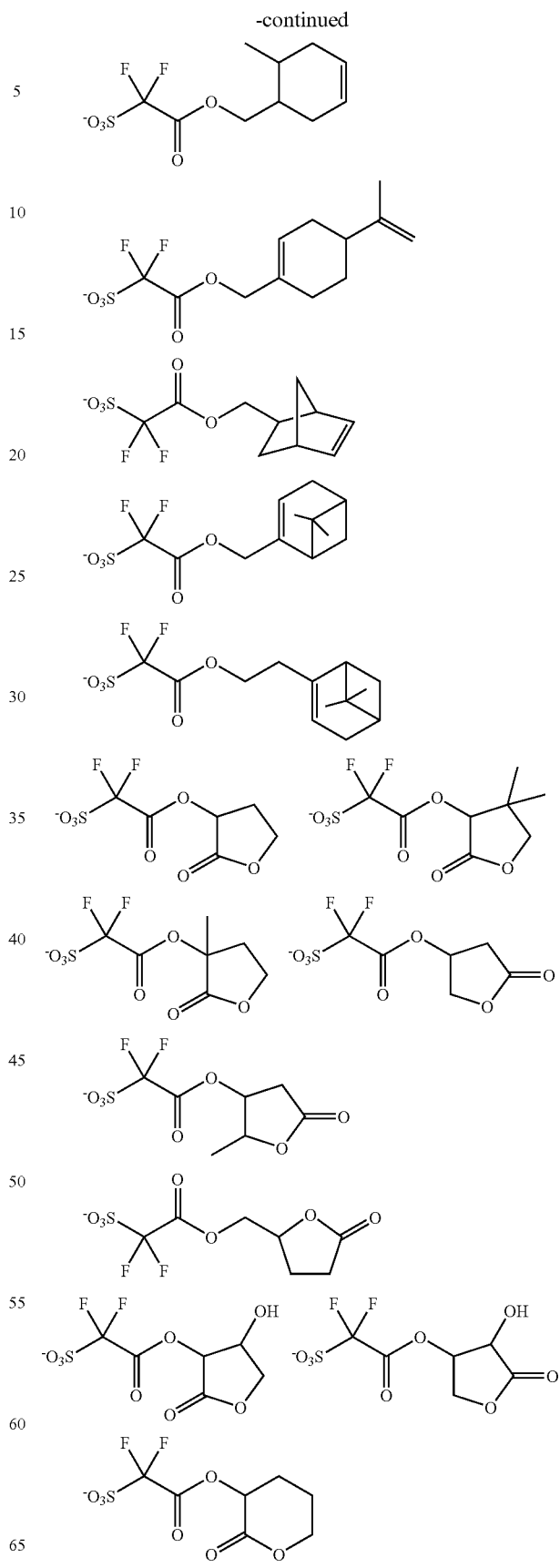

-continued
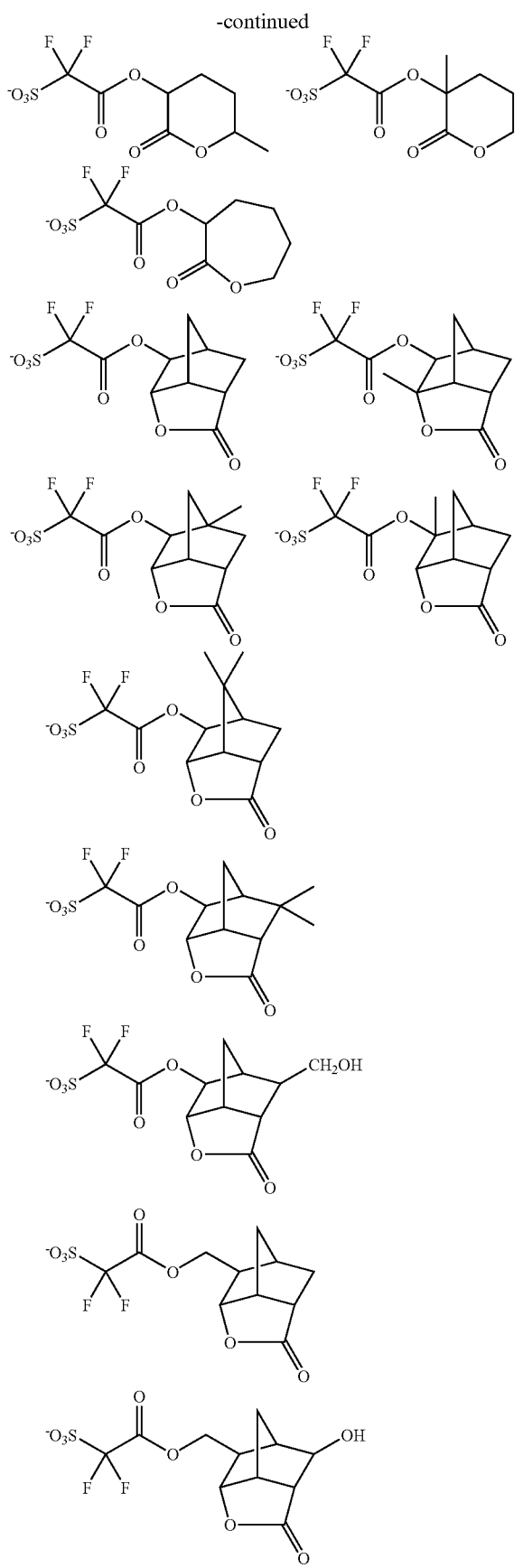
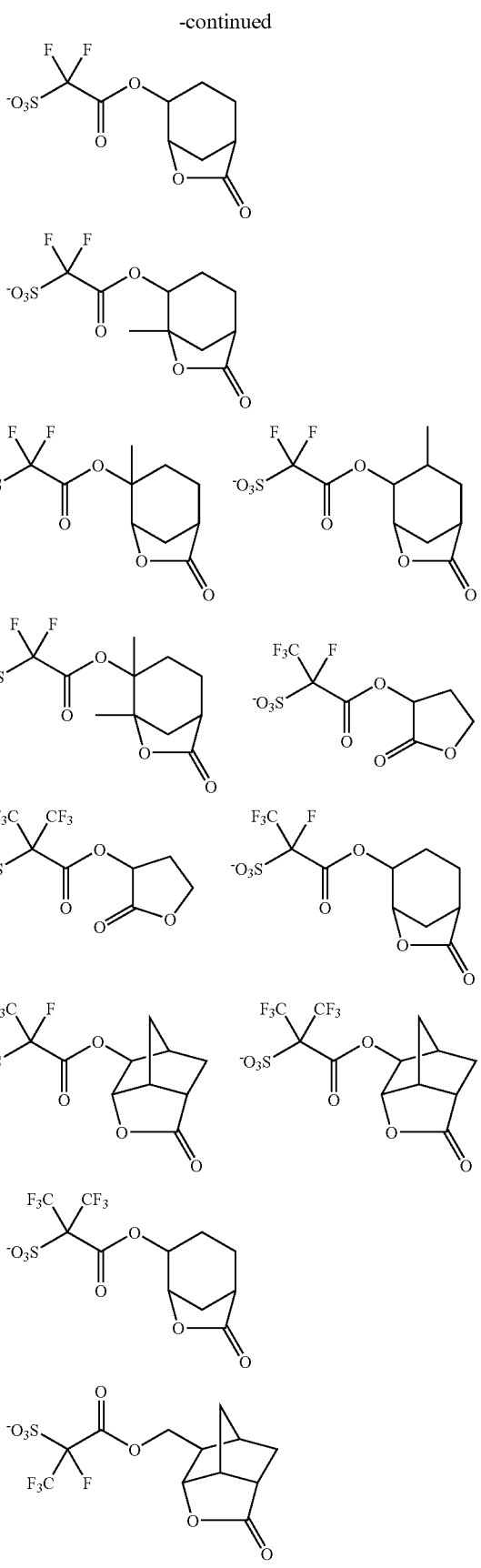

-continued
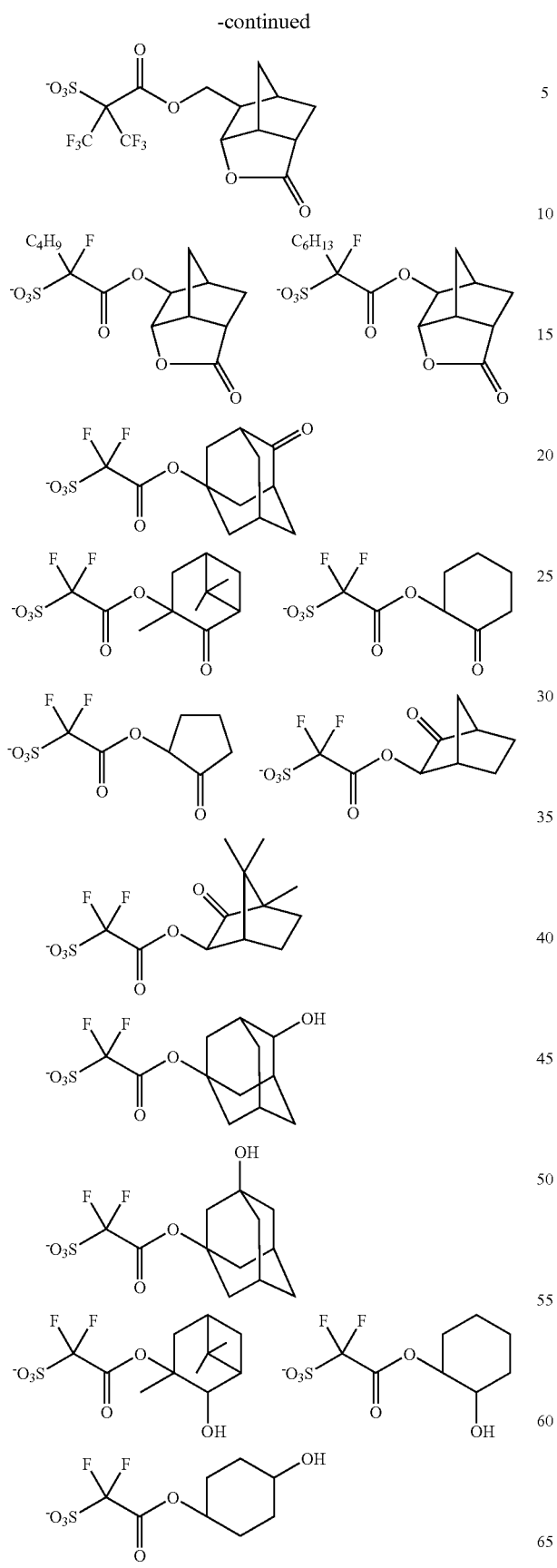
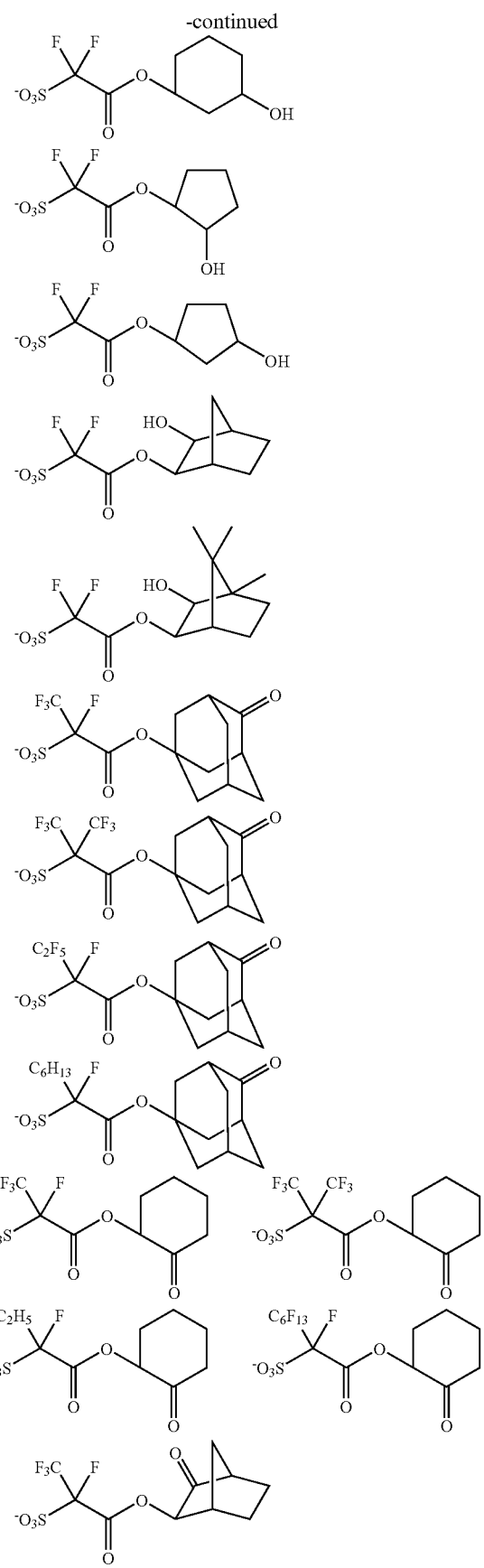

-continued
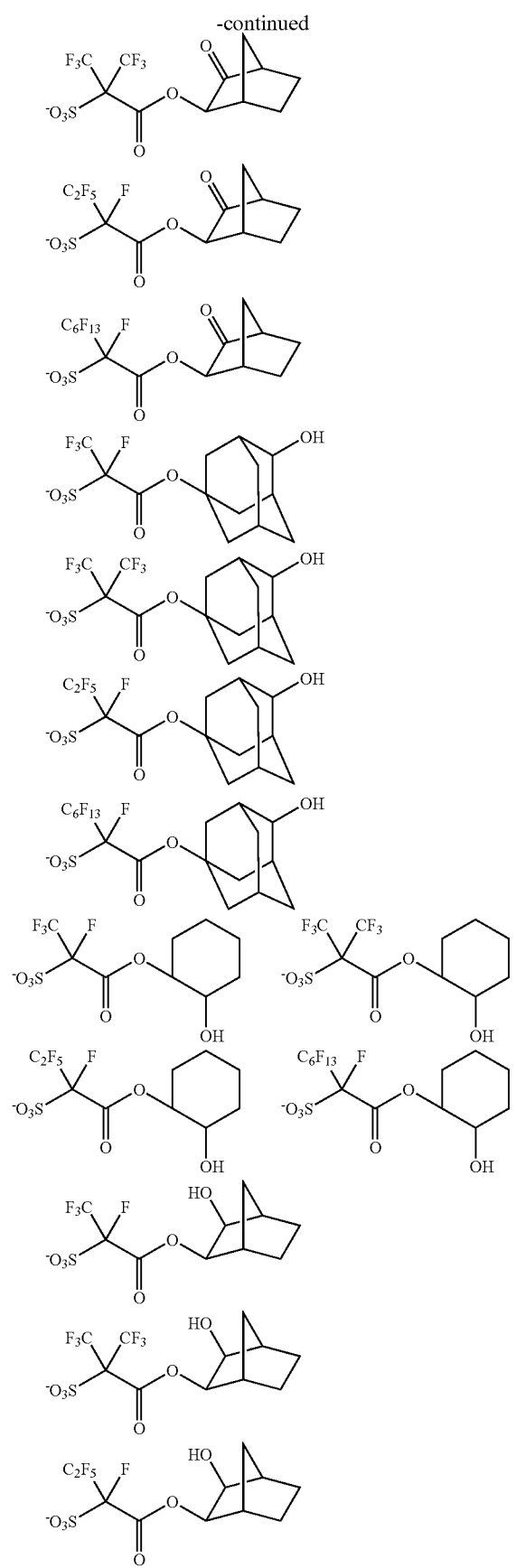
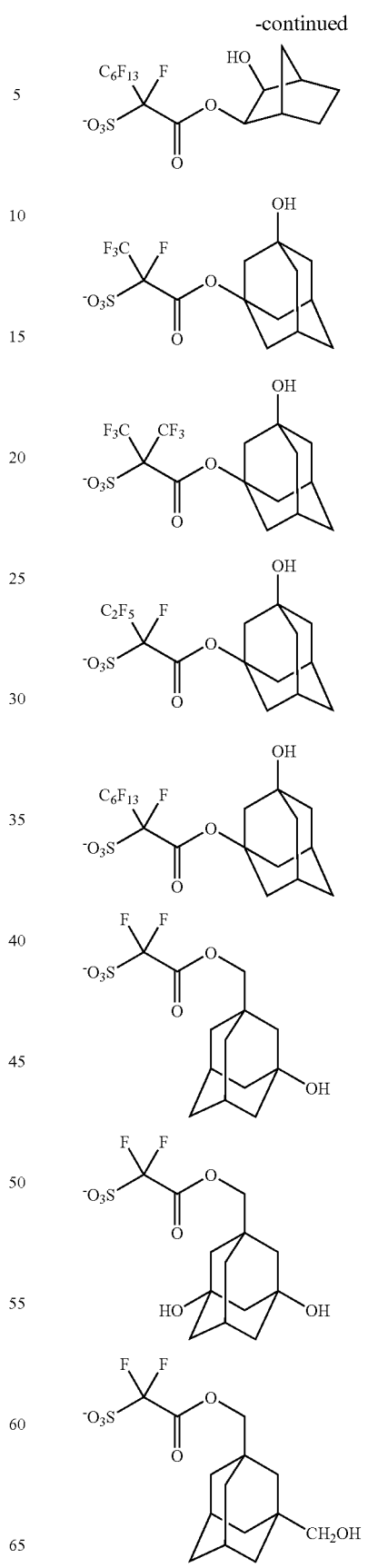

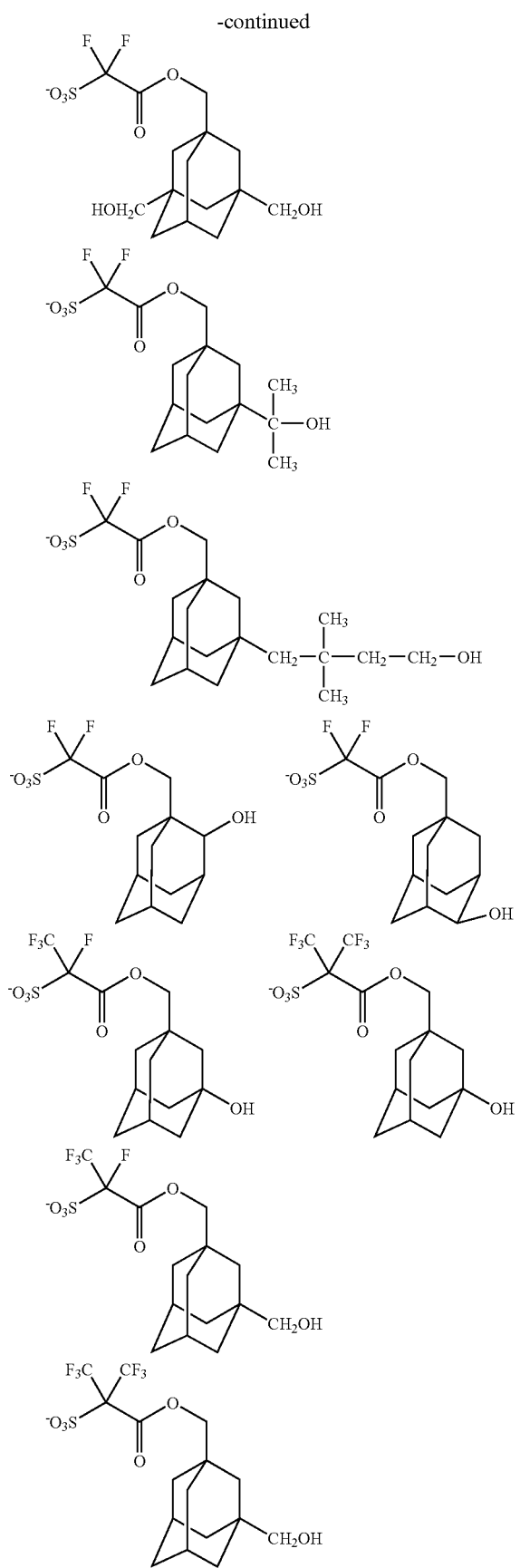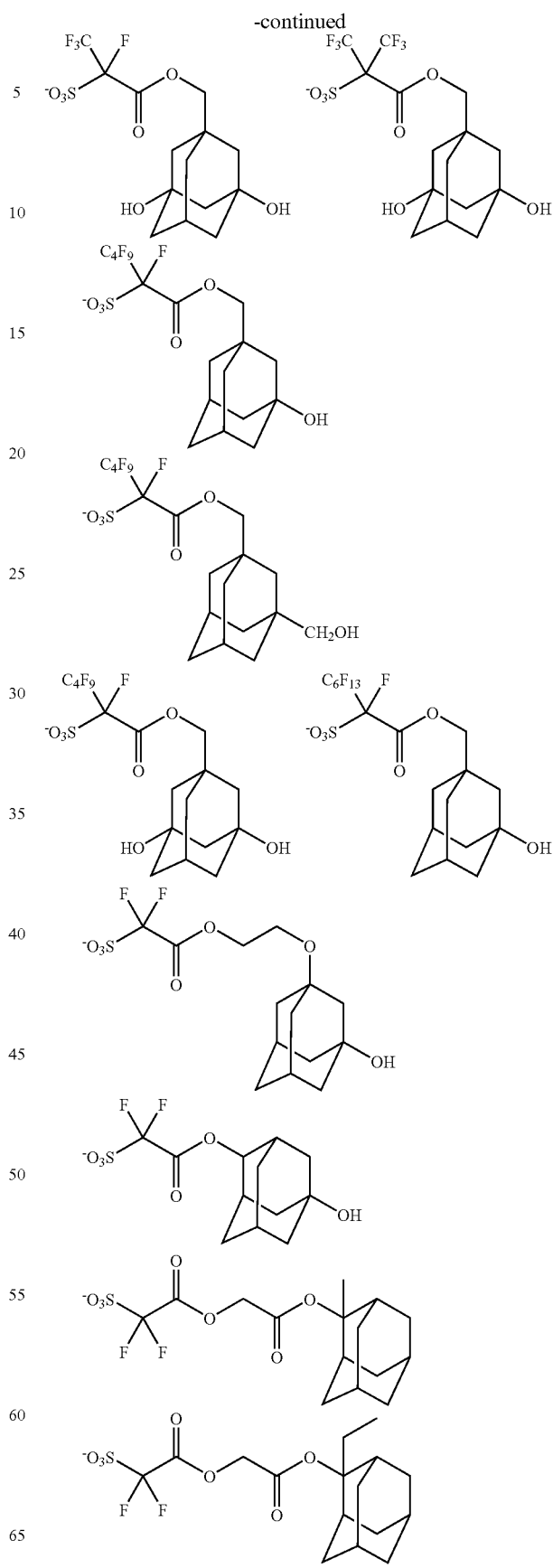

-continued
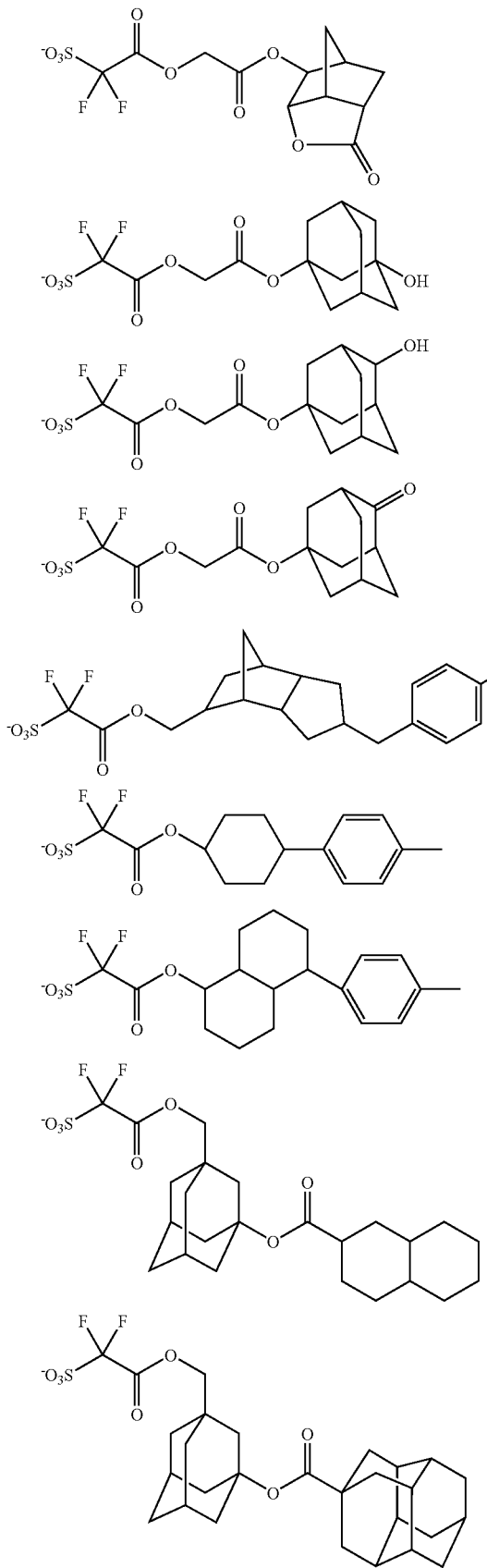
-continued
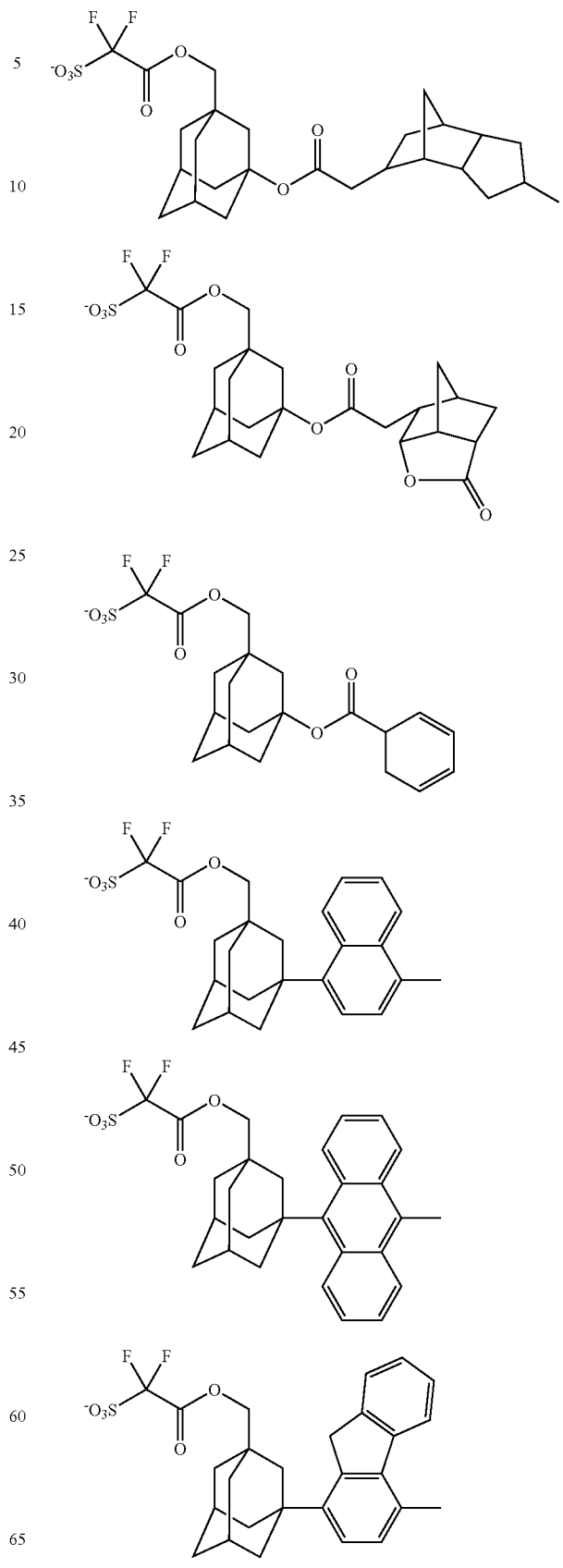

101
-continued
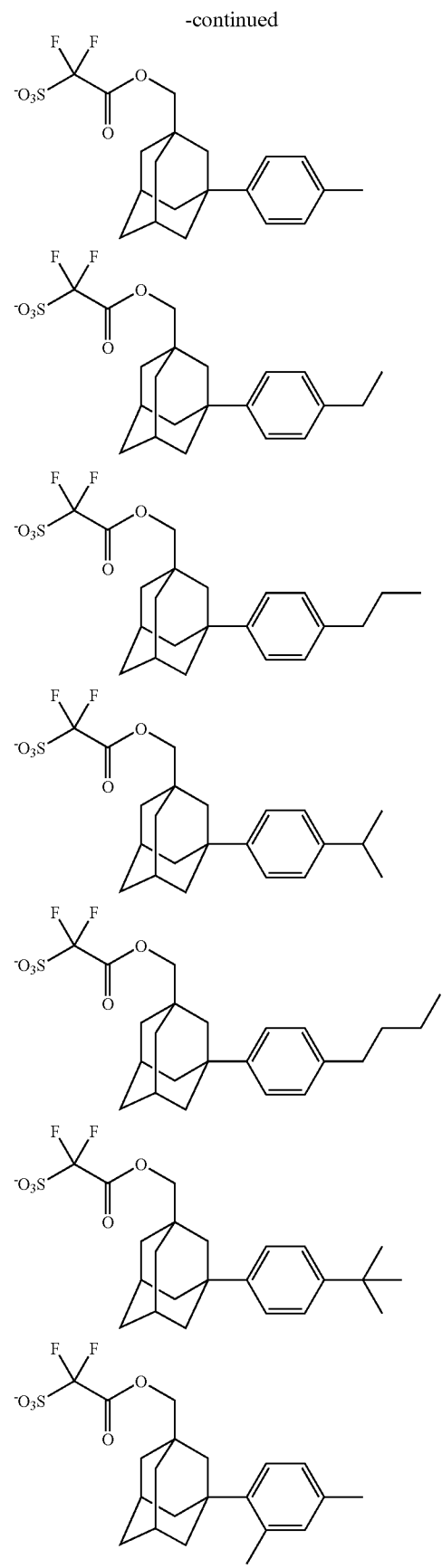
102
-continued
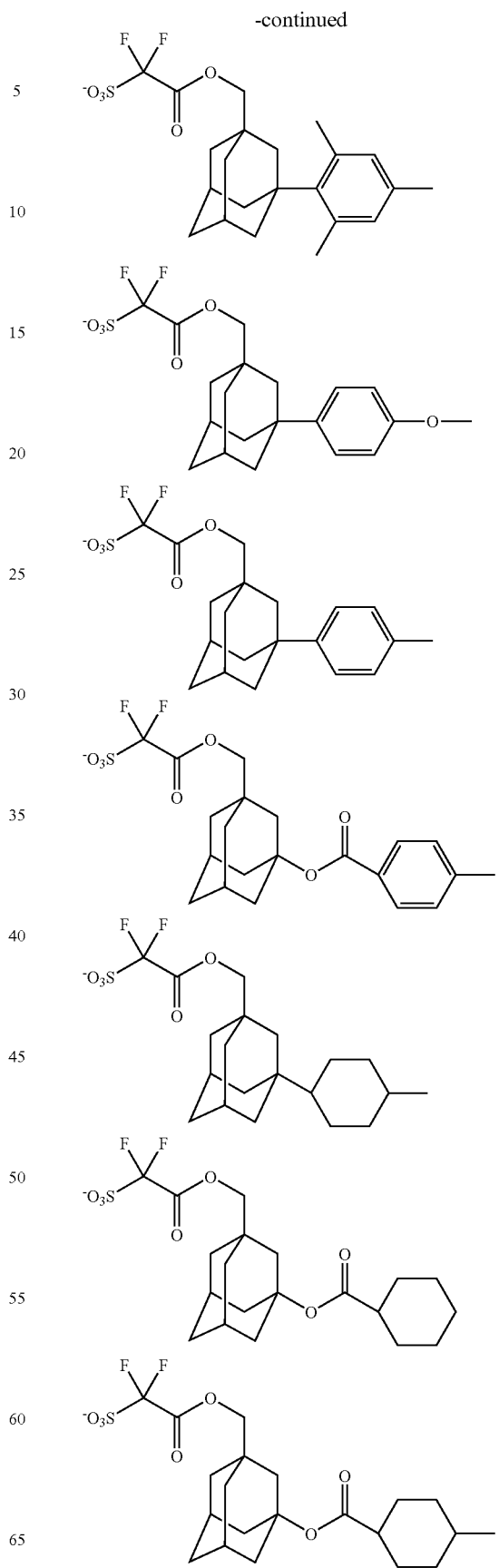

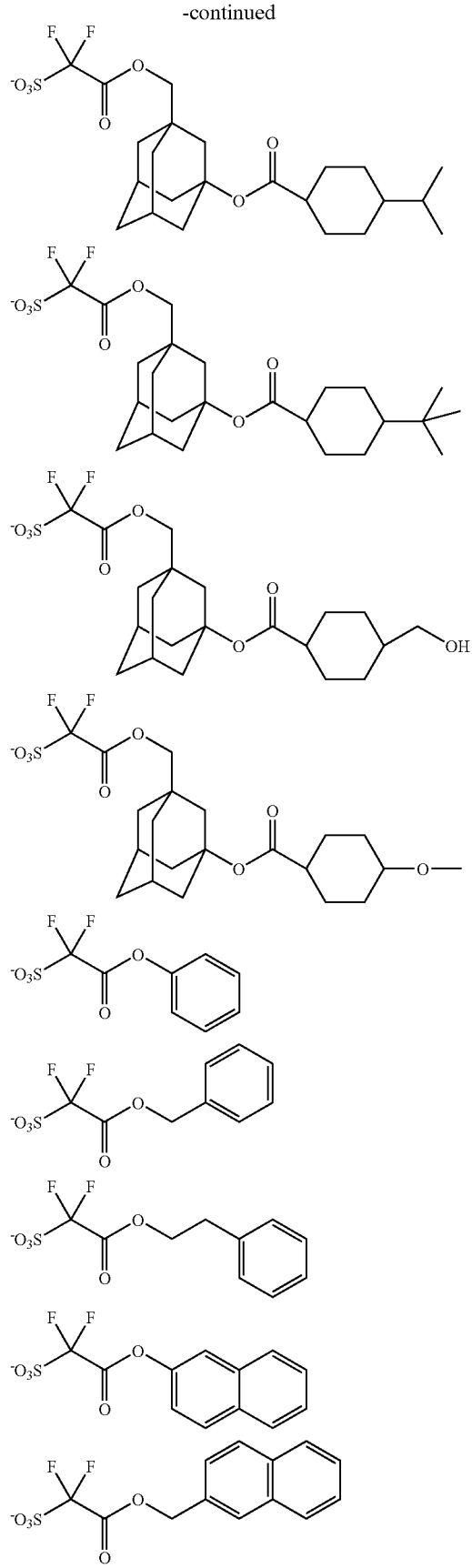
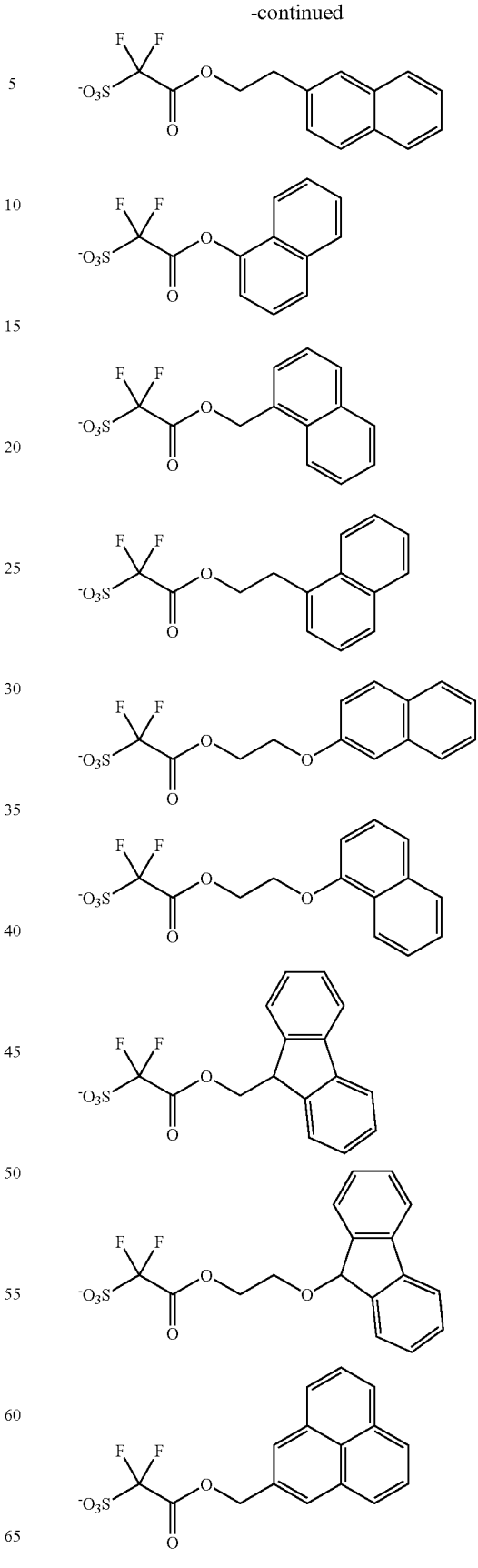

-continued
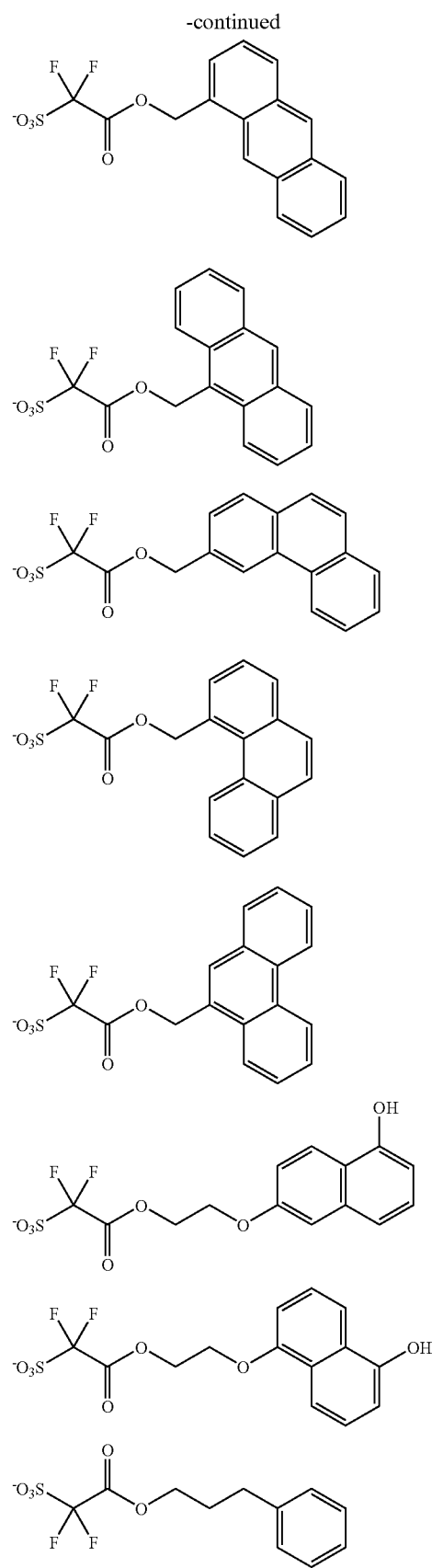
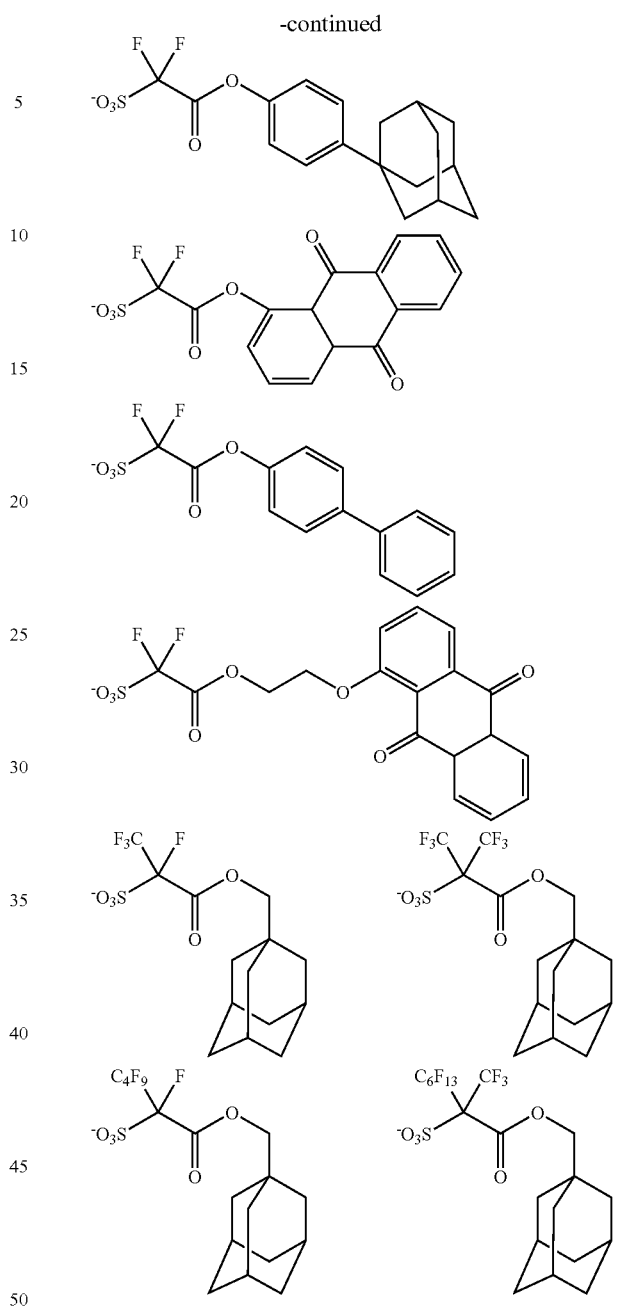
As Salt (V), a salt represented by the formula (VI):
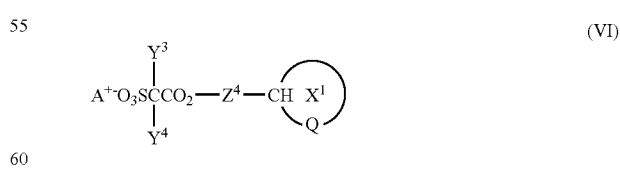
(VI)
(hereinafter, simply referred to as Salt (VI)) is preferable.
In Salt (VI), $Y^3$ and $Y^4$ each independently represent a fluorine atom or a C1-C6 perfluoroalkyl group. Examples of the C1-C6 perfluoroalkyl group include the same groups as described above, and the trifluoromethyl group is preferable.

It is preferable that $Y^3$ and $Y^4$ each independently represent the fluorine atom or the trifluoromethyl group, and it is more preferable that $Y^3$ and $Y^4$ represent the fluorine atoms.

Examples of the C1-C6 alkyl group, the C1-C6 alkoxy group and the C1-C4 perfluoroalkyl group include the same groups as described above, respectively. Examples of the C1-C6 hydroxyalkyl group include a hydroxymethyl, 2-hydroxyethyl, 3-hydroxypropyl, 4-hydroxybutyl and 6-hydroxyhexyl group.

Examples of the C1-C4 alkylene group include a methylene, ethylene, trimethylene and tetramethylene group. It is preferred that $Z^4$ represents the single bond, the methylene group or the ethylene group, and it is more preferred that $Z^4$ represents the single bond or the methylene group.

Examples of the ring $X^1$ include a C4-C8 cycloalkyl group such as a cyclobutyl, cyclopentyl, cyclohexyl and cyclooctyl group, an adamanthyl group, and a norbornyl group, in which a hydrogen atom may be substituted with a hydroxyl group or in which two hydrogen atoms may be substituted with =O, and in which at least one hydrogen atom may be substituted with the C1-C6 alkyl group, the C1-C6 alkoxy group, the C1-C4 perfluoroalkyl group, the C1-C 6 hydroxyalkyl group, the hydroxyl group or the cyano group.

Specific examples of the ring $X^1$ include a 2-oxocyclopentyl group, a 2-oxocyclohexyl group, a 3-oxocyclopentyl group, a 3-oxocyclohexyl group, a 4-oxocyclohexyl group, a 2-hydroxycyclopentyl group, a 2-hydroxycyclohexyl group, a 3-hydroxycyclopentyl group, a 3-hydroxycyclohexyl group, a 4-hydroxycyclohexyl group, a 4-oxo-2-adamantyl group, a 3-hydroxy-1-adamantyl group, a 4-hydroxy-1-adamantyl group, a 5-oxonorbornan-2-yl group, a 1,7,7-trimethyl-2-oxonorbornan-2-yl group, a 3,6,6-trimethyl-2-oxobicyclo[3.1.1]heptan-3-yl group, a 2-hydroxy-norbornan-3-yl group, a 1,7,7-trimethyl-2-hydroxynorbornan-3-yl group, a 3,6,6-trimethyl-2-hydroxybicyclo[3.1.1]heptan-3-yl group, and the following groups (in the following formulae, straight line with an open end shows a bond which is extended from an adjacent group).

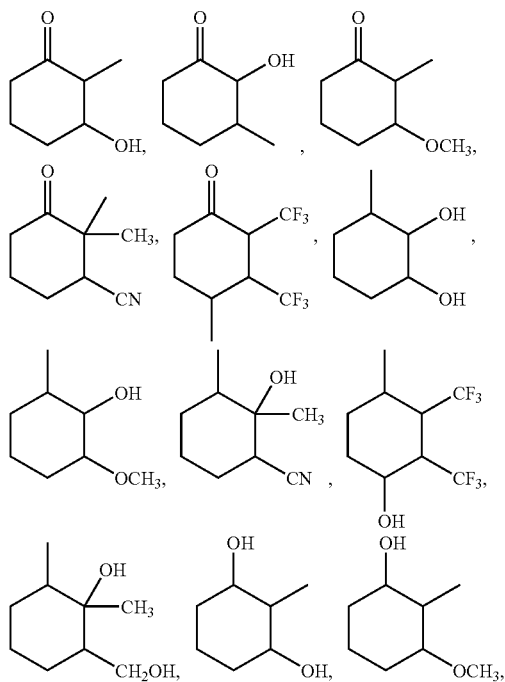

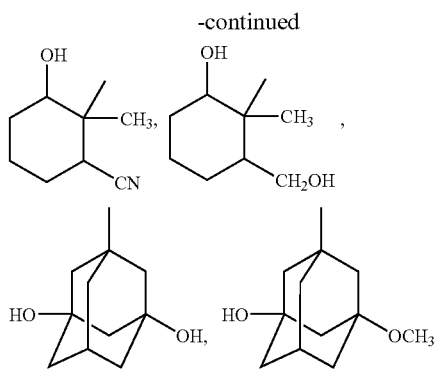

Specific examples of the anion part of Salt (VI) include the followings.

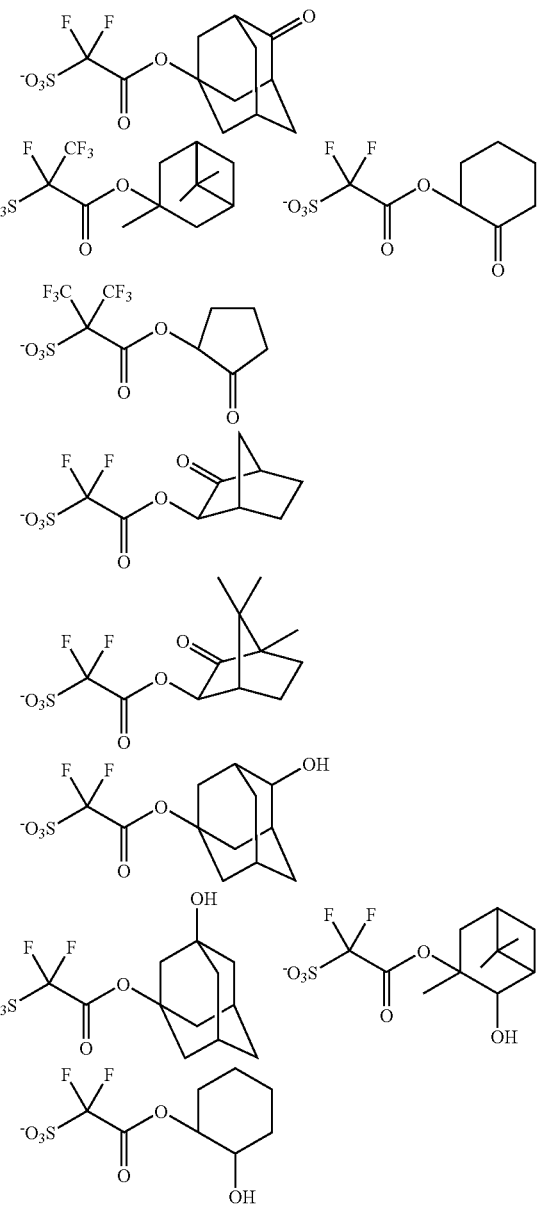

-continued

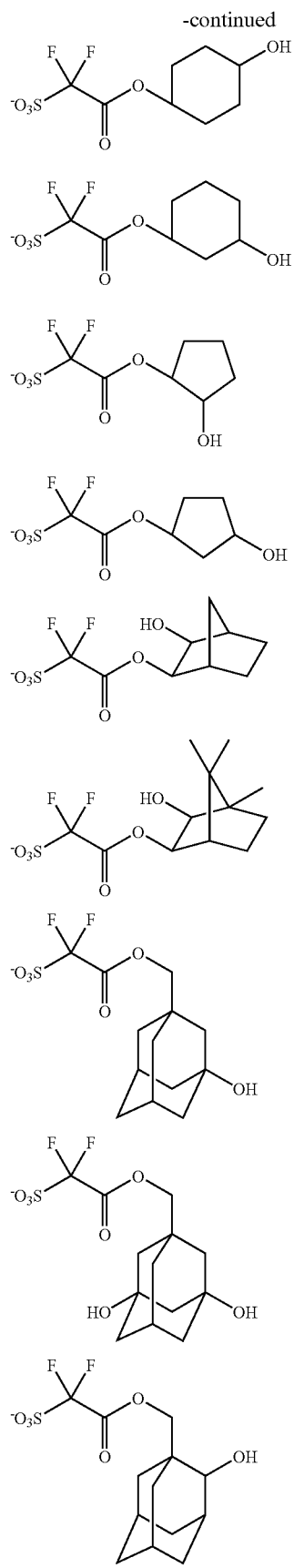

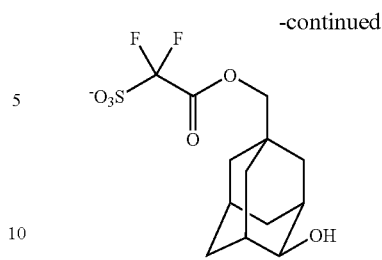

As the acid generator, a salt represented by the formula (VIII):

$$A^+ {}^-O_3S-R^{22} \quad \text{(VIII)}$$

(hereinafter, simply referred to as Salt (VIII)) is also exemplified.

In Salt (VIII), $R^{22}$ represents a C1-C8 linear or branched chain perfluoroalkyl group and $A^+$ represents an organic counter ion.

Examples of the C1-C8 linear or branched chain perfluoroalkyl group include a trifluoromethyl, pentafluoroethyl, heptafluoropropyl, nonafluorobutyl, tetradecafluorohexyl and heptadecafluorooctyl group.

Specific examples of the anion part of Salt (VIII) include the followings.

$$CF_3-SO_3^-$$

$$CF_3CF_2CF_2-SO_3^-$$

$$CF_3CF_2CF_2CF_2-SO_3^-$$

$$CF_3CF_2CF_2CF_2CF_2CF_2-SO_3^-$$

$$CF_3CF_2CF_2CF_2CF_2CF_2CF_2CF_2-SO_3^-$$

In Salt (V), Salt (VI) and Salt (VIII), $A^+$ represents an organic counter ion. Examples of the organic counter ion include a cation represented by the formula (IXa):

(IXa)

wherein $P^1$, $P^2$ and $P^3$ each independently represent a C1-C30 linear or branched chain alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group (hereinafter, simply referred to as the cation (IXa)), a cation represented by the formula (IXb):

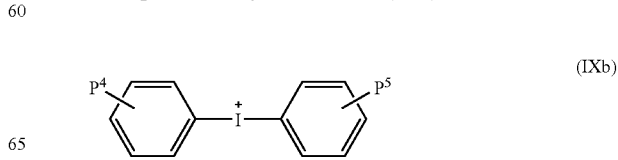

(IXb)

wherein P⁴ and P⁵ each independently represent a hydrogen atom, a hydroxyl group, a C1-C12 alkyl group or a C1-C12 alkoxy group (hereinafter, simply referred to as the cation (IXb)), a cation represented by the formula (IXc):

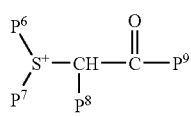

(IXc)

wherein P⁶ and P⁷ each independently represent a C1-C12 alkyl group or a C3-C12 cycloalkyl group, or P⁶ and P⁷ are bonded to form a C3-C12 divalent acyclic hydrocarbon group which forms a ring together with the adjacent S⁺, and at least one —CH₂— in the divalent acyclic hydrocarbon group may be substituted with —CO—, —O— or —S—, P⁸ represents a hydrogen atom, P⁹ represents a C1-C12 alkyl group, a C3-C12 cycloalkyl group or an aromatic group which may be substituted, or P⁸ and P⁹ are bonded to form a divalent acyclic hydrocarbon group which forms a 2-oxocycloalkyl group together with the adjacent —CHCO—, and at least one —CH₂— in the divalent acyclic hydrocarbon group may be replaced with —CO—, —O— or —S— (hereinafter, simply referred to as the cation (IXc)); and a cation represented by the formula (IXd):

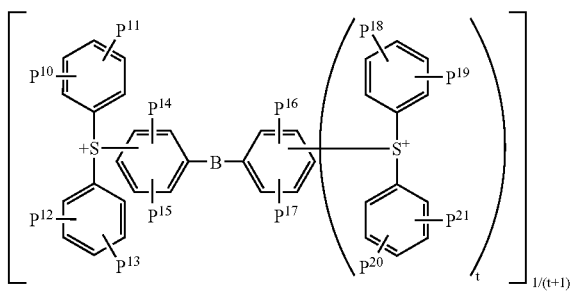

(IXd)

wherein P¹⁰, P¹¹, P¹², P¹³, P¹⁴, P¹⁵, P¹⁶, P¹⁷, P¹⁸, P¹⁹, P²⁰ and P²¹ each independently represent a hydrogen atom, a hydroxyl group, a C1-C12 alkyl group or a C1-C12 alkoxy group, B represents a sulfur or oxygen atom and t represents 0 or 1 (hereinafter, simply referred to as the cation (IXd)).

Examples of the C1-C12 alkoxy group in the cations (IXa), (IXb) and (IXd) include a methoxy, ethoxy, n-propoxy, isopropoxy, n-butoxy, isobutoxy, sec-butoxy, tert-butoxy, n-pentyloxy, n-hexyloxy, n-octyloxy and 2-ethylhexyloxy group.

Examples of the C3-C12 cyclic hydrocarbon group in the cation (IXa) include a cyclopentyl, cyclohexyl, 1-adamantyl, 2-adamantyl, phenyl, 2-methylphenyl, 4-methylphenyl, 1-naphthyl and 2-naphthyl group.

Examples of the C1-C30 alkyl group which may be substituted with at least one selected from the hydroxyl group, the C3-C12 cyclic hydrocarbon group and the C1-C12 alkoxy group in the cation (IXa) include a methyl, ethyl, n-propyl, isopropyl, n-butyl, isobutyl, sec-butyl, tert-butyl, n-pentyl, n-hexyl, n-octyl, 2-ethylhexyl and benzyl group.

Examples of the C3-C30 cyclic hydrocarbon group which may be substituted with at least one selected from the hydroxyl group and the C1-C12 alkoxy group in the cation (IXa) include a cyclopentyl, cyclohexyl, 1-adamantyl, 2-adamantyl, bicyclohexyl, phenyl, 2-methylphenyl, 4-methylphenyl, 4-ethylphenyl, 4-isopropylphenyl, 4-tert-butylphenyl, 2,4-dimethylphenyl, 2,4,6-trimethylphenyl, 4-n-hexylphenyl, 4-n-octylphenyl, 1-naphthyl, 2-naphthyl, fluorenyl, 4-phenylphenyl, 4-hydroxyphenyl, 4-methoxyphenyl, 4-tert-butoxyphenyl, 4-n-hexyloxyphenyl group.

Examples of the C1-C12 alkyl group in the cations (IXb), (IXc) and (IXd) include a methyl, ethyl, n-propyl, isopropyl, n-butyl, isobutyl, sec-butyl, tert-butyl, n-pentyl, n-hexyl, n-octyl and 2-ethylhexyl group.

Examples of the C3-C12 cycloalkyl group in the cation (IXc) include a cyclopropyl, cyclobutyl, cyclopentyl, cyclohexyl, cycloheptyl, cyclooctyl and cyclodecyl group. Examples of the C3-C12 divalent acyclic hydrocarbon group formed by bonding P⁶ and P⁷ include a trimethylene, tetramethylene, pentamethylene group. Examples of the ring group formed together with the adjacent S⁺ and the divalent acyclic hydrocarbon group include a tetramethylenesulfonio, pentamethylenesulfonio and oxybisethylenesulfonio group.

Examples of the aromatic group in the cation (IXc) include a phenyl, tolyl, xylyl, 4-n-butylphenyl, 4-isobutylphenyl, 4-tert-butylphenyl, 4-cyclohexylphenyl, 4-phenylphenyl and naphthyl group. The aromatic group may be substituted, and the examples of the substituents include a C1-C6 alkoxy group such as a methoxy, ethoxy, n-propoxy, n-butoxy, tert-butoxy and n-hexyloxy group; a C2-C12 acyloxy group such as an acetyloxy and 1-adamantylcarbonyloxy group; and a nitro group.

Examples of the divalent acyclic hydrocarbon group formed by bonding P⁸ and P⁹ include a methylene, ethylene, trimethylene, tetramethylene and pentamethylene group and examples of the 2-oxocycloalkyl group formed together with the adjacent —CHCO— and the divalent acyclic hydrocarbon group include a 2-oxocyclopentyl and 2-oxocyclohexyl group.

Examples of the cation (IXa) include the followings:

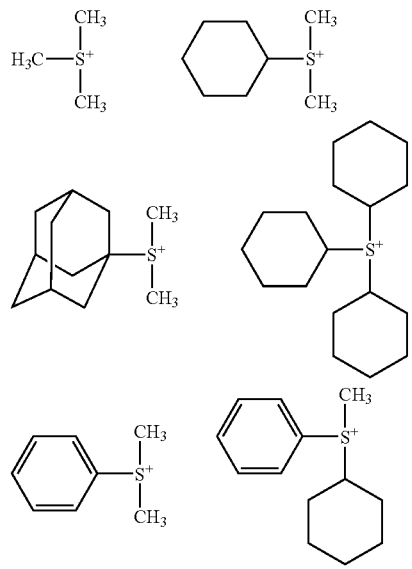

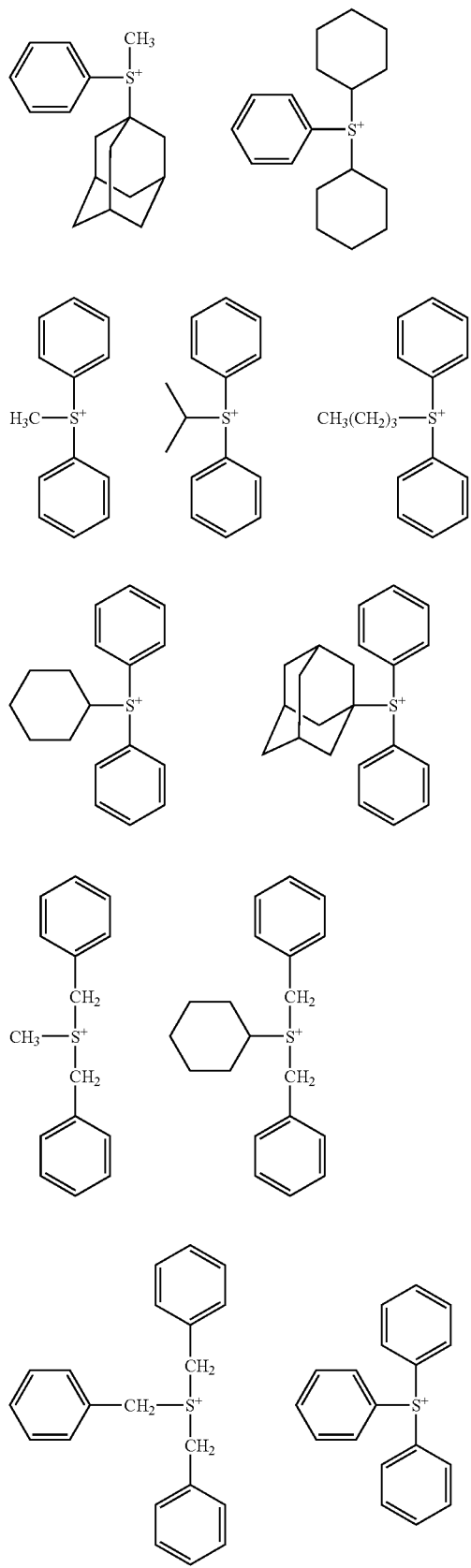

-continued
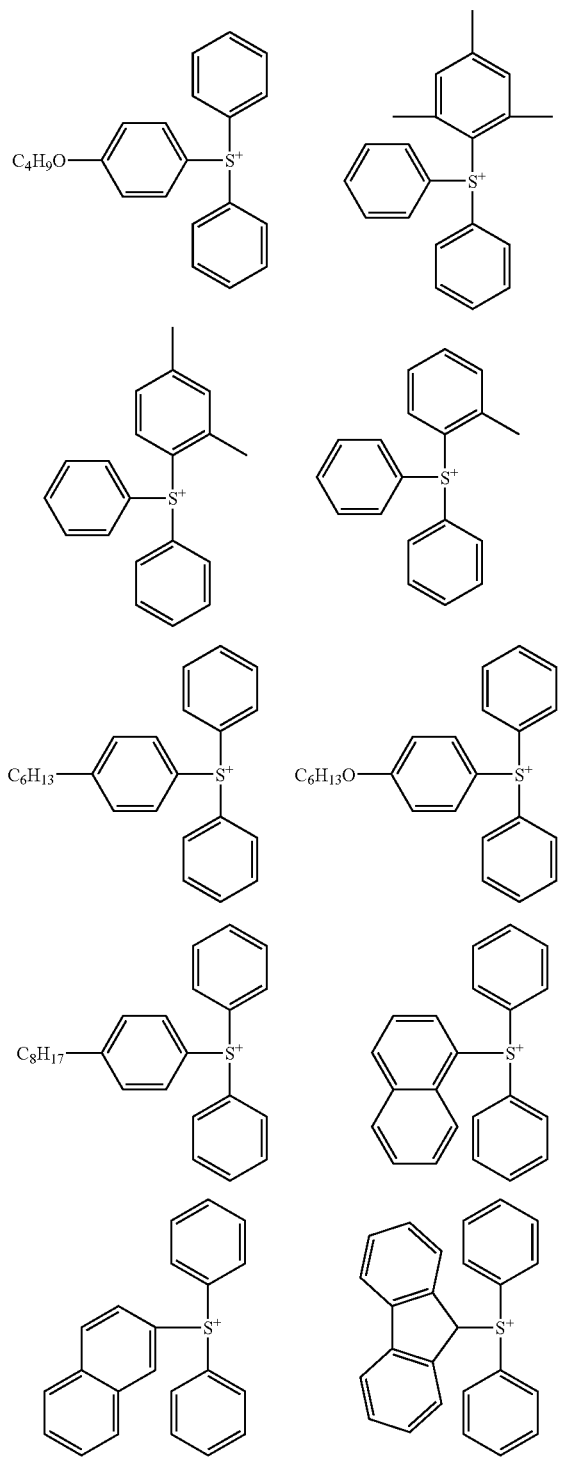
Specific examples of the cation (IXb) include the following:
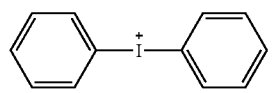
-continued
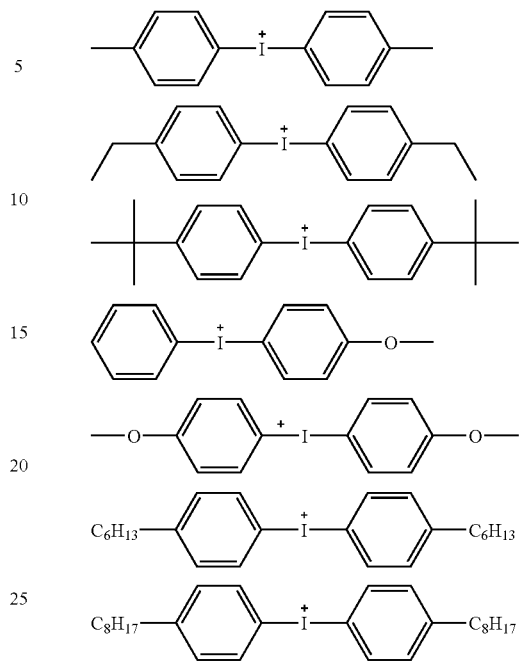
Specific examples of the cation (IXc) include the following:
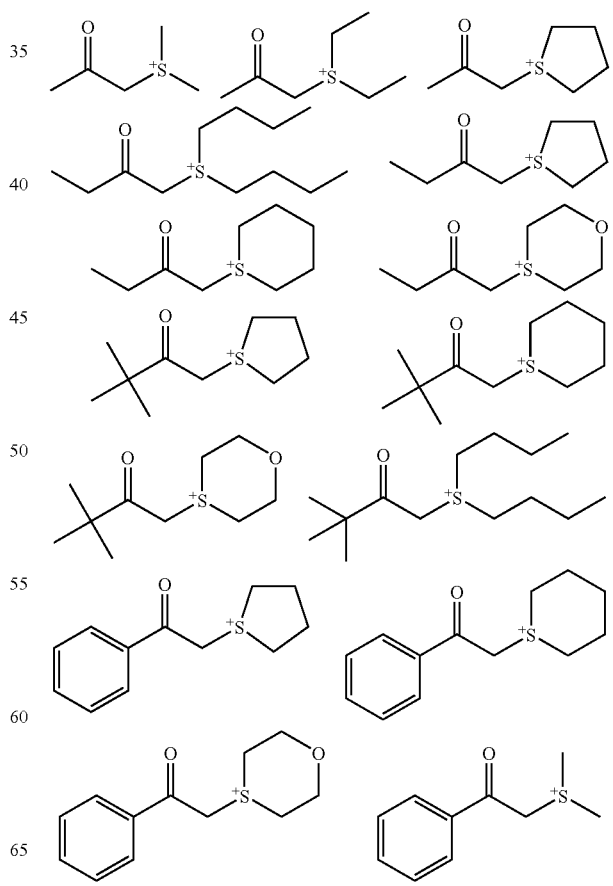

-continued
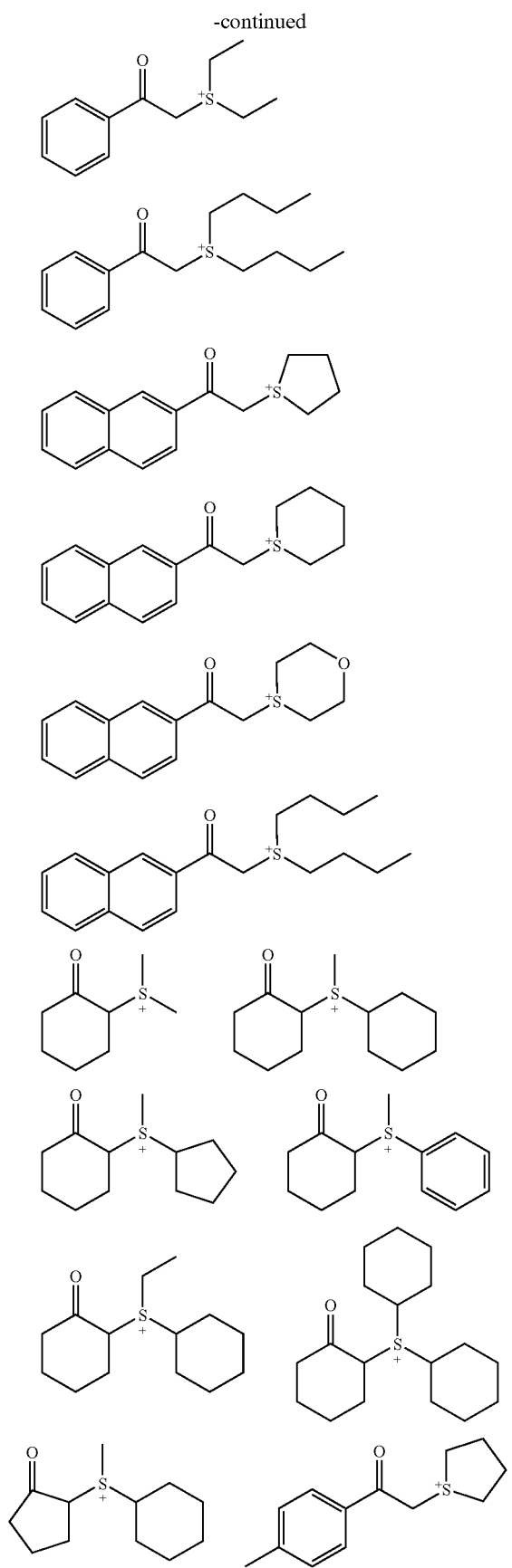
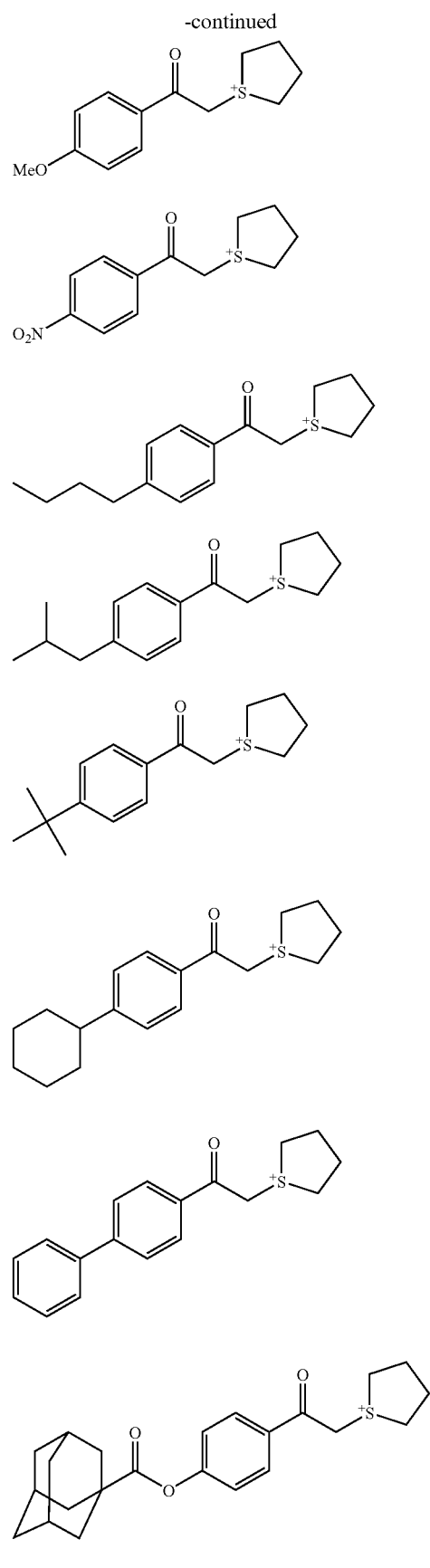

Specific examples of the cation (IXd) include the following:
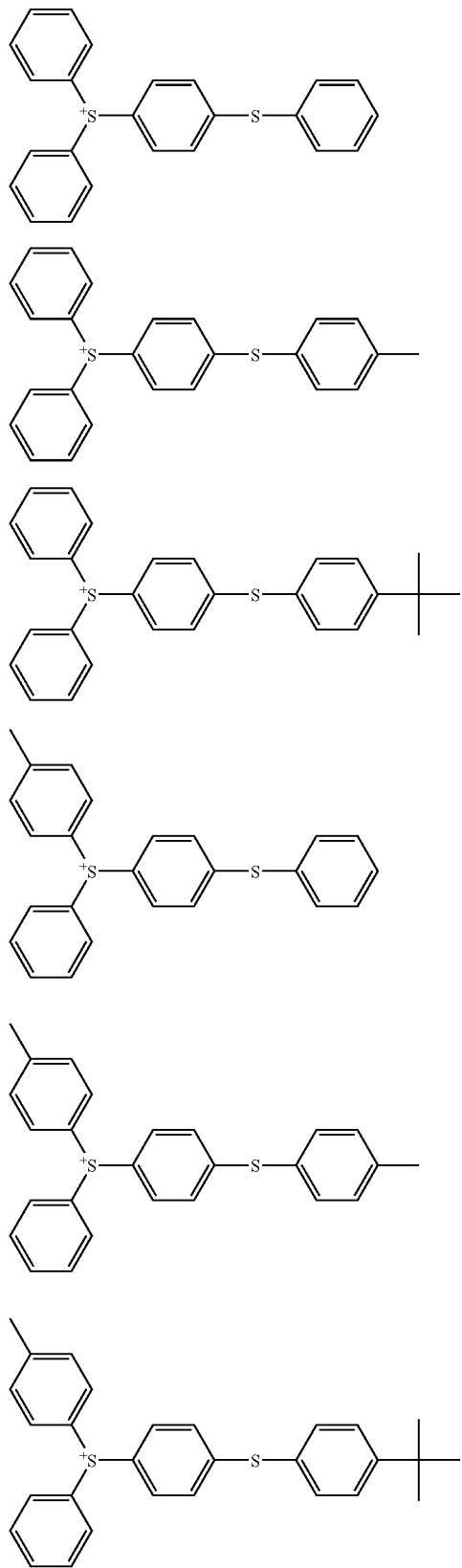
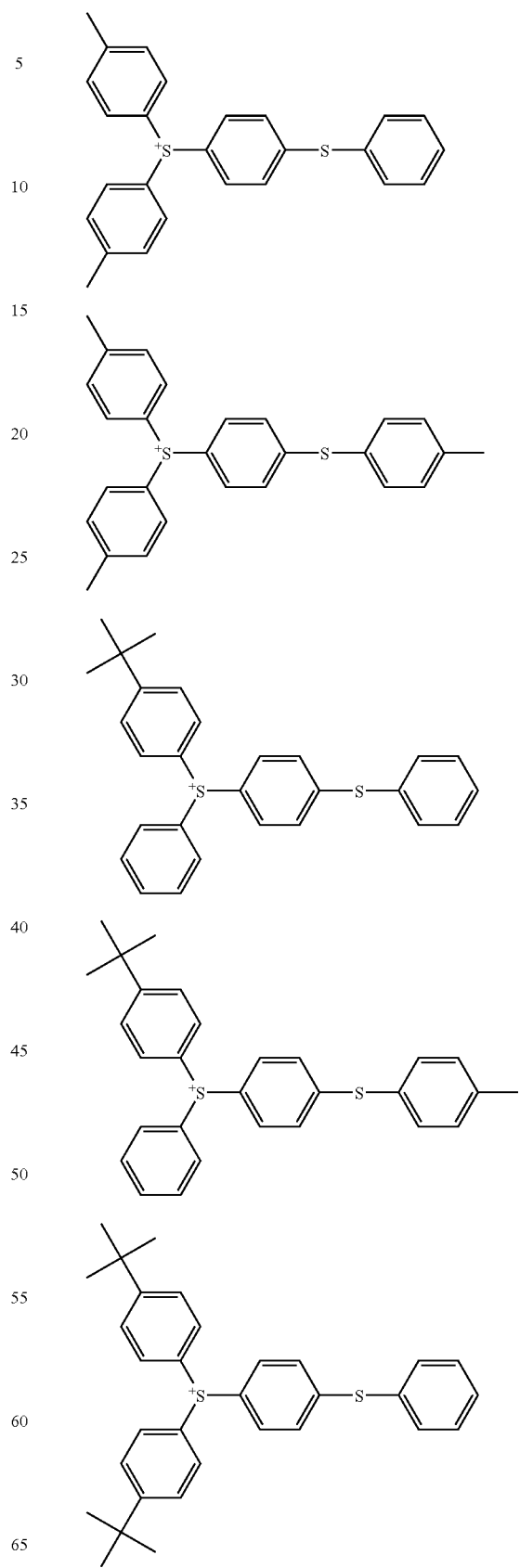

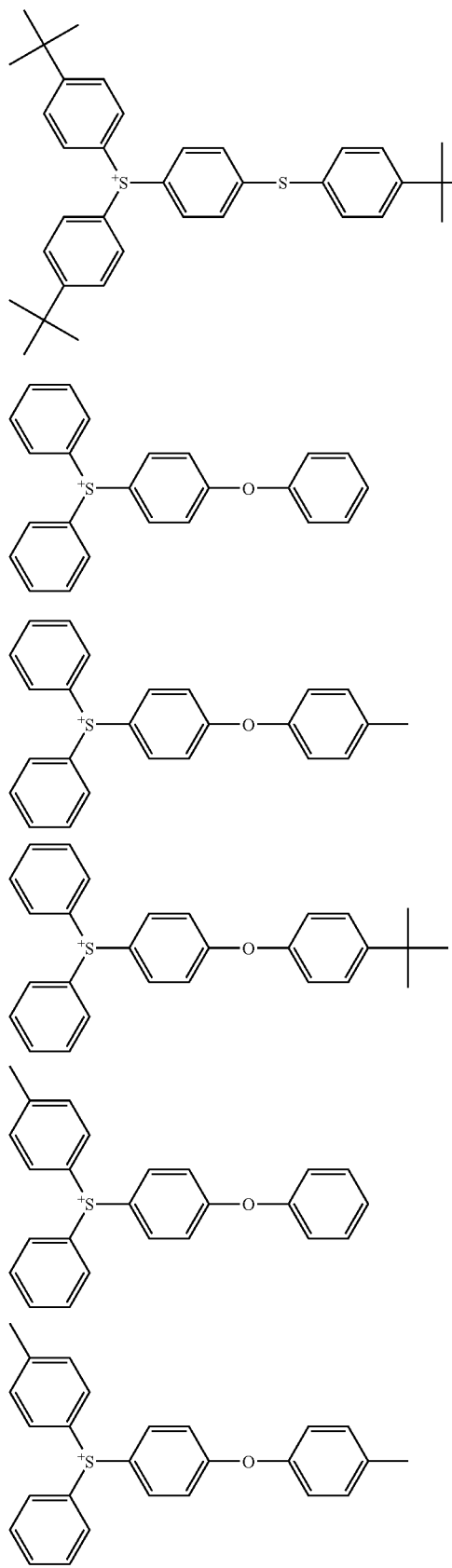
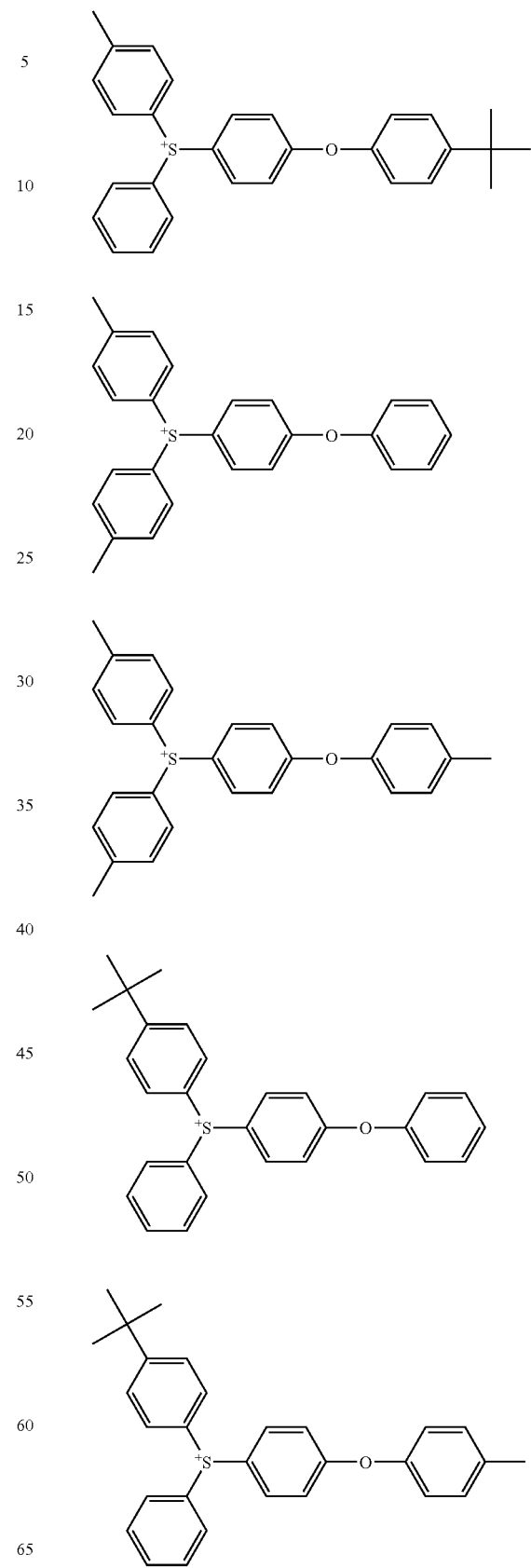

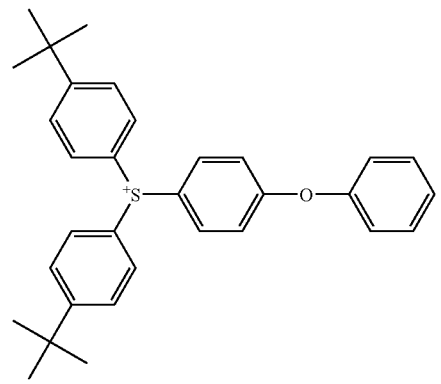
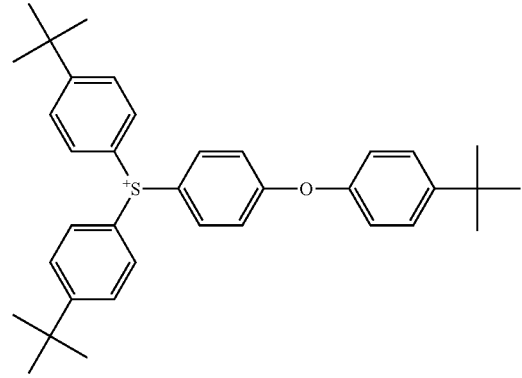
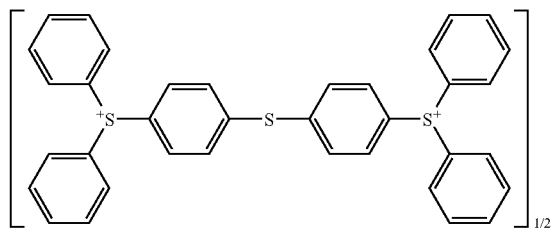
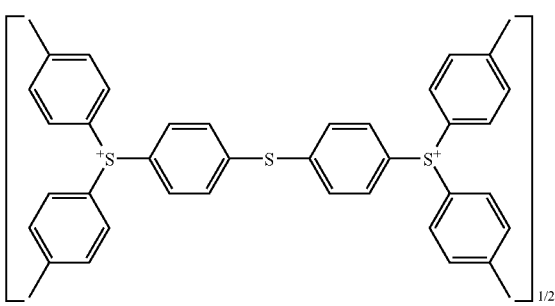
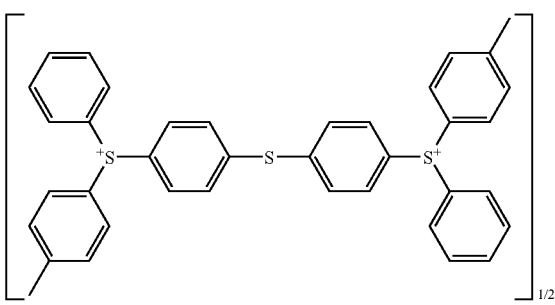
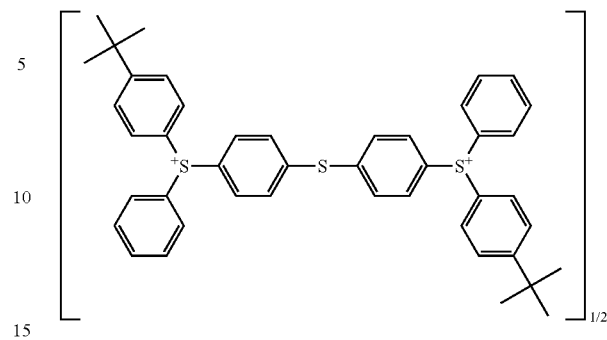
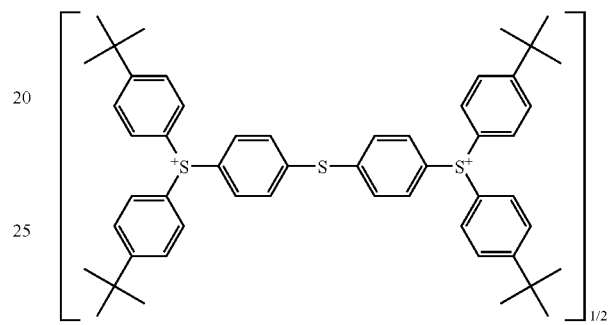
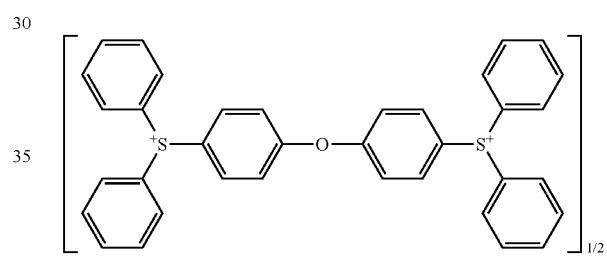
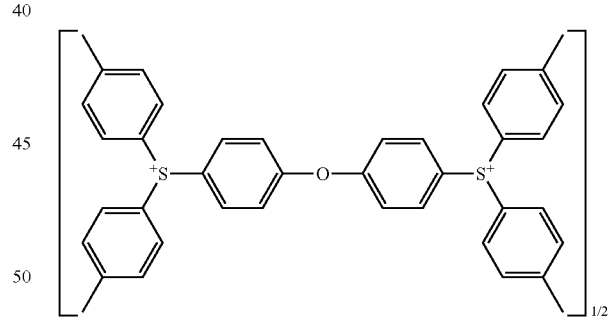
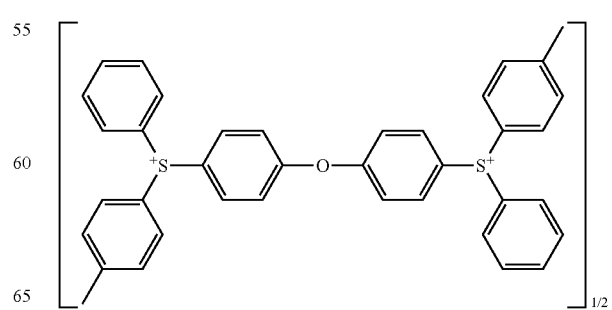

-continued

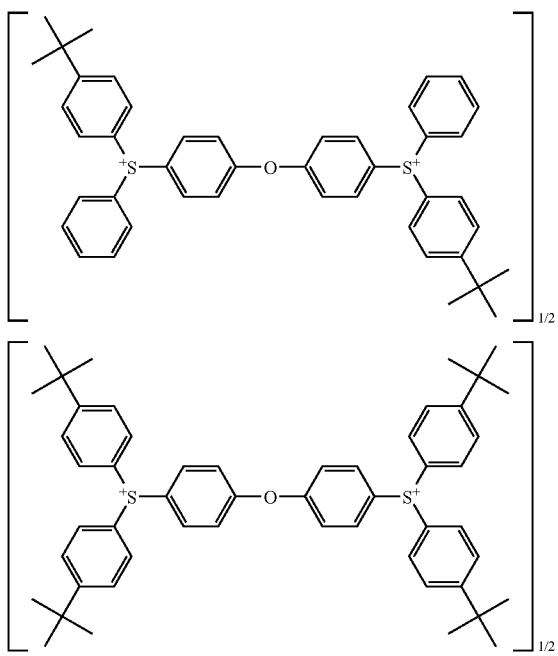

As the organic counter ion represented by A⁺, the cations (IXa) and (Ixc) are preferable.

As the organic counter ion represented by A⁺, a cation represented by the following formulae (IXe):

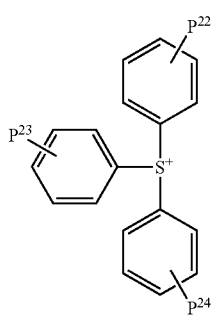

(IXe)

wherein $P^{22}$, $P^{23}$ and $P^{24}$ each independently represent a hydrogen atom or a C1-C4 alkyl group, is also preferable.

As the cation (IXc), the cation wherein $P^6$ and $P^7$ are bonded to form the C3-C12 divalent acyclic hydrocarbon group which forms the ring together with the adjacent S⁺, $P^8$ represents the hydrogen atom, $P^9$ represents the C1-C12 alkyl group, the C3-C12 cycloalkyl group or the aromatic group which may be substituted with at least one selected from the C1-C6 alkoxy group, the C2-C20 acyl group and the nitro group, is preferable, and the cation wherein $P^6$ and $P^7$ are bonded to form the trimethylene, tetramethylene or pentamethylene group which forms the ring together with the adjacent S⁺, $P^8$ represents the hydrogen atom, $P^9$ represents the C1-C12 alkyl group or the aromatic group which may be substituted with at least one selected from the C1-C6 alkoxy group and the nitro group, is more preferable.

As the Salt (VI), salts represented by the formulae:

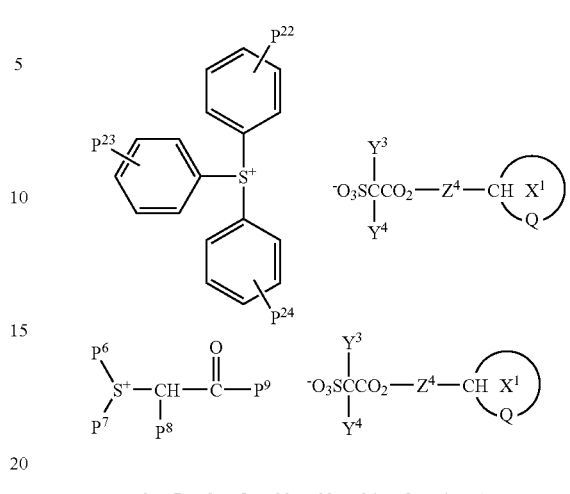

wherein $P^6$, $P^7$, $P^8$, $P^9$, $P^{22}$, $P^{23}$, $P^{24}$, $Y^3$, $Y^4$, $X^1$, Q and $Z^4$ are the same as defined above, are preferable.

Salt (V) can be produced by a process comprising reacting a salt represented by the formula (X):

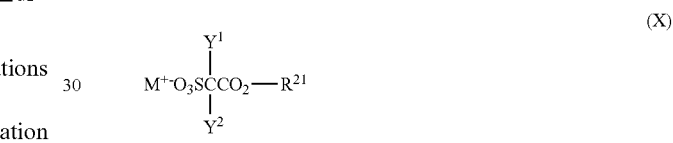

(X)

wherein M represents Li, Na, K or Ag, and $Y^1$, $Y^2$ and $R^{21}$ are the same meanings as defined above (hereinafter, simply referred to as the salt (X)), with a compound represented by the formula (XI):

A⁺⁻G (XI)

wherein A⁺ is the same meaning as defined above, and G represents F, Cl, Br, I, BF₄, AsF₆, SbF₆, PF₆ or ClO₄ (hereinafter, simply referred to as the compound (XI)).

The reaction of the salt (X) and the compound (XI) is usually conducted in an inert solvent such as acetonitrile, water, methanol and dichloromethane, at a temperature of about 0 to 150° C., preferably of 0 to 100° C., with stirring.

The amount of the compound (XI) is usually 0.5 to 2 moles per 1 mole of the salt (X). Salt (V) obtained by the process above can be isolated by recrystallization, and can be purified by washing with water.

Salt (VI) can be produced by a process comprising reacting a salt represented by the formula (XII):

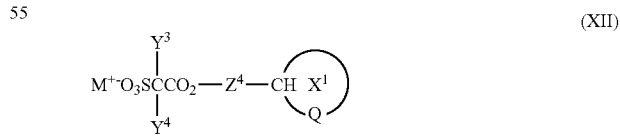

(XII)

wherein M, $Y^3$, $Y^4$, $Z^4$, $X^1$ and Q are the same meanings as defined above (hereinafter, simply referred to as the salt (XII)), with the compound (XI). The reaction of the salt (XII) and the compound (XI) is usually conducted by a similar method to the above-mentioned reaction of the salt (X) and the compound (XI).

Salt (VIII) can be produced by a process comprising reacting a salt of the formula (XIII):

 (XIII)

wherein M and $R^{22}$ are the same meanings as defined above (hereinafter, simply referred to as the salt (XIII)), with the compound (XI).

The reaction of the salt (XIII) and the compound (XI) is usually conducted by a similar method to the above-mentioned reaction of the salt (X) and the compound (XI).

The salt (X) can be produced by a process comprising esterifying an alcohol compound represented by the formula (XV):

 (XV)

wherein $R^{21}$ is the same meaning as defined above (hereinafter, simply referred to as the alcohol compound (XV)), with a carboxylic acid represented by the formula (XVI):

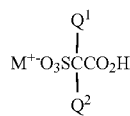 (XVI)

wherein M, $Q^1$ and $Q^2$ are the same meanings as defined above (hereinafter, simply referred to as the carboxylic acid (XVI)).

The esterification reaction of the alcohol compound (XV) and the carboxylic acid (XVI) can generally be carried out by mixing materials in an aprotic solvent such as dichloroethane, toluene, ethylbenzene, monochlorobenzene, acetonitrile and N,N-dimethylformamide, at 20 to 200° C., preferably 50 to 150° C. In the esterification reaction, an acid catalyst or a dehydrating agent is usually added, and examples of the acid catalyst include organic acids such as p-toluenesulfonic acid, and inorganic acids such as sulfuric acid. Examples of the dehydrating agent include 1,1'-carbonyldiimidazole and N,N'-dicyclohexylcarbodiimide.

The esterification reaction may preferably be conducted with dehydration since the reaction time tends to be shortened. Examples of the dehydration method include Dean and Stark method.

The amount of the carboxylic acid (XVI) is usually 0.2 to 3 moles, preferably 0.5 to 2 moles per 1 mole of the alcohol compound (XVII).

The amount of the acid catalyst may be catalytic amount or the amount equivalent to solvent, and is usually 0.001 to 5 moles per 1 mole of the alcohol compound (XVII). The amount of the dehydrating agent is usually 0.2 to 5 moles, preferably 0.5 to 3 moles per 1 mole of the alcohol compound (XVII).

The salt (XII) can also be produced by a similar method to the reaction of the above-mentioned esterification reaction of the alcohol compound (XV) and the carboxylic acid (XVI).

The carboxylic acid (XVI) can be produced, for example, by a process comprising reacting an ester compound represented by the following formula:

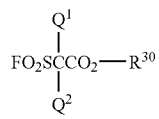

wherein $Q^1$ and $Q^2$ are the same meanings as defined above, and $R^{30}$ represents a C1-C6 alkyl group, with a compound represented by the following formula:

wherein M is the same meaning as defined above, in water.

The present resist composition preferably includes 80 to 99.9% by weight of the resin component and 0.1 to 20% by weight of the acid generator based on the total amount of the resin component and the acid generator.

In the present resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

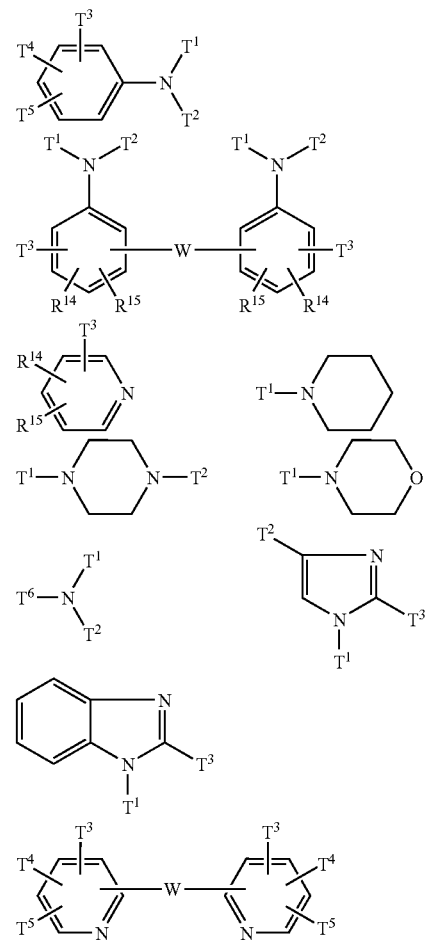

-continued

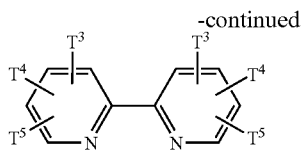

wherein $T^1$ and $T^{12}$ independently represent a hydrogen atom, an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group which may be substituted with a C1-C6 alkoxy group, $T^3$ and $T^4$ independently represent a hydrogen atom, an alkyl group, a cycloalkyl group, an aryl group or an alkoxy group, and the alkyl, cycloalkyl, aryl and alkoxy group may be substituted with at least one group selected from a hydroxyl group, an amino group which may be substituted with a C1-C4 alkyl group and a C1-C6 alkoxy group, or $T^3$ and $T^4$ bond together with the carbon atoms to which they bond to form an aromatic ring, $T^5$ represent a hydrogen atom, an alkyl group, a cycloalkyl group, an aryl group, an alkoxy group or a nitro group, and the alkyl, cycloalkyl, aryl and alkoxy groups which may be substituted with at least one group selected from a hydroxyl group, an amino group which may be substituted with a C1-C4 alkyl group and a C1-C6 alkoxy group, $T^6$ represents an alkyl or cycloalkyl group, and the alkyl and cycloalkyl group may be substituted with at least one group selected from a hydroxyl group, an amino group which may be substituted with a C1-C4 alkyl group and a C1-C6 alkoxy group, and W represents —CO—, —NH—, —S—, —S—S—, an alkylene group of which at least one methylene group may be replaced with —O—, or an alkenylene group of which at least one methylene group may be replaced with —O—, and a quaternary ammonium hydroxide represented by the following formula:

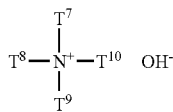

wherein $T^7$, $T^8$, $T^9$ and $T^{10}$ independently represent an alkyl group, a cycloalkyl group or an aryl group, and the alkyl, cycloalkyl and aryl groups may be substituted with at least one group selected from a hydroxyl group, an amino group which may be substituted with a C1-C4 alkyl group and a C1-C6 alkoxy group.

The alkyl group in $T^1$, $T^2$, $T^3$, $T^4$, $T^5$, $T^6$, $T^7$, $T^8$, $T^9$ and $T^{10}$ preferably has about 1 to 10 carbon atoms, and more preferably has about 1 to 6 carbon atoms.

Examples of the amino group which may be substituted with the C1-C4 alkyl group include an amino, methylamino, ethylamino, n-butylamino, dimethylamino and diethylamino group. Examples of the C1-C6 alkoxy group which may be substituted with the C1-C6 alkoxy group include a methoxy, ethoxy, n-propoxy, isopropoxy, n-butoxy, tert-butoxy, n-pentyloxy, n-hexyloxy and 2-methoxyethoxy group.

Specific examples of the alkyl group which may be substituted with at least one group selected from a hydroxyl group, an amino group which may be substituted with a C1-C4 alkyl group, and a C1-C6 alkoxy group which may be substituted with a C1-C6 alkoxy group include a methyl, ethyl, n-propyl, isopropyl, n-butyl, tert-butyl, n-pentyl, n-hexyl, n-octyl, n-nonyl, n-decyl, 2-(2-methoxyethoxy)ethyl, 2-hydroxyethyl, 2-hydroxypropyl, 2-aminoethyl, 4-aminobutyl and 6-aminohexyl group.

The cycloalkyl group in $T^1$, $T^2$, $T^3$, $T^4$, $T^5$, $T^6$, $T^7$, $T^8$, $T^9$ and $T^{10}$ preferably has about 5 to 10 carbon atoms. Specific examples of the cycloalkyl group which may be substituted with at least one group selected from a hydroxyl group, an amino group which may be substituted with a C1-C4 alkyl group and a C1-C6 alkoxy group include a cyclopentyl, cyclohexyl, cycloheptyl and cyclooctyl group.

The aryl group in $T^1$, $T^2$, $T^3$, $T^4$, $T^5$, $T^6$, $T^7$, $T^8$, $T^9$ and $T^{10}$ preferably has about 6 to 10 carbon atoms. Specific examples of the aryl group which may be substituted with at least one group selected from a hydroxyl group, an amino group which may be substituted with a C1-C4 alkyl group and a C1-C6 alkoxy group include a phenyl and naphthyl group.

The alkoxy group in $T^3$, $T^4$ and $T^5$ preferably has about 1 to 6 carbon atoms and specific examples thereof include a methoxy, ethoxy, n-propoxy, isopropoxy, n-butoxy, tert-butoxy, n-pentyloxy and n-hexyloxy group.

The alkylene and alkenylene groups in W preferably have 2 to 6 carbon atoms. Specific examples of the alkylene group include an ethylene, trimethylene, tetramethylene, methylenedioxy and ethylene-1,2-dioxy group, and specific examples of the alkenylene group include an ethane-1,2-diyl, 1-propene-1,3-diyl and 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptyamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecyamine, dicyclohexylmethylamine, tris[2-(2-methoxyethoxy)ethyl]amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skelton as disclosed in JP 11-52575 A1 can be also used as the quencher.

In the point of forming patterns having higher resolution, the quaternary ammonium hydroxide is preferably used as the quencher.

When the basic compound is used as the quencher, the present resist composition preferably includes 0.01 to 1% by weight of the basic compound based on the total amount of the resin component and Salt (II).

The present resist composition can contain, if necessary, a small amount of various additives such as a sensitizer, a dissolution inhibitor, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating.

The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by way of examples, which are not construed to limit the scope of the present invention. The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography [HLC-8120GPC Type, Column (Three Columns): TSKgel Multipore HXL-M, Solvent: Tetrahydrofuran, manufactured by TOSOH CORPORATION] using styrene as a standard reference material. Structures of compounds were determined by NMR (GX-270 Type, or EX-270 Type, manufactured by JEOL LTD) and mass spectrometry (Liquid Chromatography: 1100 Type, manufactured by AGILENT TECHNOLOGIES LTD., Mass Spectrometry:

LC/MSD Type or LC/MSD TOF Type, manufactured by AGILENT TECHNOLOGIES LTD.).

SALT SYNTHETIC EXAMPLE 1

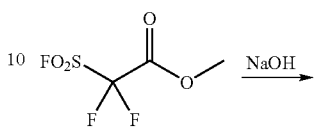

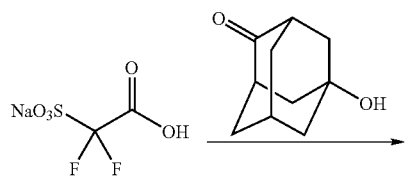

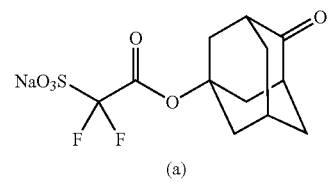

(a)

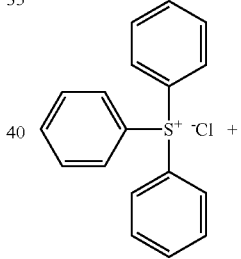

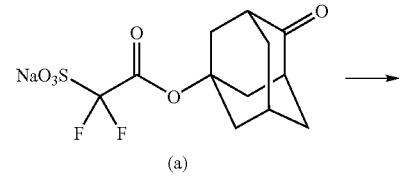

(a)

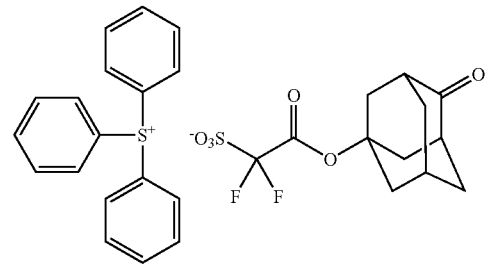

(b)

The salt represented by the above-mentioned formula (b) was obtained in the form of white solid according to the method described in US 2007/27336 A1, and the salt obtained is called as B1.

SALT SYNTHETIC EXAMPLE 2

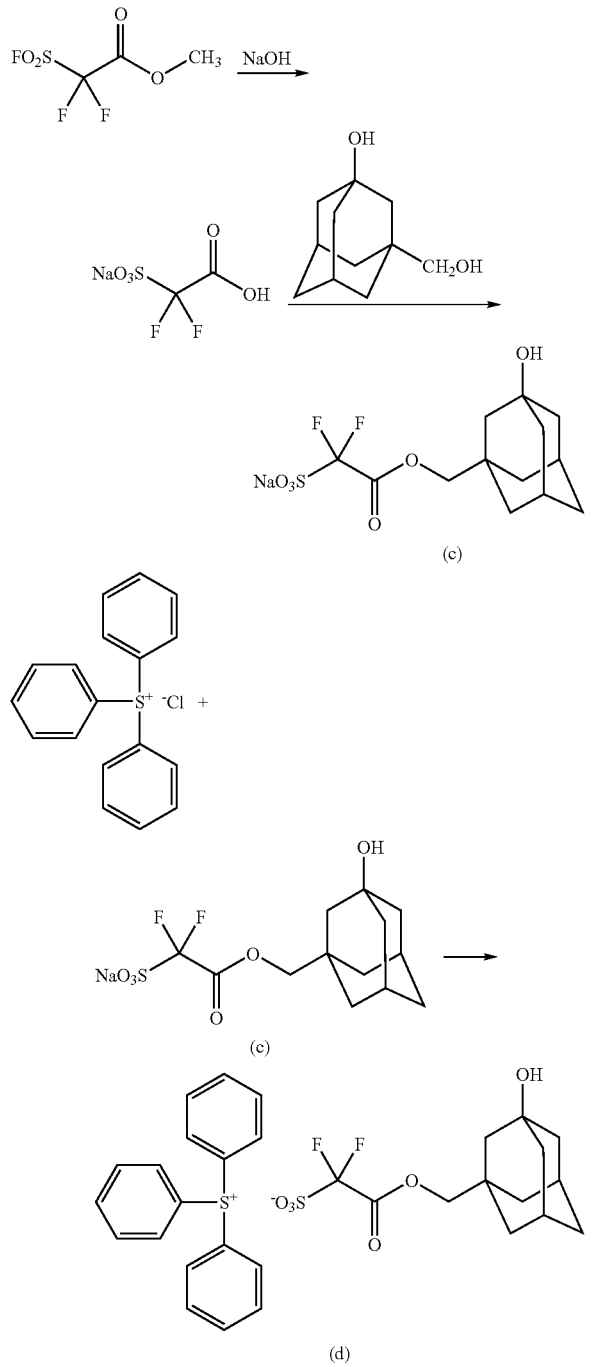

(c)

(d)

The salt represented by the above-mentioned formula (d) was obtained in the form of white solid according to the method described in US 2006/194982 A1, and the salt obtained is called as B2.

Monomers used in the following Resin Synthetic Examples are following monomers M1, M2, M3, M4, M5 and M6.

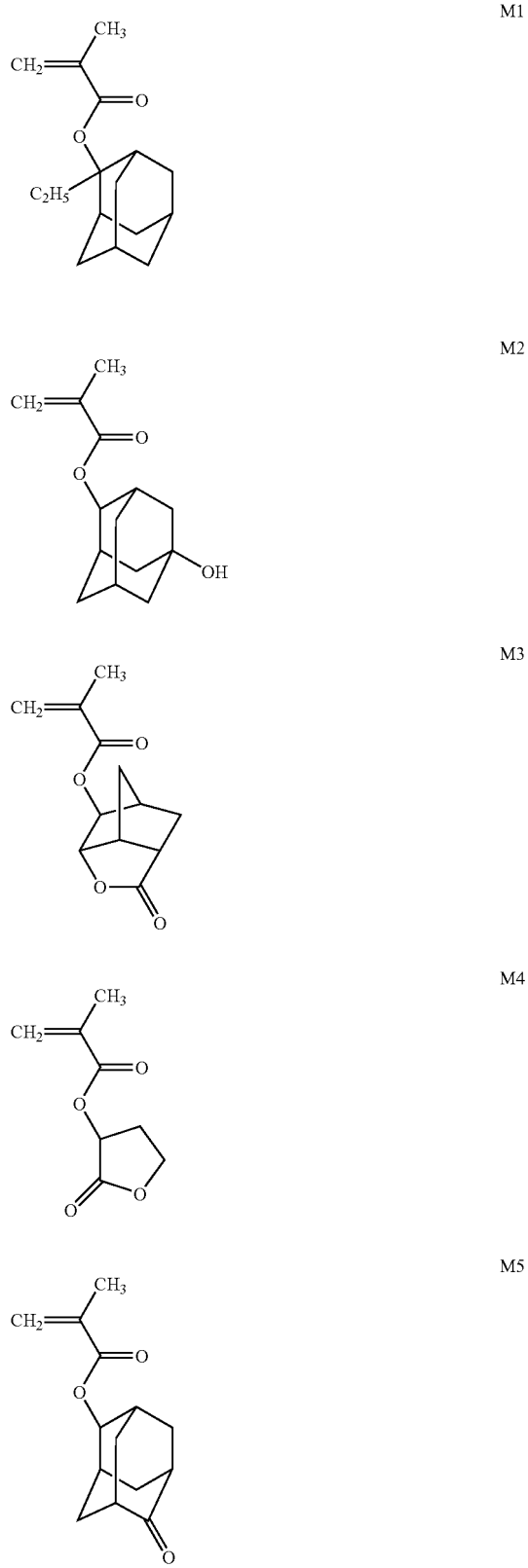

-continued

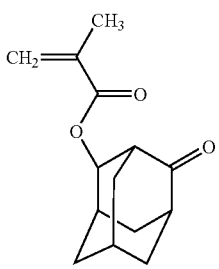

M6

RESIN SYNTHETIC EXAMPLE 1

20.00 Parts of the monomer M1, 3.04 parts of the monomer M2, 6.44 parts of the monomer M3 and 9.06 parts of the monomer M5 were dissolved in 2.6 times amount of 1,4-dioxane as much as the amount of all monomers to be used (monomer molar ratio; monomer M1:monomer M2:monomer M3:monomer M5=50:8:18:24). To the solution, 2,2'-azobisisobutyronitrile was added as an initiator in a ratio of 3 mol %, based on all monomer molar amount, and the resultant mixture was heated at 87° C. for about 5 hours. The reaction solution was poured into large amount of a mixed solvent of methanol and water to cause precipitation. The precipitate was isolated and washed twice with large amount of a mixed solvent of methanol and water for purification. As a result, copolymer having a weight-average molecular weight of about 8,100 was obtained in a yield of 61%. This copolymer had the following structural units. This is called as resin A1.

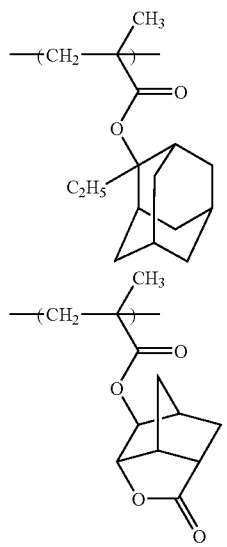

RESIN SYNTHETIC EXAMPLE 2

21.40 Parts of the monomer M1, 3.26 parts of the monomer M2, 6.89 parts of the monomer M3 and 7.04 parts of the monomer M4 were dissolved in 2.6 times amount of 1,4-dioxane as much as the amount of all monomers to be used (monomer molar ratio; monomer M1:monomer M2:monomer M3:monomer M4=50:8:18:24). To the solution, 2,2'-azobisisobutyronitrile was added as an initiator in a ratio of 3 mol % based on all monomer molar amount. The resultant mixture was heated at 87° C. for about 5 hours. The reaction solution was poured into large amount of a mixed solvent of methanol and water to cause precipitation. The precipitate was isolated and washed twice with large amount of a mixed solvent of methanol and water for purification. As a result, copolymer having a weight-average molecular weight of about 6,900 was obtained in a yield of 56%. This copolymer had the following structural units. This is called as resin A2.

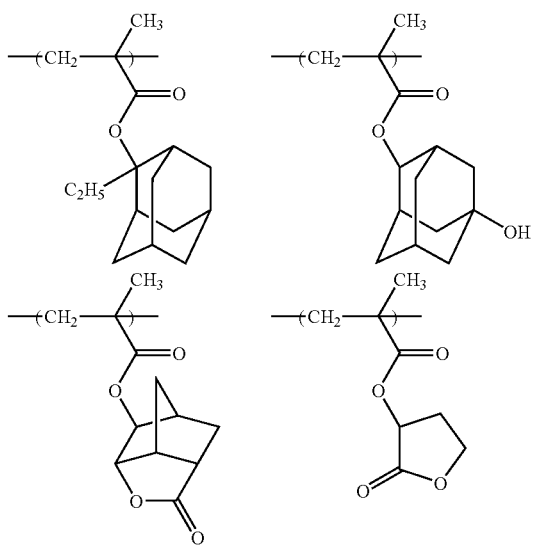

RESIN SYNTHETIC EXAMPLE 3

20.00 Parts of the monomer M1, 3.04 parts of the monomer M2, 6.44 parts of the monomer M3 and 9.06 parts of the monomer M6 were dissolved in 2.6 times amount of 1,4-dioxane as much as the amount of all monomers to be used (monomer molar ratio; monomer M1:monomer M2:monomer M3:monomer M6=50:8:18:24). To the solution, 2,2'-azobisisobutyronitrile was added as an initiator in a ratio of 3 mol %, based on all monomer molar amount. The resultant mixture was heated at 87° C. for about 5 hours. The reaction solution was cooled and then, was poured into large amount of a mixed solvent of methanol and water to cause precipitation. The precipitate was isolated and washed twice with large amount of a mixed solvent of methanol and water for purification. As a result, copolymer having a weight-average molecular weight of about 6,900 was obtained in a yield of 57%. This copolymer had the following structural units. This is called as resin A3.

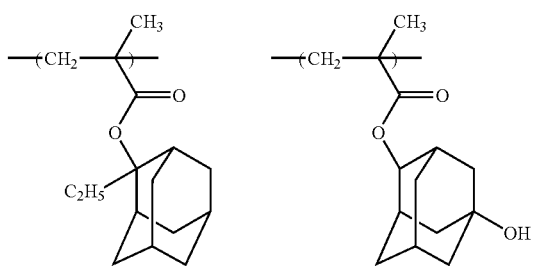

-continued

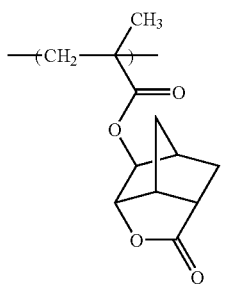
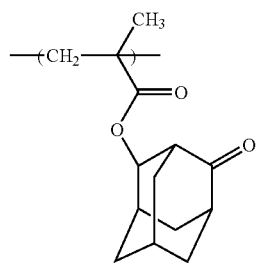

RESIN SYNTHETIC EXAMPLE 4

19.00 Parts of the monomer M1, 8.84 parts of the monomer M3 and 8.60 parts of the monomer M5 were dissolved in 2.6 times amount of 1,4-dioxane as much as the amount of all monomers to be used (monomer molar ratio; monomer M1:monomer M3:monomer M5=50:26:24). To the solution, 2,2'-azobisisobutyronitrile was added as an initiator in a ratio of 3 mol %, based on all monomer molar amount. The resultant mixture was heated at 87° C. for about 5 hours. The reaction solution was cooled and then, was poured into large amount of a mixed solvent of methanol and water to cause precipitation. The precipitate was isolated and washed twice with large amount of a mixed solvent of methanol and water for purification. As a result, copolymer having a weight-average molecular weight of about 7,900 was obtained in a yield of 63%. This copolymer had the following structural units. This is called as resin A4.

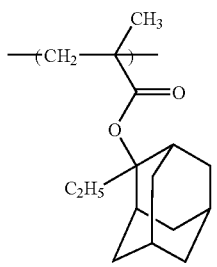

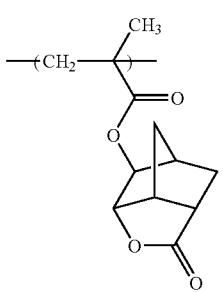
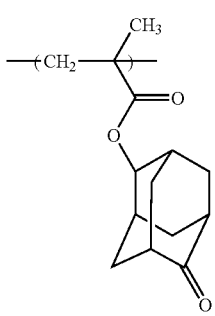

Examples 1 to 2 and Comparative Examples 1 to 2

<Acid Generator>

Acid Generator B1:

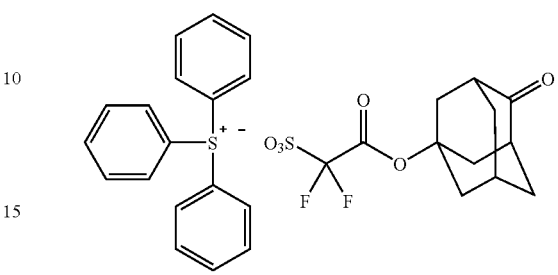

<Resin>

Resins A1, A2, A3 and A4

<Quencher>

Q1: 2,6-diisopropylaniline

<Solvent>

| <Solvent> | | |
|---|---|---|
| Y1: | propylene glycol monomethyl ether acetate | 90 parts |
| | 2-heptanone | 20.0 parts |
| | propylene glycol monomethyl ether | 20.0 parts |
| | γ-butyrolactone | 3.5 parts |

The following components were mixed and dissolved, further, filtrated through a fluorine resin filter having pore diameter of 0.2 μm, to prepare resist liquid.

Resin (kind and amount are described in Table 1)
Acid generator (kind and amount are described in Table 1)
Quencher (kind and amount are described in Table 1)
Solvent (kind is described in Table 1)

Silicon wafers were each coated with "ARC95", which is an organic anti-reflective coating composition available from Nissan Chemical Industries, Ltd., and then baked under the conditions: 215° C., 60 seconds, to form a 295 Å-thick organic anti-reflective coating. Each of the resist liquids prepared as above was spin-coated over the anti-reflective coating so that the thickness of the resulting film became 0.14 μm after drying. The silicon wafers thus coated with the respective resist liquids were each prebaked on a direct hotplate at a temperature shown in column of "PB" of Table 1 for 60 seconds. Using an ArF excimer stepper ("FPA5000-AS3" manufactured by CANON INC., NA=0.75, 2/3 Annular), each wafer thus formed with the respective resist film was subjected to line and space pattern exposure, with the exposure quantity being varied stepwise.

After the exposure, each wafer was subjected to post-exposure baking on a hotplate at a temperature shown in column of "PEB" of Table 1 for 60 seconds and then to paddle development for 60 seconds with an aqueous solution of 2.38 wt % tetramethylammonium hydroxide.

Each of a dark field pattern developed on the organic anti-reflective coating substrate after the development was observed with a scanning electron microscope, the results of which are shown in Table 2. The term "dark field pattern", as used herein, means a pattern obtained by exposure and development through a reticle comprising chromium base surface (light-shielding portion) and linear glass layers (light-transmitting portion) formed in the chromium surface and aligned with each other. Thus, the dark field pattern is such that, after exposure and development, resist layer surrounding the line and space pattern remains on substrate.

Effective Sensitivity (ES): It was expressed as the amount of exposure that the line pattern and the space pattern become 1:1 after exposure through 100 nm line and space pattern mask and development.

Resolution: It was expressed as the resolution of 1:3 line and space pattern at the exposure amount that the line pattern and the space pattern become 1:1 after exposure through 100 nm line and space pattern mask and development.

Pattern Profile: The resist patterns after conducting a lithography process were observed by a scanning electron microscope, and when the pattern is a rectangle or nearly a rectangle, its evaluation is marked by "○", when the top of the pattern is a round shape, its evaluation is marked by "X".

Onishi Parameter was calculated by the following equation:

Onishi Parameter of the resin=Σ[(each calculated Onishi Parameter of the monomer used to give the corresponding structural unit in the resin)×(each content ratio of the corresponding structural unit in the resin)]. Herein, Onishi Parameter of the monomer used to give the corresponding structural unit in the resin was calculated by the following equation:

Onishi Parameter of the monomer=(total number of atoms of the monomer)/[(number of carbon atoms of the monomer)−(number of oxygen atoms of the monomer)]

Herein, as content ratio of the corresponding structural unit in the resin, value of ratio of the corresponding monomer used for producing a resin is used.

TABLE 1

| Ex. No. | Resin (kind/amount (part)) | Acid generator (kind/amount (part)) | Quencher (kind/amount (part)) | Solvent | PB (°C.) | PEB (°C.) |
|---|---|---|---|---|---|---|
| Ex. 1 | A1/10 | B1/0.5 | Q1/0.05 | Y1 | 120 | 120 |
| Ex. 2 | A3/10 | B1/0.5 | Q1/0.05 | Y1 | 120 | 120 |
| Comp. Ex. 1 | A2/10 | B1/0.5 | Q1/0.05 | Y1 | 120 | 120 |
| Comp. Ex. 2 | A4/10 | B1/0.5 | Q1/0.05 | Y1 | 120 | 120 |

TABLE 2

| Ex. No. | ES (mJ/cm$^2$) | Resolution (nm) | Pattern Profile | Onishi Parameter |
|---|---|---|---|---|
| Ex. 1 | 23 | 125 | ○ | 3.26 |
| Ex. 2 | 32 | 125 | ○ | 3.27 |
| Comp. Ex. 1 | 18 | 130 | X | 3.99 |
| Comp. Ex. 2 | 21 | 130 | ○ | 3.29 |

Apparent from Table 2, the resist compositions of Examples, which accord to the present invention, give good resist pattern in resolution and in pattern profile. Further, the resist compositions of Examples have low Onishi Parameter and therefore, it is suggested that the resist film given from the resist compositions of Examples have good dry etching resistance.

Example 3

According to the same manner as that described in Example 1, a resist composition and a dark field pattern are obtained except that Acid generator B2 is used in place of Acid generator B1.

The present composition provides good resist pattern in resolution, pattern profile and dry etching resistance and is especially suitable for ArF excimer laser lithography, KrF excimer laser lithography and ArF immersion lithography.

What is claimed is:

1. A chemically amplified resist composition comprising:
   (A) a resin which comprises (a) a structural unit having an acid-labile group, (b) a structural unit having at least one hydroxyl group, (c) a structural unit having at least one lactone structure, and (d) a structural unit represented by the formula (Ia) or (Ib):

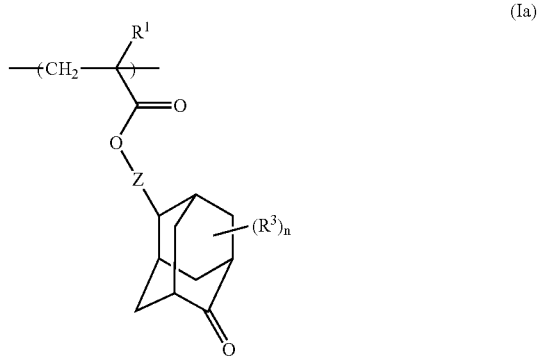

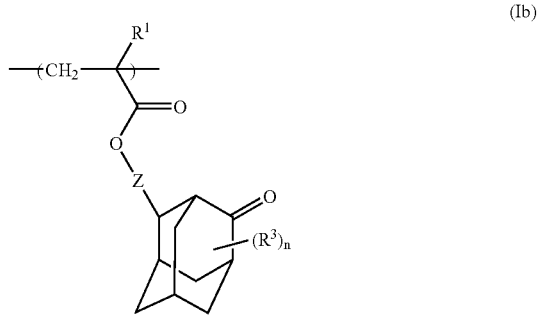

wherein $R^1$ represents a hydrogen atom or a methyl group, $R^3$ represents a methyl group, n represents an integer of 0 to 14, and Z represents a single bond or —$[CH_2]_k$—COO—, and
   (B) at least one acid generator.

2. The chemically amplified resist composition according to claim 1, wherein (a) the structural unit having an acid-labile group is a structural unit represented by the formula (IIa) or (IIb):

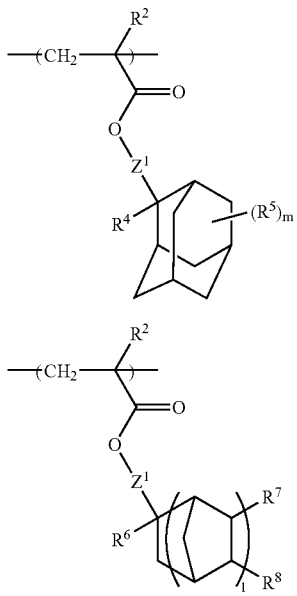

(IIa)

(IIb)

wherein $R^2$ represents a hydrogen atom or a methyl group, $Z^1$ represents a single bond or —$(CH_2)_r$—COO—, r represents an integer of 1 to 4, $R^4$ represents a C1-C8 linear or branched chain alkyl group or a C3-C10 cyclic alkyl group, $R^5$ represents a methyl group, m represents an integer of 0 to 14, $R^6$ represents a C1-C8 linear or branched chain alkyl group or a C3-C10 cyclic alkyl group, $R^7$ and $R^8$ each independently represent a hydrogen atom or a C1-C8 monovalent hydrocarbon group which may have at least one heteroatom, or $R^7$ and $R^8$ may be bonded to form a C1-C8 divalent hydrocarbon group which may have at least one heteroatom which forms a ring together with the adjacent carbon atoms to which $R^7$ and $R^8$ are bonded, or $R^7$ and $R^8$ may be bonded to form a carbon-carbon double bond between the carbon atom to which $R^7$ is bonded and the carbon atom to which $R^8$ is bonded, l represents an integer of 1 to 3.

3. The chemically amplified resist composition according to claim 1, wherein (b) the structural unit having at least one hydroxyl group is a structural unit represented by the formula (III):

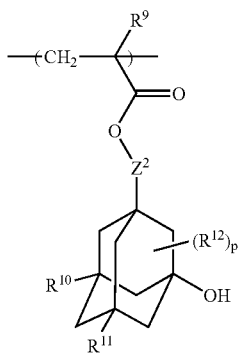

(III)

wherein $R^9$ represents a hydrogen atom or a methyl group, $R^{10}$ and $R^{11}$ each independently represent a hydrogen atom, a methyl group or a hydroxyl group, $R^{12}$ represents a methyl group, p represents an integer of 0 to 12, $Z^2$ represents a single bond or —$(CH_2)_s$—COO— and s represents an integer of 1 to 4.

4. The chemically amplified resist composition according to claim 1, wherein (c) the structural unit having at least one lactone structure is a structural unit represented by the formula (IVa), (IVb) or (IVc):

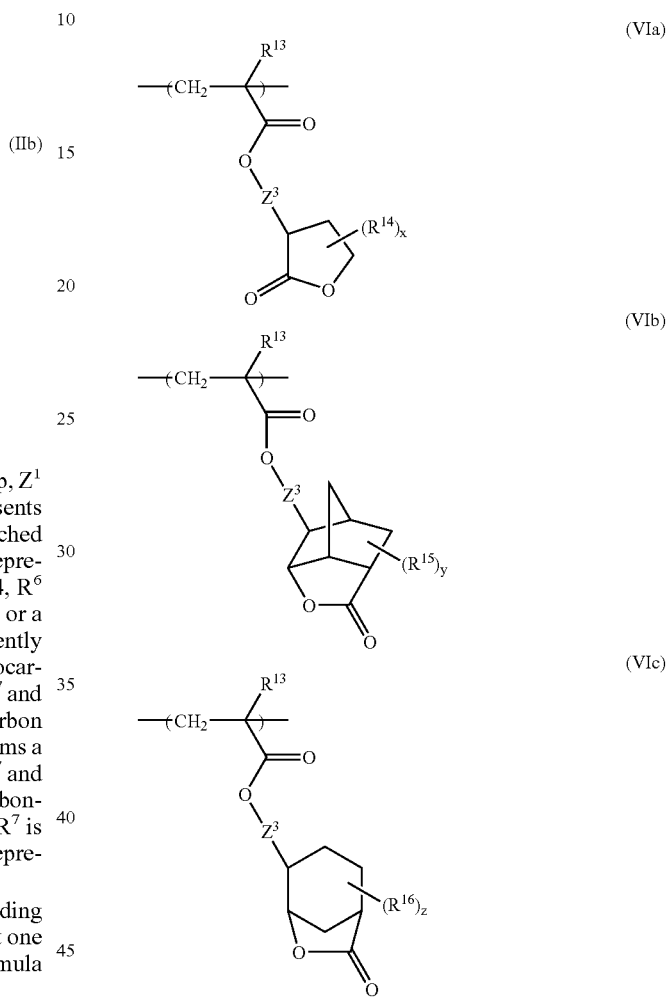

wherein $R^{13}$ represents a hydrogen atom or a methyl group, $R^{14}$ represents a methyl group, x represents an integer of 0 to 5, $R^{15}$ represents a C1-C4 hydrocarbon group, a carboxyl group or a cyano group, y represents an integer of 0 to 3, $R^{16}$ represents a C1-C4 hydrocarbon group, a carboxyl group or a cyano group, z represents an integer of 0 to 3, and when y is 2 or 3, $R^{15}$s may be the same or different, and when z is 2 or 3, $R^{16}$ s may be the same or different.

5. The chemically amplified resist composition according to claim 1, wherein the acid generator is an onium salt compound, an organo-halogen compound, a sulfone compound or a sulfonate compound.

6. The chemically amplified resist composition according to claim 1, wherein the acid generator is an onium salt compound.

7. The chemically amplified resist composition according to claim 1, wherein the acid generator is a salt selected from a salt represented by the formula (V):

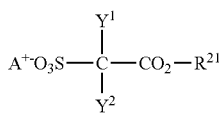

(V)

wherein $Y^1$ and $Y^2$ each independently represent a fluorine atom or a C1-C6 perfluoroalkyl group, $R^{21}$ represents a C1-C6 linear or branched chain hydrocarbon group or a C3-C30 monocyclic or polycyclic hydrocarbon group which may be substituted with at least one selected from a C1-C6 alkyl group, a C1-C6 alkoxy group, a C1-C4 perfluoroalkyl group, a hydroxyl group and a cyano group, and at least one —CH$_2$— in the C3-C30 monocyclic or bicyclic hydrocarbon group may be substituted with —CO—, —O— or —CH(OH)—, and $A^+$ represents an organic counter ion.

8. The chemically amplified resist composition according to claim 1, wherein the acid generator is a salt represented by the formula (VI):

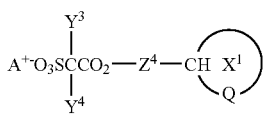

(VI)

wherein $Y^3$ and $Y^4$ each independently represent a fluorine atom or a C1-C6 perfluoroalkyl group, $Z^4$ represents a single bond or a C1-C4 alkylene group, Q represents —CO— or —CH(OH)— and ring $X^1$ represents a C3-C30 monocyclic or polycyclic hydrocarbon group in which two hydrogen atoms are substituted with =O at Q position when Q is —CO— or in which a hydrogen atom is substituted with a hydroxyl group at Q position when Q is —CH(OH)—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group, and $A^+$ represents an organic counter ion.

9. The chemically amplified resist composition according to claim 1, wherein the acid generator is a salt represented by the formula (VIII):

$$A^+{}^-O_3S—R^{22} \qquad (VIII)$$

wherein $R^{22}$ represents a C1-C8 linear or branched chain perfluoroalkyl group and $A^+$ represents an organic counter ion.

10. The chemically amplified resist composition according to claim 7, 8 or 9, wherein $A^+$ represents at least one cation selected from the group consisting of the formula (IXa):

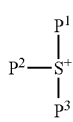

(IXa)

wherein $P^1$, $P^2$ and $P^3$ each independently represent a C1-C30 linear or branched chain alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group, a cation represented by the formula (IXb):

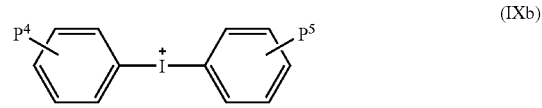

(IXb)

wherein $P^4$ and $P^5$ each independently represent a hydrogen atom, a hydroxyl group, a C1-C12 alkyl group or a C1-C12 alkoxy group, a cation represented by the formula (IXc):

(IXc)

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent $S^+$, and at least one —CH$_2$— in the divalent acyclic hydrocarbon group may be substituted with —CO—, —O— or —S—, $P^8$ represents a hydrogen atom, $P^9$ represents a C1-C12 alkyl group, a C3-C12 cycloalkyl group or an aromatic group which may be substituted, or $P^8$ and $P^9$ are bonded to form a divalent acyclic hydrocarbon group which forms a 2-oxocycloalkyl group together with the adjacent —CHCO—, and at least one —CH$_2$— in the divalent acyclic hydrocarbon group may be replaced with —CO—, —O— or —S—; and a cation represented by the formula (IXd):

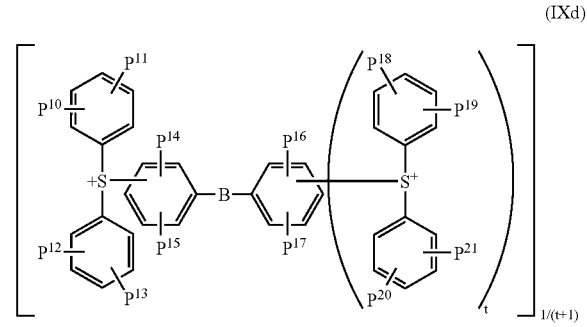

(IXd)

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent a hydrogen atom, a hydroxyl group, a C1-C12 alkyl group or a C1-C12 alkoxy group, B represents a sulfur or oxygen atom and t represents 0 or 1.

11. The chemically amplified resist composition according to claim 7, 8 or 9, wherein $A^+$ represents a cation represented by the formula (IXe):

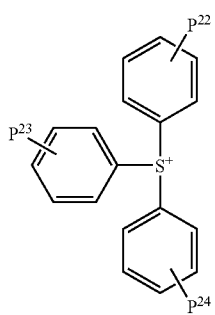

(IXe)

wherein $P^{22}$, $P^{23}$ and $P^{24}$ each independently represent a hydrogen atom or a C1-C4 alkyl group.

12. The chemically amplified resist composition according to claim 1, wherein the chemically amplified resist composition includes 80 to 99.9% by weight of the resin component and 0.1 to 20% by weight of the acid generator.

13. The chemically amplified resist composition according to claim 1, wherein the chemically amplified resist composition further comprises a basic compound.

* * * * *